United States Patent
Pan et al.

(10) Patent No.: US 11,289,654 B2
(45) Date of Patent: *Mar. 29, 2022

(54) POLYMERS CONTAINING FURANYL CROSSLINKABLE GROUPS AND USES THEREOF

(71) Applicant: GUANGZHOU CHINARAY OPTOELECTRONIC MATERIALS LTD., Guangzhou (CN)

(72) Inventors: Junyou Pan, Guangzhou (CN); Shengjian Liu, Guangzhou (CN); Fei Huang, Guangzhou (CN); Jianchao Jia, Guangzhou (CN)

(73) Assignee: GUANGZHOU CHINARAY OPTOELECTRONIC MATERIALS LTD., Guangzhou (CN)

( * ) Notice: Subject to any disclaimer, the term of this patent is extended or adjusted under 35 U.S.C. 154(b) by 100 days.

This patent is subject to a terminal disclaimer.

(21) Appl. No.: 16/472,701

(22) PCT Filed: Dec. 22, 2017

(86) PCT No.: PCT/CN2017/118067
§ 371 (c)(1),
(2) Date: Jun. 21, 2019

(87) PCT Pub. No.: WO2018/113785
PCT Pub. Date: Jun. 28, 2018

(65) Prior Publication Data
US 2019/0372008 A1    Dec. 5, 2019

(30) Foreign Application Priority Data
Dec. 22, 2016   (CN) .......................... 201611200093.8

(51) Int. Cl.
*H01L 51/00*   (2006.01)
*C08G 61/12*   (2006.01)
*H01L 51/50*   (2006.01)

(52) U.S. Cl.
CPC ........ *H01L 51/0039* (2013.01); *C08G 61/121* (2013.01); *H01L 51/0043* (2013.01);
(Continued)

(58) Field of Classification Search
CPC ...... C08G 2261/124; C08G 2261/1424; C08G 2261/148; C08G 2261/312;
(Continued)

(56) References Cited

U.S. PATENT DOCUMENTS 3,178,440 A   4/1965   Siegrist et al.
3,567,450 A   3/1971   Brantly et al.
(Continued)

FOREIGN PATENT DOCUMENTS

CN   1583691 A    2/2005
CN   102076729 A   5/2011
(Continued)

OTHER PUBLICATIONS

Patel et al., "A Diels-Alder crosslinkable host polymer for improved PLED performance: the impact on solution processed doped device and multilayer device performance", Journal of Materials Chemistry, 22, pp. 3004-3014, 2012, (11 pages).
(Continued)

*Primary Examiner* — Shane Fang
(74) *Attorney, Agent, or Firm* — Kagan Binder, PLLC

(57) ABSTRACT

The present disclosure provides a polymer represented by the following general formula (I):
(Continued)

US 11,289,654 B2
Page 2

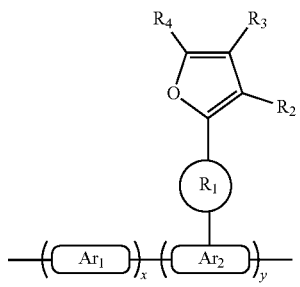

(I)

wherein x and y each represent a repeating unit, and both x and y are positive integers; formula $$Ar_1$$

and formula $$Ar_2$$

are each independently selected from the group consisting of an aryl containing 5-40 ring atoms and a heteroaryl containing 5-40 ring atoms; formula $$R_1$$

is a linking group, and formula $$R_1$$

is selected from the group consisting of alkyl, alkoxy, amino, alkenyl, alkynyl, aralkyl, and heteroalkyl;
and R2, R3 and R4 are each independently selected from the group consisting of H, D, F, CN, alkyl, fluoroalkyl, aryl, heteroaryl, amino, Si, germyl, alkoxy, aryloxy, fluoroalkoxy, siloxane, siloxy, deuterated alkyl, deuterated fluoroalkyl, deuterated aryl, deuterated heteroaryl, deuterated amino, deuterated silyl, deuterated germyl, deuterated alkoxy, deuterated aryloxy, deuterated fluoroalkoxy, deuterated siloxane, and deuterated siloxy.

16 Claims, 2 Drawing Sheets

(52) U.S. Cl.
CPC . *C08G 2261/124* (2013.01); *C08G 2261/148* (2013.01); *C08G 2261/1424* (2013.01); *C08G 2261/312* (2013.01); *C08G 2261/3142* (2013.01); *C08G 2261/41* (2013.01); *C08G 2261/512* (2013.01); *C08G 2261/514* (2013.01); *C08G 2261/76* (2013.01); *C08G 2261/91* (2013.01); *H01L 51/5056* (2013.01); *H01L 51/5072* (2013.01)

(58) Field of Classification Search
CPC ........ C08G 2261/3142; C08G 2261/41; C08G 2261/512; C08G 2261/514; C08G 2261/76; C08G 2261/91; C08G 61/121; H01L 51/0039; H01L 51/5056; H01L 51/5072; H01L 51/0043
See application file for complete search history.

(56) References Cited

U.S. PATENT DOCUMENTS

| | | |
|---|---|---|
| 3,615,404 A | 10/1971 | Price et al. |
| 4,720,432 A | 1/1988 | VanSlyke et al. |
| 4,769,292 A | 9/1988 | Tang et al. |
| 5,061,569 A | 10/1991 | VanSlyke et al. |
| 5,121,029 A | 6/1992 | Hosokawa et al. |
| 6,020,078 A | 2/2000 | Chen et al. |
| 6,251,531 B1 | 6/2001 | Enokida et al. |
| 6,355,673 B1 | 3/2002 | Thorwart et al. |
| 6,824,895 B1 | 11/2004 | Sowinski et al. |
| 6,830,828 B2 | 12/2004 | Thompson et al. |
| 6,835,469 B2 | 12/2004 | Kwong et al. |
| 7,029,766 B2 | 4/2006 | Huo et al. |
| 7,250,532 B2 | 7/2007 | Iwakuma et al. |
| 2001/0053462 A1 | 12/2001 | Mishima |
| 2005/0258742 A1 | 11/2005 | Tsai et al. |
| 2006/0210830 A1 | 9/2006 | Funahashi et al. |
| 2007/0087219 A1 | 4/2007 | Ren et al. |
| 2007/0249800 A1 | 10/2007 | Song |
| 2007/0252517 A1 | 11/2007 | Owczarczyk et al. |
| 2008/0027220 A1 | 1/2008 | Stossel et al. |
| 2008/0048254 A1 | 2/2008 | Saka |
| 2008/0113101 A1 | 5/2008 | Inoue et al. |
| 2008/0297037 A1 | 12/2008 | Vestweber et al. |
| 2008/0303423 A1 | 12/2008 | Heil et al. |
| 2009/0061681 A1 | 3/2009 | McMunigal et al. |
| 2009/0134784 A1 | 5/2009 | Lin et al. |
| 2011/0284799 A1 | 11/2011 | Stoessel et al. |
| 2012/0004407 A1 | 1/2012 | Stoessel et al. |
| 2012/0217869 A1 | 8/2012 | Adachi et al. |
| 2012/0273736 A1 | 11/2012 | James et al. |
| 2014/0138669 A1 | 5/2014 | Nakagawa et al. |
| 2014/0138670 A1 | 5/2014 | Nakagawa et al. |
| 2015/0041784 A1 | 2/2015 | Shizu et al. |
| 2015/0141642 A1 | 5/2015 | Adachi et al. |
| 2016/0293847 A1 | 10/2016 | Hwang et al. |
| 2017/0194585 A1 | 7/2017 | Yan |
| 2018/0312522 A1 | 11/2018 | Pan et al. |
| 2018/0312531 A1 | 11/2018 | Pan et al. |
| 2018/0354934 A1 | 12/2018 | He et al. |
| 2019/0006609 A1 | 1/2019 | Pan et al. |
| 2019/0363258 A1 | 11/2019 | Pan et al. |

FOREIGN PATENT DOCUMENTS

| | | |
|---|---|---|
| CN | 102282150 A | 12/2011 |
| CN | 102668152 A | 9/2012 |
| CN | 103483332 A | 1/2014 |
| CN | 103985822 A | 8/2014 |
| CN | 106008420 A | 10/2016 |
| DE | 102005058557 A1 | 6/2007 |
| EP | 1191613 B1 | 3/2006 |
| EP | 1957606 A1 | 8/2008 |
| EP | 1191614 B1 | 5/2009 |
| EP | 1191612 B1 | 9/2009 |
| JP | 2913116 B2 | 6/1999 |
| JP | 2008053397 A | 3/2008 |
| TW | 201309696 A | 3/2013 |
| TW | 201309778 A | 3/2013 |
| TW | 201343874 A | 11/2013 |
| TW | 201350558 A | 12/2013 |
| WO | 0070655 A2 | 11/2000 |
| WO | 0121729 A1 | 3/2001 |
| WO | 0141512 A1 | 6/2001 |
| WO | 0202714 A2 | 1/2002 |
| WO | 0215645 A1 | 2/2002 |

(56) References Cited

FOREIGN PATENT DOCUMENTS

| | | |
|---|---|---|
| WO | 3033496 A1 | 4/2003 |
| WO | 3082278 A1 | 10/2003 |
| WO | 3097610 A1 | 11/2003 |
| WO | 2005019373 A2 | 3/2005 |
| WO | 2005033244 A1 | 4/2005 |
| WO | 2006000388 A1 | 1/2006 |
| WO | 2006000389 A1 | 1/2006 |
| WO | 2006058737 A1 | 6/2006 |
| WO | 2007065549 A1 | 6/2007 |
| WO | 2007095118 A2 | 8/2007 |
| WO | 2007115610 A1 | 10/2007 |
| WO | 2007140847 A1 | 12/2007 |
| WO | 2008006449 A1 | 1/2008 |
| WO | 2009078587 A2 | 6/2009 |
| WO | 2009118087 A1 | 10/2009 |
| WO | 2009146770 A2 | 12/2009 |
| WO | 2010015307 A1 | 2/2010 |
| WO | 2010031485 A1 | 3/2010 |
| WO | 2010034125 A1 | 4/2010 |
| WO | 2010054728 A1 | 5/2010 |
| WO | 2010054731 A1 | 5/2010 |
| WO | 2010086089 A1 | 8/2010 |
| WO | 2010099852 A1 | 9/2010 |
| WO | 2010102709 A1 | 9/2010 |
| WO | 2010135519 A1 | 11/2010 |
| WO | 2011110277 A1 | 9/2011 |
| WO | 2011157339 A1 | 12/2011 |
| WO | 2012007086 A1 | 1/2012 |
| WO | 2012007087 A1 | 1/2012 |
| WO | 2012007088 A1 | 1/2012 |
| WO | 2013063458 A2 | 5/2013 |
| WO | 2013133359 A1 | 9/2013 |
| WO | 2013154064 A1 | 10/2013 |
| WO | 2016046077 A1 | 3/2016 |
| WO | 2017092476 A1 | 6/2017 |
| WO | 2018113784 A1 | 6/2018 |

OTHER PUBLICATIONS

Wang et al., "A simple and efficient one step synthesis of 1,3,4-oxadiazoles utilizing polymer-supported reagents and microwave heating", Tetrahedron Letters, 47, pp. 105-108, 2006, (4 pages).

Endo et al., "Thermally Activated Delayed Fluorescence from Sn4 þ-Porphyrin Complexes and Their Application to Organic Light-Emitting Diodes—A Novel Mechanism for Electroluminescence", Advanced Materials, 21, pp. 4802-4806, 2009, (5 pages).

Endo et al., "Efficient up-conversion of triplet excitons into a singlet state and its application for organic light emitting diodes", Applied Physics Letters, 98, pp. 083302-1-083302-3, 2011, (4 pages).

Lee et al., "High-efficiency organic light-emitting diodes utilizing thermally activated delayed fluorescence from triazine-based donor-acceptor hybrid molecules", Applied Physics Letters,101, pp. 093306-1-093306-4, 2012, (5 pages).

Tanaka et al., "Efficient green thermally activated delayed fluorescence (TADF) from a phenoxazine-triphenyltriazine (PXZ-TRZ) derivative", Chemical Communications, vol. 48. No. 93, pp. 11392-11394, 2012, (4 pages).

Goushi et al., "Organic light-emitting diodes employing efficient reverse intersystem crossing for triplet-to-singlet state conversion", Nature Photonics, vol. 6, pp. 253-258, 2012, (6 pages).

Uoyama et al., "Highly efficient organic light-emitting diodes from delayed fluorescence", Nature, vol. 492, pp. 234-238, 2012, (7 pages).

Zhang et al., "Design of Efficient Thermally Activated Delayed Fluorescence Materials for Pure Blue Organic Light Emitting Diodes", Journal of the American Chemical Society, 134, pp. 14706-14709, 2012, (4 pages).

Mehes et al., "Enhanced Electroluminescence Efficiency in a Spiro-Acridine Derivative through Thermally Activated Delayed Fluorescence", Angewandte Chemie International Edition, 51, pp. 11311-11315, 2012, (5 pages).

Newkome et al., "Masses, Sizes, and Shapes of Macromolecules from Multifunctional Monomers", Dendrimers and Dendrons: Concepts, Syntheses, Applications, Chapter 1, pp. 1-21, 2001, (21 pages).

Newkome et al., "Dendrimers Derived by Divergent Procedures Using 1→2 Branching Motifs", Dendrimers and Dendrons: Concepts, Syntheses, Applications, Chapter 3, pp. 51-118, 2001, (70 pages).

Newkome et al., "Convergent Methodologies", Dendrimers and Dendrons: Concepts, Syntheses, Applications, Chapter 5, pp. 191-309, 2001, (63 pages).

Newkome et al., "Hyperbranched Materials", Dendrimers and Dendrons: Concepts, Syntheses, Applications, Chapter 6, pp. 331-392, 2001, (63 pages).

Newkome et al., "Chiral Dendritic Macromolecules", Dendrimers and Dendrons: Concepts, Syntheses, Applications, Chapter 7, pp. 395-455, 2001, (62 pages).

Extended European Search Report for European Application No. 17885049.1, dated Oct. 17, 2019, (10 pages).

International Search Report, and English Translation thereof, for International Application No. PCT/CN2017/118067, dated Mar. 22, 2018 (3 pages).

Extended European Search Report for European Application No. 17885049.1, dated Oct. 17, 2019, (9 pages).

Nakagawa et al., "Electroluminescence based on thermally activated delayed fluorescence generated by a spirobifluorene donor—acceptor structure," Chem. Commun., 48, pp. 9580-9582, 2012, (4 pages).

Nasu et al., "A highly luminescent spiro-anthracenone-based organic light-emitting diode exhibiting thermally activated delayed fluorescence," Chem. Commun., 49(88), pp. 10385-10387, 2013, (3 pages).

Li et al., "Highly Efficient Organic Light-Emitting Diode Based on a Hidden Thermally Activated Delayed Fluorescence Channel in a Heptazine Derivative," Advanced Materials, 25(24), pp. 3319-3323, 2013, (5 pages).

Dias et al., "Triplet Harvesting with 100% Efficiency by Way of Thermally Activated Delayed Fluorescence in Charge Transfer OLED Emitters," Advanced Materials, 25(27), pp. 3707-3714, 2013, (8 pages).

Komino et al., "Suppression of Efficiency Roll-Off Characteristics in Thermally Activated Delayed Fluorescence Based Organic Light-Emitting Diodes Using Randomly Oriented Host Molecules," Chemistry of Materials, 25, pp. 3038-3047, 2013, (10 pages).

Tanaka et al., "Twisted Intramolecular Charge Transfer State for Long-Wavelength Thermally Activated Delayed Fluorescence," Chemistry of Materials, 25, pp. 3766-3771, 2013, (6 pages).

Lee et al., "Oxadiazole- and triazole-based highly-efficient thermally activated delayed fluorescence emitters for organic light-emitting diodes," Journal of Materials Chemistry C., 1(30), pp. 4599-4604, 2013, (6 pages).

Ishimatsu et al., "Solvent Effect on Thermally Activated Delayed Fluorescence by 1,2,3,5-Tetrakis(carbazol-9-yl)-4,6-dicyanobenzene," Journal of Physical Chemistry A, 117, pp. 5607-5612, 2013, (6 pages).

Baldo et al., "High-efficiency fluorescent organic light-emitting devices using a phosphorescent sensitizer," Nature, vol. 403, pp. 750-753, 2000, (4 pages).

Adachi et al., "High-efficiency red electrophosphorescence devices," Applied Physics Letters, vol. 78, No. 11, pp. 1622-1624, 2001, (4 pages).

Kido et al., "Bright red light-emitting organic electroluminescent devices having a europium complex as an emitter," Applied Physics Letters, 65(17), pp. 2124-2126, 1994, (4 pages).

Kido et al., "Electroluminescence in a Terbium Complex," Chemistry Letters, pp. 657-660, vol. 19, Issue 4, 1990, (4 pages).

Johnson et al., "Luminescent Iridium(I), Rhodium(I), and Platinum(II) Dithiolate Complexes," Journal of the American Chemical Society, vol. 105, No. 7, pp. 1795-1802, 1983, (8 pages).

Wrighton et al., "The Nature of the Lowest Excited State in Tricarbonylchloro-1, 10-phenanthrolinerhenium(I) and Related Complexes," Journal of the American Chemical Society, 96(4), pp. 998-1003, 1974, (6 pages).

(56) References Cited

OTHER PUBLICATIONS

Ma et al., "Electroluminescence from triplet metal-ligand charge-transfer excited state of transition metal complexes," Synthetic Metals, 94, pp. 245-248, 1998, (4 pages).

Kipphan, "Handbook of Print Media: Technologies and Production Methods," pp. 40-67, 117-144, and 711-730, 2004, (76 pages).

Bulovic et al., "Transparent light-emitting devices," Nature, vol. 380, p. 29, 1996, (1 page).

Gu et al., "Transparent organic light emitting devices," Applied Physics Letters, 68(19), pp. 2606-2608, 1996, (4 pages).

POLYMERS CONTAINING FURANYL CROSSLINKABLE GROUPS AND USES THEREOF

CROSS REFERENCE TO RELATED APPLICATIONS

This application is a national stage for International Application PCT/CN2017/118067, filed on Dec. 22, 2017, which claims the priority benefit of Chinese Patent Application No. 201611200093.8, titled "POLYMERS CONTAINING FURANYL CROSSLINKABLE GROUPS AND USES THEREOF IN ORGANIC ELECTRONIC DEVICES" and filed on Dec. 22, 2016. The entireties of both applications are incorporated by reference herein for all purposes.

TECHNICAL FIELD

The present disclosure relates to the field of organic optoelectronic materials, in particular to a polymer containing a furanyl crosslinkable group and use thereof.

BACKGROUND

According to the difference in application of organic light-emitting materials, organic light-emitting diodes (OLEDs) can be classified into two different types: one is small molecule organic light-emitting diodes that use organic dyes, pigments and the like as a light-emitting material; the other is polymer organic light-emitting diodes (PLEDs) that use a conjugated polymer as a light-emitting material. Since the invention of organic light-emitting diodes, there is a great potential for organic light-emitting diodes to be applied in photovoltaic devices such as plat panel display and lighting, due to the diversity in synthesis, relatively low manufacturing cost, and excellent optical and electrical properties of small organic molecules and polymer semiconductor materials.

In order to obtain the high-efficiency organic electroluminescent devices, in addition to the development of high-performance luminescent materials, efficient injection of electrons and holes from the cathode and anode, respectively, is also the key point. Therefore, many highly efficient polymer electroluminescent devices generally used a multilayer device structure, that is, the device comprises at least one hole transport/hole injection layer or electron transport/electron injection layer in addition to a light emitting layer.

For small molecular vacuum evaporation organic light-emitting diodes, it is easy to obtain multi-layer, complicated and efficient organic electroluminescent device by vacuum evaporation, but the disadvantages of vacuum evaporation method are expensive, time-consuming, material-wasting, and difficult to achieve large-area applications. Corresponding solution processed organic light-emitting diodes have wide application prospects and commercial value due to the advantages of preparing large-area, flexible devices by solution processing methods such as a low-cost inkjet printing, and a Roll-to-Roll. However, in generally, commercial polymer optoelectronic materials have a similar solubility properties, e.g., polymer light-emitting materials, hole injection/transporting materials, electron injection/transporting materials have a good solubility properties in toluene, chloroform, chlorobenzene, o-dichlorobenzene, o-xylene, tetrahydrofuran, thus, when a solution processing method is used to prepare a multi-layer, complicated polymer light-emitting diode, there are problems such as interface miscibility and interface corrosion. For example, when the solution process is used to prepare a polymer light-emitting layer, the solvent used will dissolve the underlying hole transporting layer, causing problems such as interface miscibility and interface corrosion.

SUMMARY

Based on this, it is necessary to provide a polymer containing a furanyl crosslinkable group and the application in organic electronic devices for solving the problems of interface miscibility and interface corrosion when preparing a multi-layer, complicated polymer light-emitting diode using a solution processing method.

A polymer containing a furanyl crosslinkable group having the following formula (I):

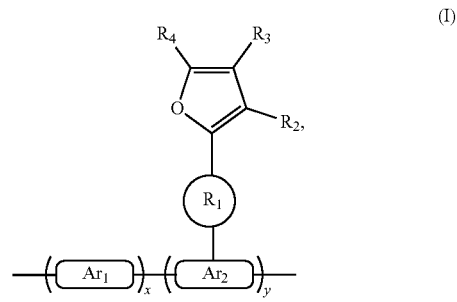

wherein x and y represent repeating units, respectively, and x and y are both positive integers.

$Ar_1$ and $Ar_2$ are each independently one selected from an aryl group containing 5 to 40 ring atoms and a heteroaryl group containing 5 to 40 ring atoms;

is a linking group, and

is one selected from the group consisting of an alkyl group, an alkoxy group, an amino group, an alkenyl group, an alkynyl group, an aralkyl group, and a heteroalkyl group;

$R_2$, $R_3$ and $R_4$ are each independently one selected from the group consisting of H, D, F, CN, an alkyl group, a fluoroalkyl group, an aryl group, a heteroaryl group, amino, Si, germyl, an alkoxy group, an arylox group, a fluoroalkoxy group, a siloxane, a siloxy group, a deuterated alkyl group, a deuterated fluoroalkyl group, a deuterated aryl group, a deuterated heteroaryl group, deuterated amino, deuterated silicon, deuterated germyl, a deuterated alkoxy group, a deuterated aryloxy group, a deuterated fluoroalkoxy group, deuterated siloxane, a deuterated siloxy group and crosslinkable groups; adjacent $R_2$, $R_3$ and $R_4$ may form a monocyclic or polycyclic aliphatic or aromatic ring system with each other or with a ring bonded to the group.

The above-mentioned polymer containing a furanyl crosslinkable group is a conjugated polymer, and the conjugated backbone structure of the above polymer containing a furanyl crosslinkable group imparts rich optical properties such as photoluminescence, electroluminescence, photovoltaic effects and the like, and electrical properties such as semiconductor characteristics, carrier transport characteristics, and the like, thus is suitable for the fabrication of complicated multilayer organic electronic devices. The furanyl crosslinkable group of the above polymer containing a furanyl crosslinkable group also has a crosslinkable function. Under acid initiation and heating condition, the above-mentioned polymer containing a furanyl crosslinkable group will produce a chemical reaction to form an insoluble and infusible three-dimensional interpenetrating network polymer film, which has excellent solvent resistance. In the preparation of complicated multilayer photoelectric devices, the solution processing characteristics of the conjugated polymer can be utilized to prepare polymer photoelectric devices by solution processing such as by inkjet printing, screen printing, spin coating, etc.; the polymer can also form the insoluble and infusible three-dimensional interpenetrating network polymer film by a way of crosslinking, the insoluble and infusible three-dimensional interpenetrating network polymer film has excellent solvent resistance which facilitating the solution processing of multilayer polymer photoelectric devices.

A mixture comprises the above-mentioned polymer containing a furanyl crosslinkable group, and an organic functional material that is at least one selecting from the group consisting of a hole injection material, a hole transporting material, an electron transporting material, an electron injection material, an electron blocking material, a hole blocking material, an emitter and a host material.

A formulation comprises the above polymer containing a furanyl crosslinkable group, and at least one organic solvent.

An organic electronic device comprises the above-described polymer containing a furanyl crosslinkable group. It has excellent light-emitting intensity and light-emitting efficiency.

BRIEF DESCRIPTION OF DRAWINGS

In order to better illustrate the technical solutions in the embodiments of the present disclosure or the prior art, the accompanying drawings used in the embodiments or the prior art description are briefly described below. Obviously, the drawings in the following description are only several embodiments of the present application, while it will be understood that other drawings may be obtained according to these drawings without any inventive step for those skilled in the art.

DETAILED DESCRIPTION OF THE EMBODIMENTS

Figure 1:
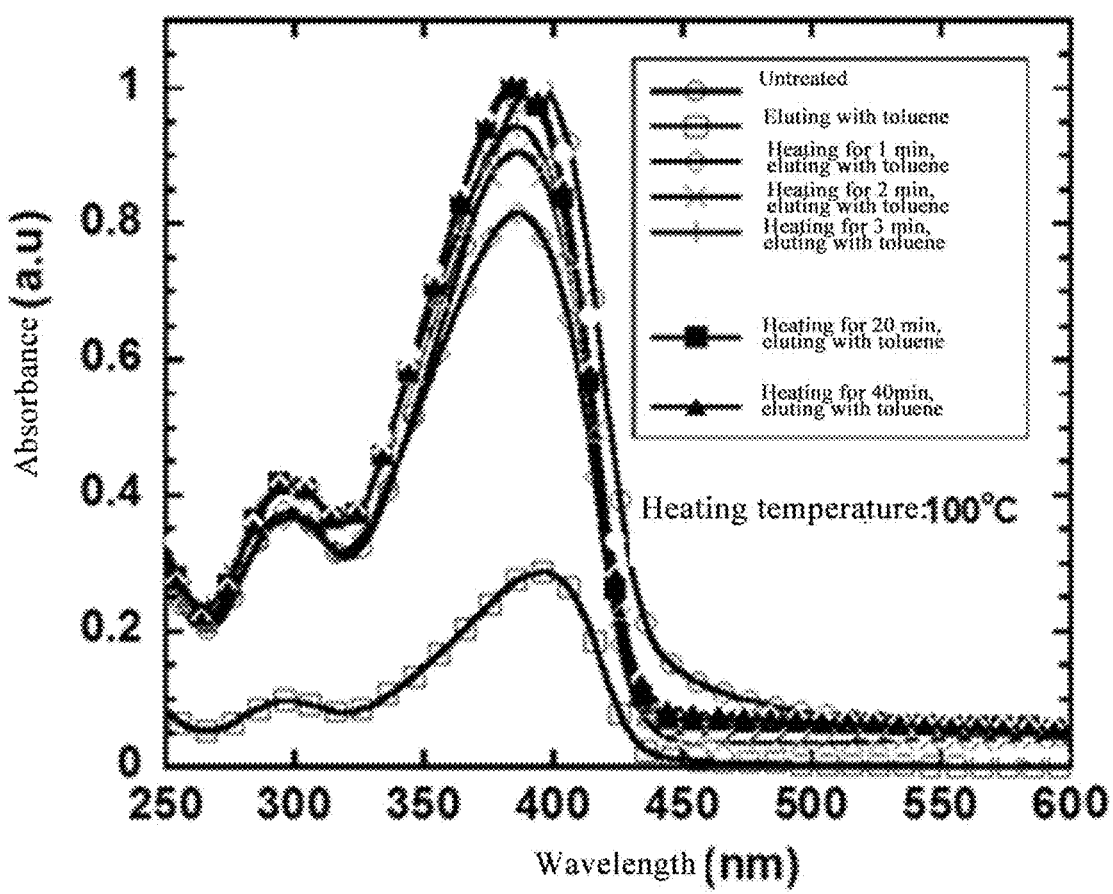
FIG. 1 is an absorbance curve graph of an embodiment, showing that a film comprising the polymer containing a furanyl crosslinkable group changes before and after of elution with a toluene solution.

The present disclosure provides a polymer containing a furanyl crosslinkable group and the application in an organic electronic device. In order to make the purpose, technical solution and effects of the present disclosure clearer and more specific, the present disclosure will be further described in detail below. It should be understood that, the specific embodiment illustrated herein is merely for the purpose of explanation, and should not be deemed to limit the disclosure.

The present embodiment relates to small molecule materials or polymer materials.

The term "small molecule" as defined herein refers to a molecule that is not a polymer, oligomer, dendrimer, or blend. There are no repeating structures in small molecules.

Polymer includes homopolymer, copolymer, and block copolymer, additionally in the present embodiment, the polymer also includes a dendrimer. The synthesis and application of dendrimers can be found in Dendrimers and Dendrons, Wiley-VCH Verlag GmbH & Co. KGaA, 2002, Ed. George R. Newkome, Charles N. Moorefield, Fritz Vogtle.

Conjugated polymer is a polymer whose backbone is primarily formed by the sp2 hybrid orbital of C atoms, such as polyacetylene and poly (phenylene vinylene), the C atoms on the backbones of conjugated polymer may also be substituted by other non-C atoms, and which are still considered to be conjugated polymers when the sp2 hybridization on the backbones is spaced by some natural defects. In addition, the conjugated polymer in the present embodiment may optionally comprise heteroaromatic, aryl amine, aryl phosphine on the backbone, and may optionally comprise organometallic complexes on the backbone.

A polymer containing a furanyl crosslinkable group having the following formula (I):

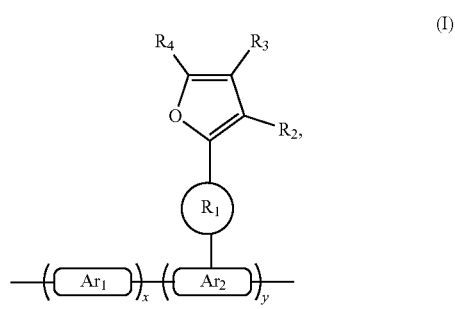

wherein x and y represent repeating units, respectively, and x and y are both positive integers;

are each independently selected from an aryl group containing 5 to 40 ring atoms and a heteroaryl group containing 5 to 40 ring atoms;

is a linking group, and

is one selected from the group consisting of an alkyl group, an alkoxy group, an amino group, an alkenyl group, an alkynyl group, an aralkyl group, and a heteroalkyl group; $R_2$, $R_3$ and $R_4$ are each independently one selected from the group consisting of H, D, F, CN, an alkyl group, a fluoroalkyl group, an aryl group, a heteroaryl group, amino, Si, germyl, an alkoxy group, an aryloxy group, a fluoroalkoxy group, a siloxane, a siloxy group, a deuterated alkyl group, a deuterated fluoroalkyl group, a deuterated aryl group, a deuterated heteroaryl group, deuterated amino, deuterated silicon, deuterated germyl, a deuterated alkoxy group, a deuterated aryloxy group, a deuterated fluoroalkoxy group, deuterated siloxane, a deuterated siloxy group and crosslinkable groups, adjacent $R_2$, $R_3$ and $R_4$ may form a monocyclic or polycyclic aliphatic or aromatic ring to system with each other or with a ring bonded to the group.

Further,

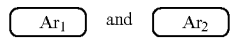

are each independently selected from an aryl group containing 5 to 35 ring atoms and a heteroaryl group containing 5 to 35 ring atoms.

Further,

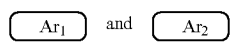

are each independently selected from an aryl group containing 5 to 30 ring atoms and a heteroaryl group containing 5 to 30 ring atoms.

Further,

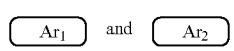

are each independently selected from an aryl group containing 5 to 20 ring atoms and a heteroaryl group containing 5 to 20 ring atoms.

Further,

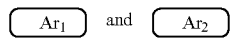

are each independently selected from an aryl group containing 6 to 10 ring atoms and a heteroaryl group containing 6 to 10 ring atoms.

Further,

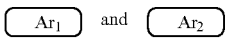

are each independently selected from an aryl group containing 6 to 20 ring atoms.

Further,

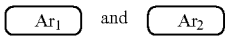

are each independently selected from an aryl group containing 6 to 15 ring atoms.

Further,

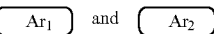

are each independently selected from an aryl group containing 6 to 10 ring atoms.

Further, the aryl group of

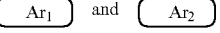

has a ring system containing 5 to 15 carbon atoms.

Further, the aryl group of

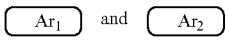

has a ring system containing 5 to 10 carbon atoms.

Further, the heteroaryl group of

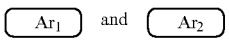

has a ring system containing 2 to 15 carbon atoms.

Further, the heteroaryl group of

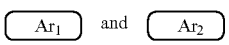

has a ring system containing 2 to 10 carbon atoms and at least one heteroatom, provided that the total number of carbon atoms and heteroatoms is at least 4.

Further, the heteroatom of the heteroaryl group of

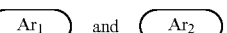

is at least one selected from the group consisting of Si, N, P, O, S, and Ge.

Further, the heteroatom of the heteroaryl group of

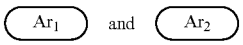

is at least one selected from the group consisting of Si, N, P, O, and S.

Further, the heteroatom of the heteroaryl group of

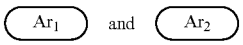

is at least one selected from the group consisting of N, O, and S.

The aryl group or aromatic ring system refers to the hydrocarbyl comprising at least one aromatic ring, including monocyclic group and polycyclic ring system. The heteroaromatic ring system or heteroaryl group refers to hydrocarbyl group (containing heteroatoms) comprising at least one heteroaromatic ring, including monocyclic group and polycyclic ring system. Such polycyclic rings may have two or more rings, and two carbon atoms in the polycyclic ring system are shared by two adjacent rings, i.e., fused ring. At least one ring of such polycyclic rings is aromatic or heteroaromatic. In the present embodiment, the aromatic or heteroaromatic ring system not only includes a system of aryl group or heteroaryl group, but also includes a plurality of aryl groups or a plurality of heteroaryl groups which may be spaced by short non-aromatic units with the atomic number ratio of less than 10%. Further, a plurality of aryl groups or a plurality of heteroaryl groups is spaced by non-H atoms with the atomic number ratio of less than 5%. The non-H atoms comprise at least one of C, N, and O.

Further, the aryl group is selected from one of the following compounds: 9,9'-spirobifluorene, 9,9-diarylfluorene.

Further, the heteroaryl group is selected from one of the following compounds: triarylamine, diaryl ether.

Further, the aryl group is selected from the group consisting of benzene, derivatives of benzene, naphthalene, derivatives of naphthalene, anthracene, derivatives of anthracene, phenanthrene, derivatives of phenanthrene, peylene, derivatives of peylene, tetracene, derivatives of tetracene, pyrene, derivatives of pyrene, benzopyrene, derivatives of benzopyrene, benzophenanthrene, derivatives of benzophenanthrene, acenaphthene, derivatives of acenaphthene, fluorene, and derivatives of fluorene.

Further, the heteroaryl group is selected from the group consisting of furan, derivatives of furan, benzofuran, derivatives of benzofuran, thiophene, derivatives of thiophene, benzothiophene, derivatives of benzothiophene, pyrrole, derivatives of pyrrole, pyrazole, derivatives of pyrazole, triazole, derivatives of triazole, imidazole, derivatives of imidazole, oxazole, derivatives of oxazole, oxadiazole, derivatives of oxadiazole, thiazole, derivatives of thiazole, tetrazole, derivatives of tetrazole, indole, derivatives of indole, carbazole, derivatives of carbazole, pyrroloimidazole, derivatives of pyrroloimidazole, pyrrolopyrrole, derivatives of pyrrolopyrrole, thienopyrrole, derivatives of thienopyrrole, thienothiophene, derivatives of thienothiophene, furopyrrole, derivatives of furopyrrole, furofuran, derivatives of furofuran, thienofuran, derivatives of thienofuran, benzisoxazole, derivatives of benzisoxazole, benzisothiazole, derivatives of benzisothiazole, benzimidazole, derivatives of benzimidazole, pyridine, derivatives of pyridine, pyrazine, derivatives of pyrazine, pyridazine, derivatives of pyridazine, pyrimidine, derivatives of pyrimidine, triazine, derivatives of triazine, quinoline, derivatives of quinoline, isoquinoline, derivatives of isoquinoline, cinnoline, derivatives of cinnoline, quinoxaline, derivatives of quinoxaline, phenanthridine, derivatives of phenanthridine, perimidine, derivatives of perimidine, quinazoline, derivatives of quinazoline, quinazolinone and derivatives of quinazolinone.

Further

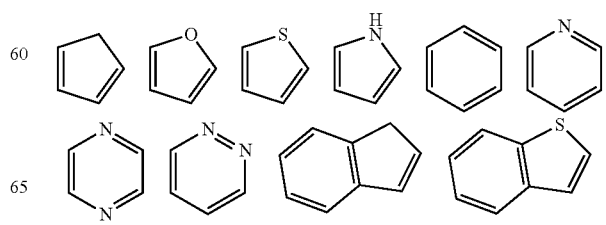

are each independently selected from one of the group consisting of:

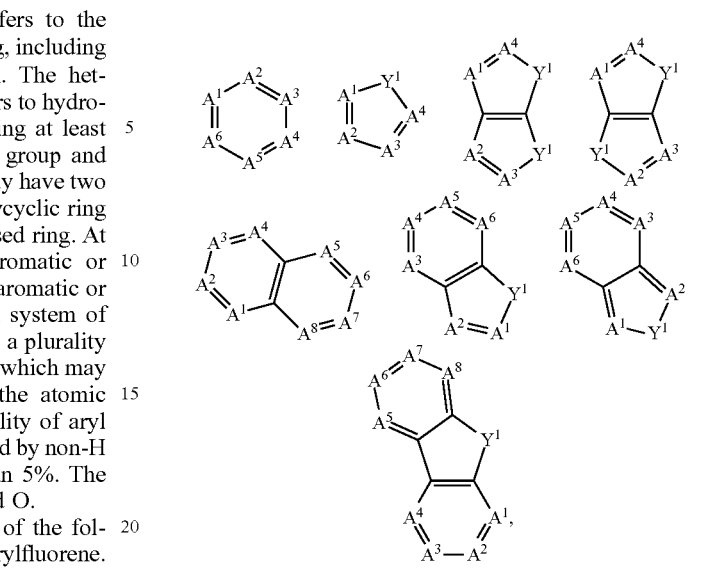

wherein, $A^1$, $A^2$, $A^3$, $A^4$, $A^5$, $A^6$, $A^7$ and $A^8$ are independently $CR^5$ or N;

$Y^1$ is one selected from $CR^6R^7$, $SiR^8R^9$, $NR^{10}$, $C(=O)$, S and O;

$R^5$ to $R^{10}$ are each independently selected from one of the group consisting of H, D, a linear alkyl group containing 1 to 20 C atoms, an alkoxy group containing 1 to 20 C atoms, a thioalkoxy group containing 1 to 20 C atoms, a branched alkyl group containing 3 to 20 C atoms, a cyclic alkyl group containing 3 to 20 C atoms, an alkoxy group containing 3 to 20 C atoms, a thioalkoxy group containing 3 to 20 C atoms, a silyl group containing 3 to 20 C atoms, a substituted keto group containing 1 to 20 C atoms, an alkoxycarbonyl group containing 2 to 20 C atoms, an aryloxycarbonyl group containing 7 to 20 C atoms, cyano (—CN), carbamoyl (—C(=O)NH2), halocarbonyl (C(=O)—X, wherein X represents a halogen atom), formyl (—C(=O)—H), isocyano, isocyanate, thiocyanate, isothiocyanate, hydroxyl, nitryl, $CF_3$, Cl, Br, F, a crosslinkable group, an aryl group containing 5 to 40 ring atoms, a heteroaryl group containing 5 to 40 ring atoms, an aryloxy group containing 5 to 40 ring atoms and a heteroaryloxy group containing 5 to 40 ring atoms, one or more of $R^5$ to $R^{10}$ may form a monocyclic or polycyclic aliphatic or aromatic ring system with each other or with a ring bonded to the group.

Further,

are each independently selected from one of the group consisting of:

zole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenohydroxyquinoline, and selenohydroxyquinoline.

Further,

Ar₁ and Ar₂ are each independently selected from one of the group consisting of:

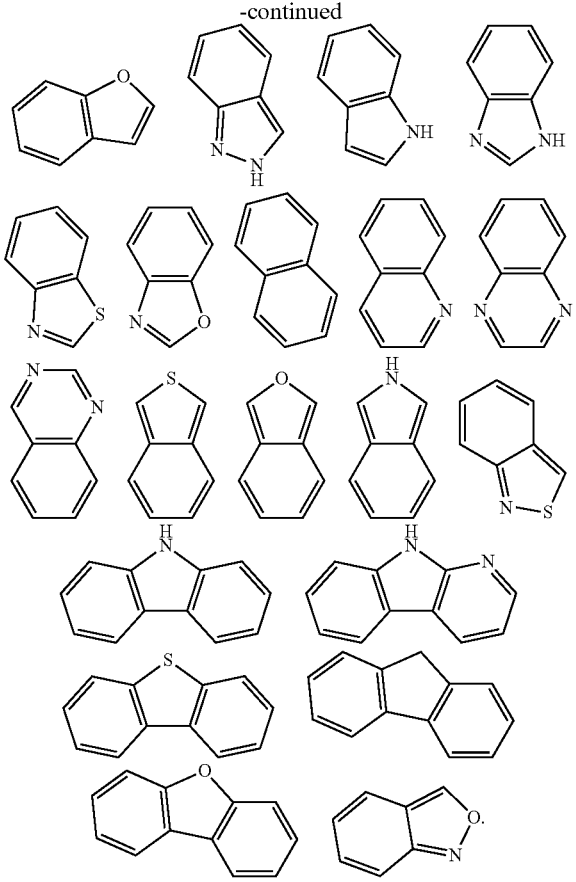

Further,

Ar₁ and Ar₂ are each independently cyclic aryl group.

Further,

Ar₁ and Ar₂ are each independently selected from one of the group consisting of benzene, biphenyl, phenanthrene, benzophenanthrene, fluorene, indenofluorene and a derivative thereof.

Further,

Ar₁ and Ar₂ are each independently selected from one of the group consisting of triphenylamine, dibenzothiophene, dibenzofuran, dibenzoselenophene, furan, thiophene, benzofuran, benzothiophene, benzoselenophene, carbazole, indolocarbazole, pyridinoindole, pyrrolodipyridine, pyrazole, imidazole, triazoles, oxazole, thiazole, oxadiazole, oxatriazole, dioxazole, thiadiazole, pyridine, pyridazine, pyrimidine, pyrazine, triazines, oxazine, oxathiazine, oxadiazines, indole, benzimidazoles, indazole, indoxazine, bisbenzoxa-

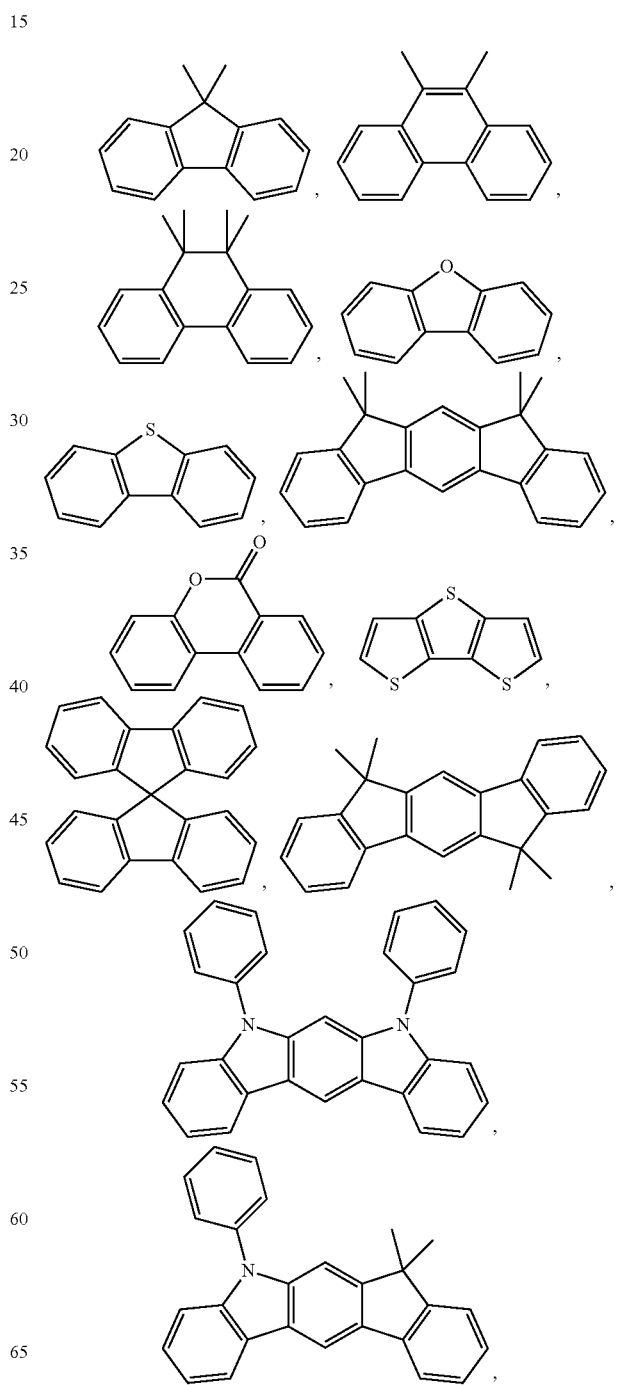

-continued

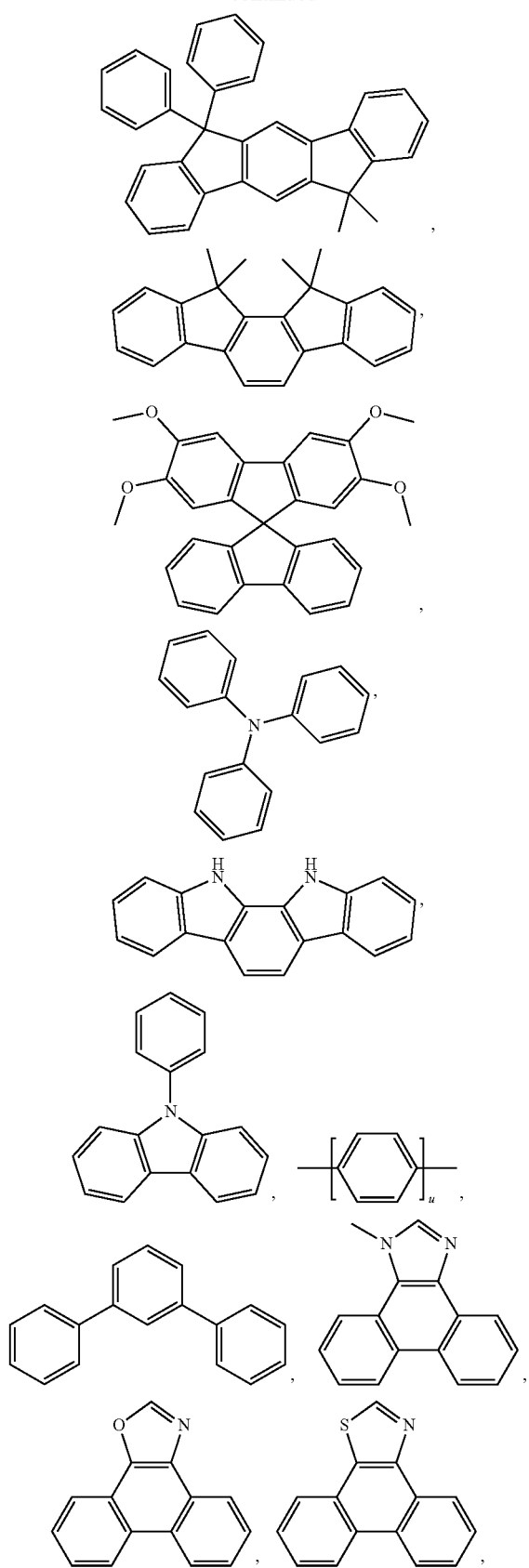

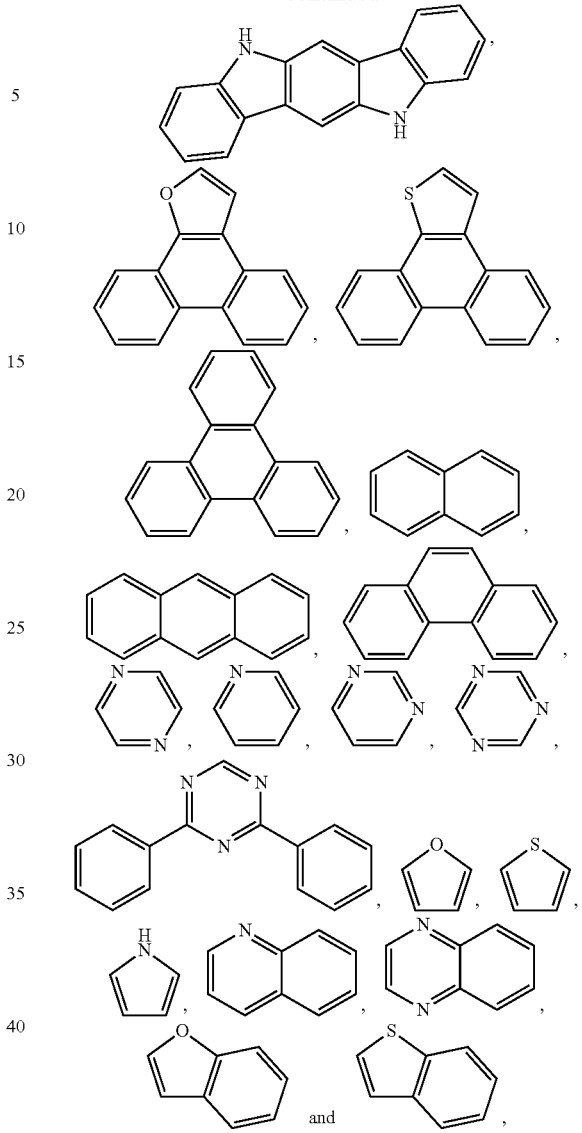

wherein u is a integer from 1 to 4.

Further, the aryl and heteroaryl groups in Ar₁ and Ar₂ may be further substituted with a substituent that is one selected from the group consisting of hydrogen, deuterium, an alkyl group, an alkoxy group, an amino group, an alkenyl group, an alkynyl group, an aralkyl group, a heteroalkyl group, an aryl group and a heteroaryl group.

Generally, the conjugated polymer includes at least one backbone structural unit. The backbone structural unit generally has a π-conjugated structural unit with larger energy gap, and it is also called a backbone unit. Backbone unit may be one selected from monocyclic aryl, polycyclic aryl, monocyclic heteroaryl or polycyclic heteroaryl. In the present embodiment, the conjugated polymer includes at least two backbone structural units.

Further, the molar percentage of the backbone structural unit in the conjugated polymer is ≥40%.

Further, the molar percentage of the backbone structural unit in the conjugated polymer is ≥50%.

Further, the molar percentage of the backbone structural unit in the conjugated polymer is ≥55%.

Further, the molar percentage of the backbone structural unit is in the conjugated polymer ≥60%.

In a polymer having a branched chain (side chain), a chain having the largest number of links or a chain having the largest number of repeating units is called a backbone.

Further, $$\boxed{Ar_1}$$

is backbone structural units, and $$\boxed{Ar_1}$$

is one selected from the group consisting of benzene, biphenyl, triphenyl, benzo, fluorene, indenofluorene, carbazole, indolecarbazole, dibenzosilole, dithienocyclopentadiene, dithienosilole, thiophene, anthracene, naphthalene, benzodithiophene, benzofuran, benzothiophene, benzoselenophene, and derivatives thereof.

In certain embodiments, the polymers of the present embodiments have hole transport property.

Further, $$\boxed{Ar_2}$$

is a group having hole transport property.

Further, $$\boxed{Ar_2}$$

is a group having hole transport property, and $$\boxed{Ar_2}$$

is one selected from the group consisting of aryl amine, triphenylamine, naphthylamine, thiophene, carbazole, dibenzothiophene, dithienocyclopentadiene, dithienothiol, dibenzoselenophene, furan, thiophene, benzofuran, benzothiophene, benzoselenophene, carbazole, indolocarbazole, and derivatives thereof.

Further, $$\boxed{Ar_2}$$

has a structure represented by chemical formula 1:

chemical formula 1

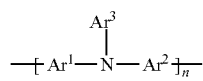

wherein $Ar^1$, $Ar^2$ and $Ar^3$ may be same or different in multiple occurrences.

—$Ar^1$— is a single bond, a mononuclear aryl group, a polynuclear aryl group, a mononuclear heteroaryl group, or a polynuclear heteroaryl group, the aryl group or heteroaryl group may be substituted with other side chains.

$Ar^2$ is a mononuclear aryl group, a polynuclear aryl group or a mononuclear heteroaryl group, or a polynuclear heteroaryl group, the aryl group or heteroaryl group may be substituted with other side chains.

$Ar^3$ is a mononuclear aryl group, a polynuclear aryl group or a mononuclear heteroaryl group, or a polynuclear heteroaryl group, the aryl group or heteroaryl group may be substituted with other side chains.

Further, $Ar^3$ may also be linked to other moieties in the chemical formula 1 via a bridging group.

n is an integer from 1 to 5.

Further, the structural unit represented by the chemical formula 1 is one of the following chemical formula 2(a) and 2(b):

chemical formula 2

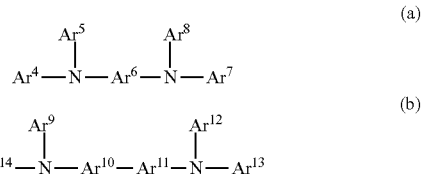

wherein, $Ar^4$, $Ar^6$, $Ar^7$, $Ar^{10}$, $Ar^{11}$, $Ar^{13}$ and $Ar^{14}$ each are a mononuclear aryl group, a polynuclear aryl group or a mononuclear heteroaryl group, or a polynuclear heteroaryl group, the aryl group or heteroaryl group may be substituted with other side chains.

$Ar^5$, $Ar^8$, $Ar^9$ and $Ar^{12}$ are each a mononuclear aryl group, a polynuclear aryl group or a mononuclear heteroaryl group, or a polynuclear heteroaryl group, the aryl group or heteroaryl group may be substituted with other side chains.

Further, $A^5$, $Ar^8$, $Ar^9$ and $Ar^{12}$ are also optionally linked to other moieties in the chemical formula 2 via a bridging group.

Further, $Ar^1$ to $Ar^{14}$ of the chemical formula 1 and chemical formula 2 are each independently one selected from the group consisting of benzene, naphthalene, anthracene, fluorene, spirobifluorene, indenofuorene, phenanthrene, thiophene, pyrrole, carbazole, binaphthalene and dehydrophenanthrene.

Further, Chemical Formula 1 and chemical formula 2 each independently have one of the following structures:

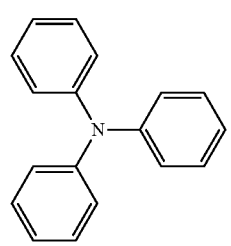

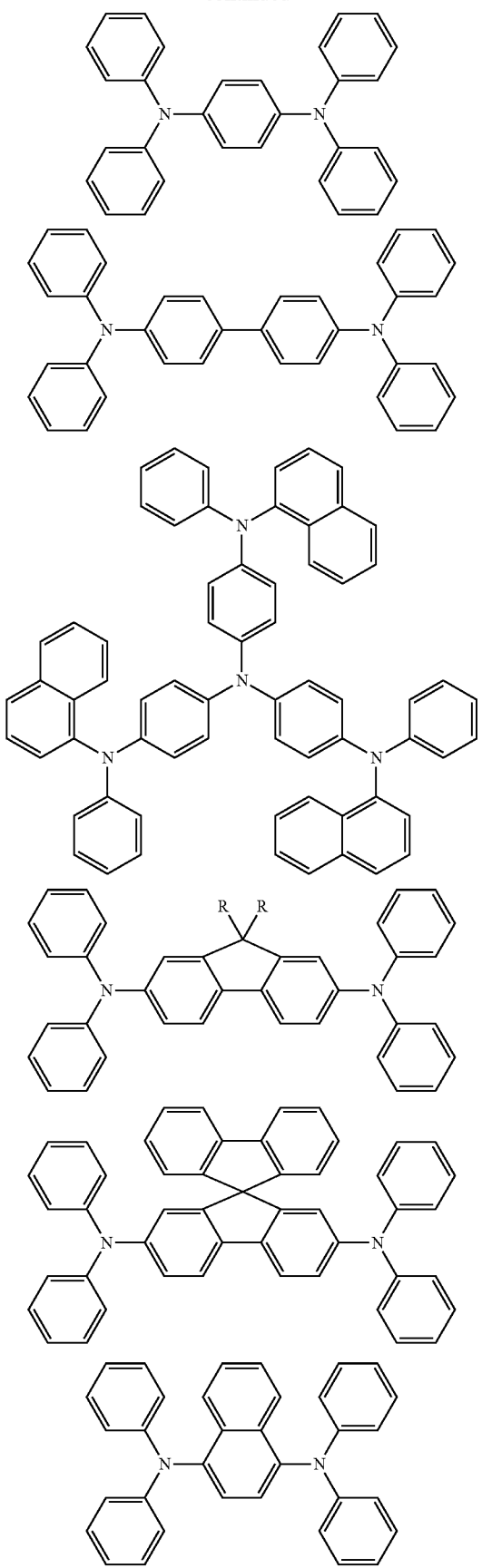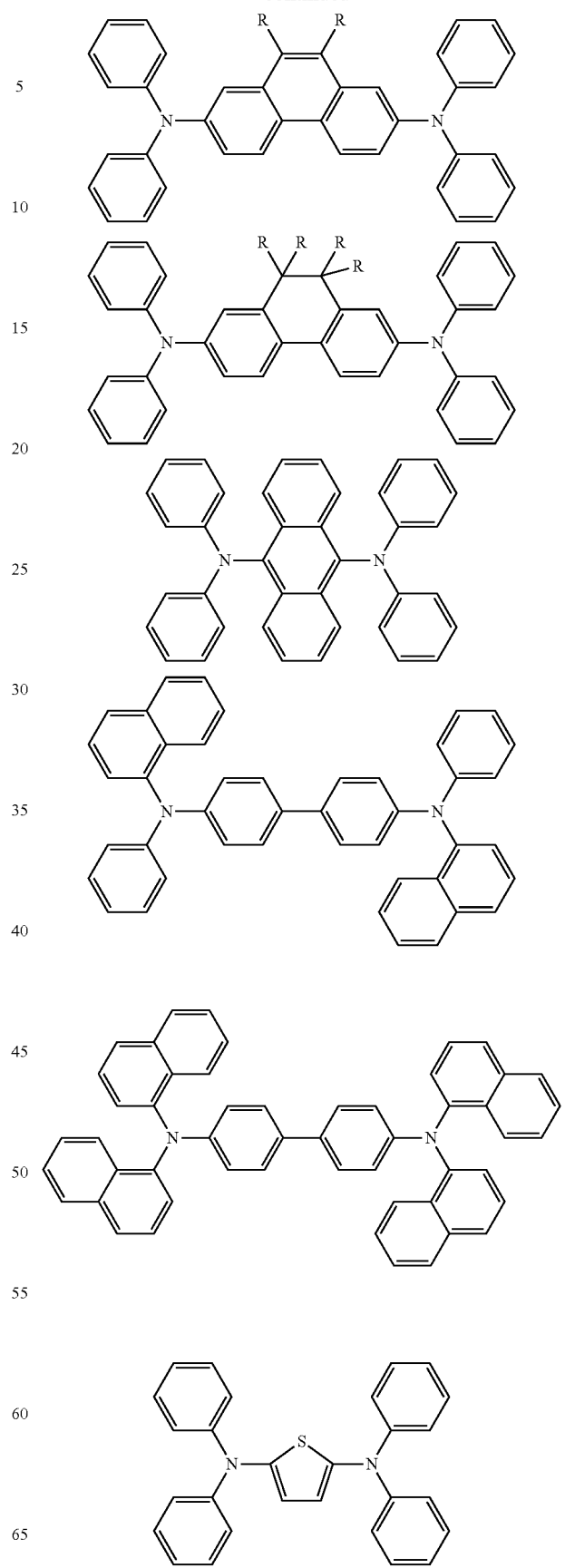

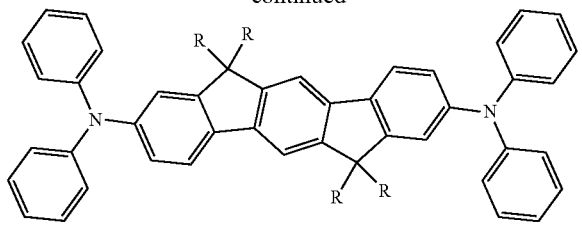

R is a substituent.

Further,

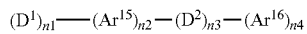

has a structure represented by chemical formula 3:

chemical formula 3

$$(D^1)_{n1}-(Ar^{15})_{n2}-(D^2)_{n3}-(Ar^{16})_{n4}$$

Wherein, $D^1$ and $D^2$ are each independently selected from one of the group consisting of thiophene, selenophene, thieno[2,3b]thiophene, thieno[3,2b]thiophene, dithienothiophene, pyrrole and aniline. And all of the above compounds may be optionally substituted by the following groups: halogen, —CN, —NC, NCO—, NCS—, —OCN, —SCN, —C(═O)NR°R°°, —C(═O)X, —C(═O)R°, —NH$_2$, —NR°R°°, —SH, —SR°, —SO$_3$H, —SO$_2$R°, —OH, —NO$_2$, —CF$_3$, —SF$_5$, silyl containing 1 to 40 C atoms, divalent carbyl containing 1 to 40 C atoms, and hydrocarbyl containing 1 to 40 C atoms, wherein R°, R°° are a substituted group.

$Ar^{15}$ and $Ar^{16}$ are each independently selected from a mononuclear aryl group, a polynuclear aryl group or a mononuclear heteroaryl group, or a polynuclear heteroaryl group. They may optionally be fused to their respective adjacent $D^1$ and $D^2$.

Further, $Ar^{15}$ and $Ar^{16}$ are each independently selected from one of the group consisting of phenylene, naphthalene, anthracene, fluorene, spirobifluorene, indenofuorene, phenanthrene, thiophene, pyrrole, carbazole, binaphthalene, and dehydrophenanthrene.

n1 to n4 are an integer, and each independently selected from 0 to 4.

Further, suitable units having hole transport property correspond to small molecule hole transport materials (HTM). Suitable HTM materials include at least one of the compounds having the following structural units: phthalocyanine, porphyrine, amine, thiophene, fused thiophene (such as dithienothiophene and dibenzothiphene), pyrrole, aniline, carbazole, indolocarbazole, derivatives of phthalocyanine, derivatives of porphyrin, derivatives of an amine, derivatives of thiophene, derivatives of fused thiophene (such as derivatives of dithienothiophene and derivatives of dibenzothiphene), derivatives of pyrrole, derivatives of carbazole, and derivatives of indolocarbazole.

Further, the cyclic aromatic amine-derived compound which is used as HTM includes at least one of the following structures:

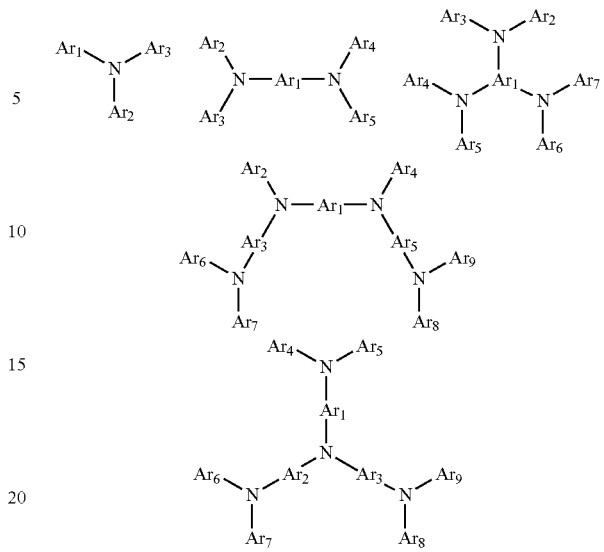

wherein, $Ar_1$ to $Ar_9$ are each independently a cyclic aromatic hydrocarbon group or heteroaromatic group.

Further, $Ar_1$ to $Ar_9$ are each independently selected from one of the group consisting of phenyl, biphenyl, triphenyl, benzo, naphthyl, anthracenyl, phenylene, phenanthryl, fluorenyl, pyrenyl, chrysenyl, perylenyl and azulenyl.

Further, $Ar_1$ to $Ar_9$ are each independently selected from one of the group consisting of dibenzothiophene, dibenzofuran, furan, thiophene, benzofuran, benzothiophene, carbazole, pyrazole, imidazole, triazole, isoxazole, thiazole, oxadiazole, oxatriazole, dioxazole, thiadiazole, pyridine, pyridazine, pyrimidine, pyrazine, triazine, oxazine, oxathiazine, oxadiazines, indole, benzimidazole, indazole, indoxazine, benzooxazole, benzisoxazole, benzothiazole, quinoline, isoquinoline, o-diaza(hetero)naphthalene, quinazoline, quinoxaline, naphthalene, phthalein, pteridine, xanthene, acridine, phenazine, phenothiazine, phenoxazine, dibenzoselenophene, benzoselenophene, benzofuropyridine, indolocarbazole, pyridylindole, pyrrolodipyridine, furodipyridine, benzothienopyridine, thienodipyridine, benzoselenohydroxyquinoline and selenohydroxyquinoline; and a group containing 2 to 10 ring structures, they may be the same or different types of cyclic aromatic hydrocarbon groups or heteroaromatic groups and may be linked together directly or through at least one of the following groups: an oxygen atom, a nitrogen atom, a sulfur atom, a silicon atom, a phosphorus atom, a boron atom, a chain structural unit, and an aliphatic ring group. Wherein each of $Ar_1$ to $Ar_9$ may be further substituted with substituent that is one selected from the group consisting of hydrogen, an alkyl group, an alkoxy group, amino, an alkenyl group, an alkynyl group, an aralkyl group, a heteroalkyl group, an aryl group and a heteroaryl group.

In one of the embodiments, $Ar_1$ to $Ar_9$ each independently comprise at least one of the following groups:

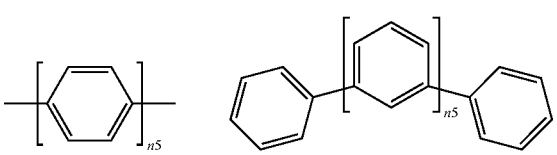

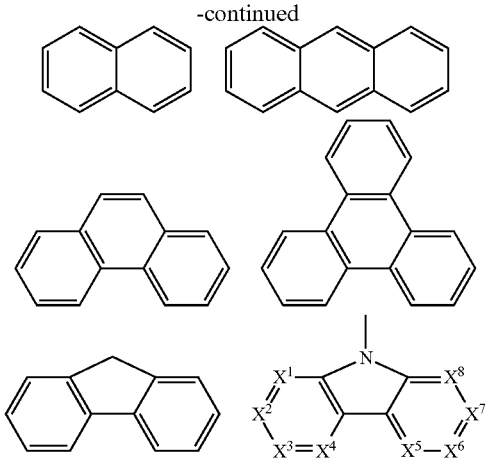
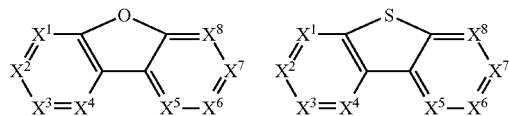
wherein n5 is an integer from 1 to 20. $X^1$ to $X^8$ is CH or N.
Further, the cyclic aromatic amine-derived compound which can be used as the HTM is one selected from U.S. Pat. Nos. 3,567,450, 4,720,432, 5,061,569, 3,615,404 and 5,061,569.
Further, HTM is one selected from the following compounds:
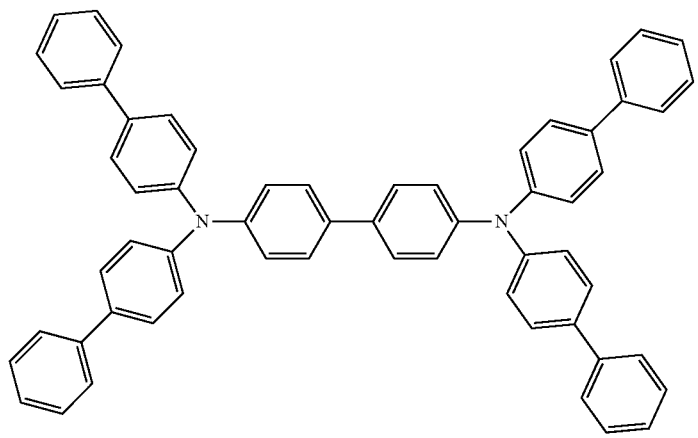
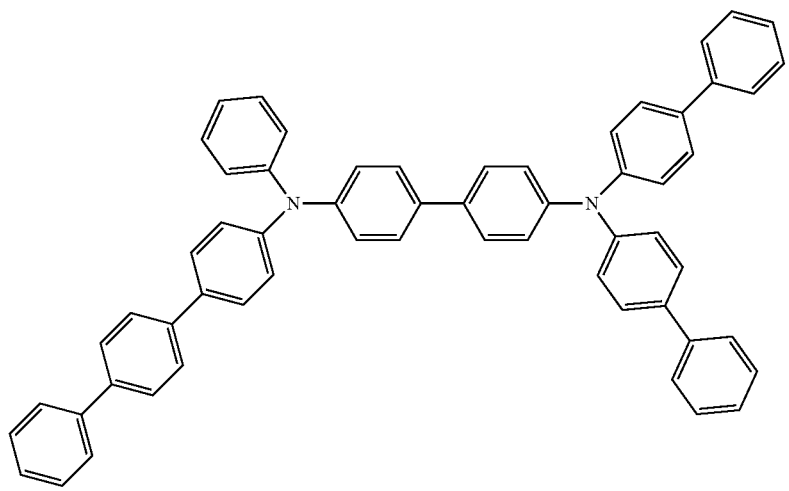

-continued
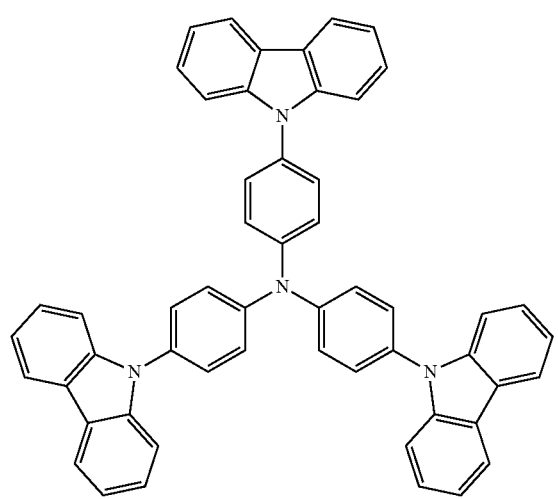
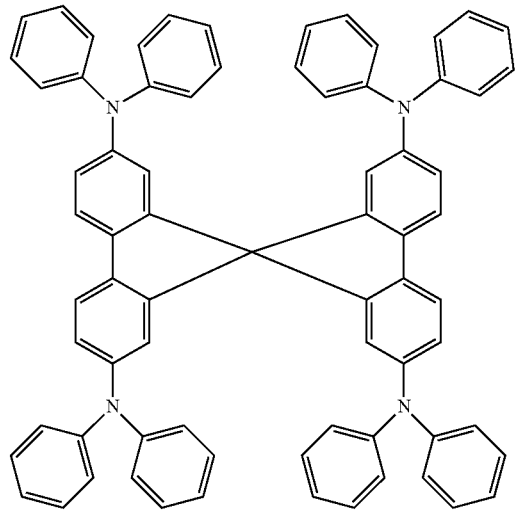
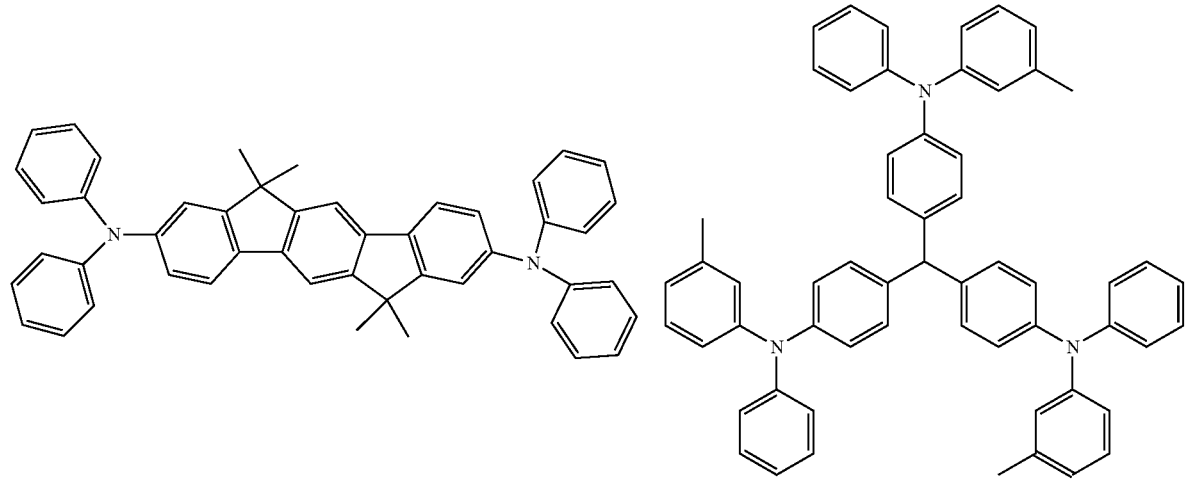
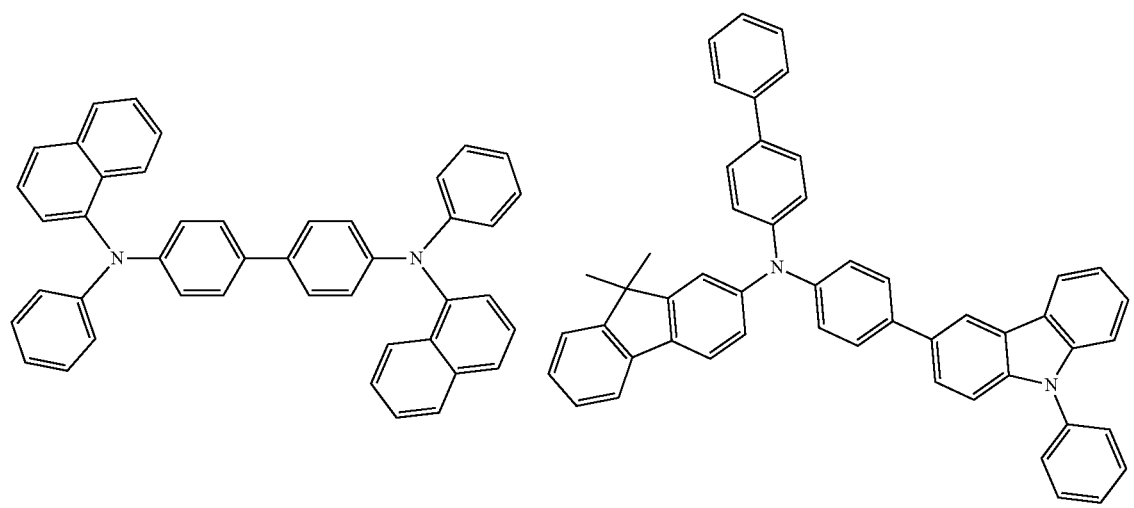

All of the above HTMs can be incorporated into the polymer of the present embodiment as a hole transport structural unit.

In certain embodiments, the polymers of the present embodiments have electron transport property.

Further,

[Ar₂]

is selected from groups having electron transport property.

Further,

[Ar₂]

is selected from the group consisting of pyrazole, imidazole, triazoles, oxazole, thiazole, oxadiazole, oxatriazole, thiadiazole, pyridine, pyridazine, pyrimidine, pyrazine, triazines, oxazine, oxathiazine, oxadiazines, indole, benzimidazoles, indazole, indoxazine, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenohydroxyquinoline, and selenohydroxyquinoline.

The units having the electron transport property corresponds to the electron transport material (ETM). ETM is sometimes referred to as an n-type organic semiconductor material. In principle, examples of suitable ETM material are not particularly limited, and any metal clathrate or organic compound may be used as the EIM/ETM as long as it can transport electrons.

Further, the ETM material may be selected from the group consisting of tris(8-hydroxyquinoline)aluminum (AlQ3), phenazine, phenanthroline, anthracene, phenanthrene, fluorene, bifluorene, spiro-bifluorene, phenylene-vinylene, triazine, triazole, imidazole, pyrene, perylene, trans-indenofluorene, cis-indenofluorene, dibenzol-indenofluorene, indenonaphthalene, benzanthracene, and derivatives of the above compounds.

Further, the compound which can be used as the ETM comprises at least one of the following groups:

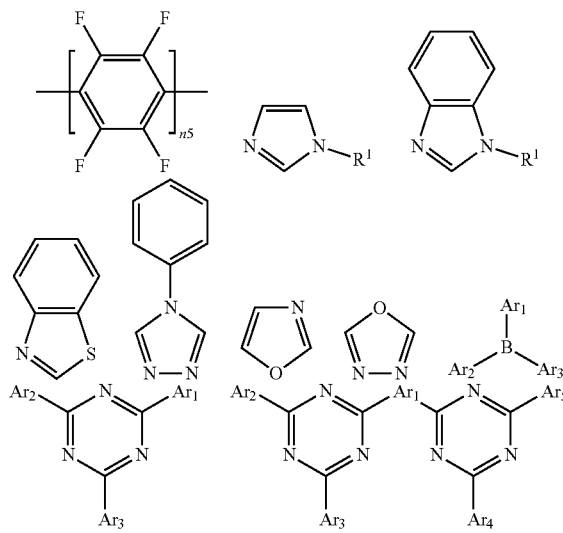

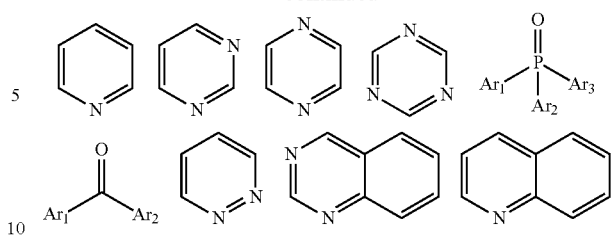

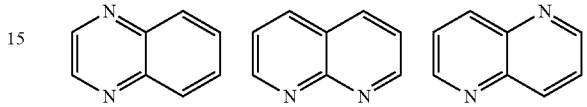

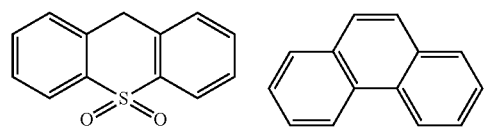

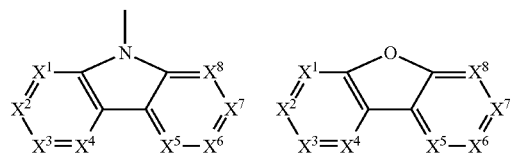

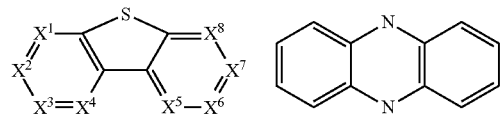

wherein $R^1$ is one selected from the group consisting of hydrogen, an alkyl group, an alkoxy group, amino, an alkenyl group, an alkynyl group, an aralkyl group, a heteroalkyl group, an aryl group and a heteroaryl group. When $R^1$ is an aryl group or a heteroaryl group, $R^1$ has the same meaning as $Ar_1$ in the above HTM, and $Ar_1$ to $Ar_5$ have the same meaning as $Ar_1$ described in HTM. $X^1$ to $X^8$ are each independently $CR^1$ or N.

Further, the ETM is one selected from the following compounds:

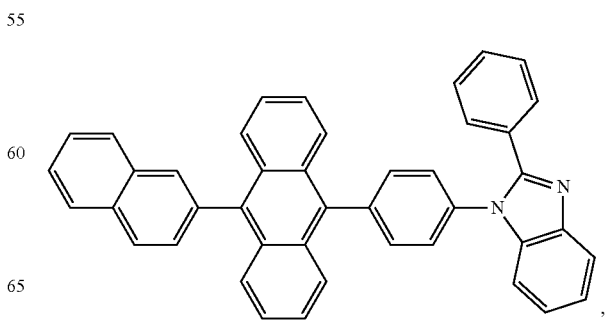

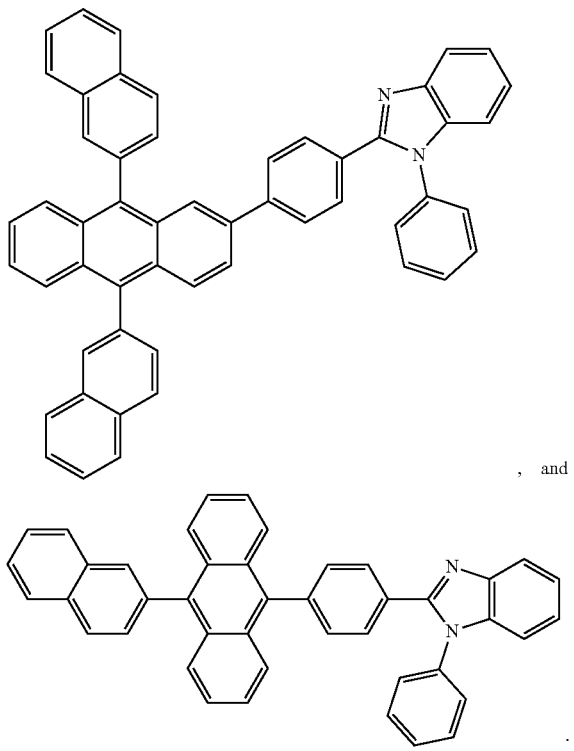
, and

All of the above ETMs can be incorporated into the polymer of the present embodiment as an electron transport structural unit.

Further, the above polymer containing a furanyl cross-linkable group has the following general formula (II):

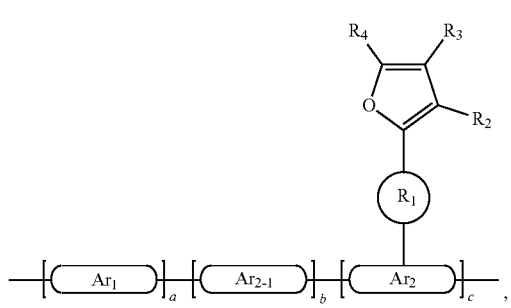
(II)

Wherein, a, b and c are mol %, respectively, and are greater than 0, a+b+c=1,

Ar$_{2-1}$ has the same meaning as

Ar$_2$

Further,

Ar$_{2-1}$ is selected from optoelectronic functional groups different from

Ar$_1$ and Ar$_2$.

The optoelectronic functional group can be referred to the corresponding organic functional materials, including a hole injection or transport material (HIM/HTM), a hole blocking material (HBM), an electron injection or transport material (EIM/ETM), an electron blocking material (EBM), an organic host material (Host), a singlet emitter (a fluorescent emitter), a triplet emitter (a phosphorescent emitter). Further, the optoelectronic functional group is light-emitting organometallic complex. Various organic functional materials are described in detail, for example, in WO2010135519A1, US20090134784A1, and WO2011110277A1.

The optoelectronic functional group may be selected from one of the following functional groups: a hole (also called a hole) injection functional group or a hole transport functional group, a hole blocking functional group, an electron injection functional group or an electron transport functional group, an electron blocking functional group, an organic host functional group, a singlet light emitting functional group, a triplet light emitting functional group, and a thermally activated delayed fluorescent functional group.

Further,

Ar$_{2-1}$ is one selected from a singlet light emitting functional group, a triplet light emitting functional group, and a thermally activated delayed fluorescent functional group.

Further, c is from 1% to 30%, still further, c is from 2% to 20%, and even further, c is from 3% to 15%.

In the formula (I),

R$_1$ is a linking group.

Further,

R$_1$ is an alkyl group containing 2 to 30 carbon atoms, an alkoxy group, amino, an alkenyl group, an alkynyl group, an aralkyl group, a heteroalkyl group, an aryl group and a heteroaryl group.

Further,

R$_1$ is an alkyl group, an alkoxy group, an amino group, an alkenyl group, an alkynyl group, an aralkyl group or a heteroalkyl group.

Further,

is an alkyl group containing 1 to 30 carbon atoms, an alkoxy group containing 1 to 30 carbon atoms, benzene, biphenyl, triphenyl, benzo, thiophene, anthracene, naphthalene, benzodithiophene, aromatic amine, dibenzothiophene, dithienocyclopentadiene, dithienothiole, dibenzoselenophene, benzofuran, benzothiophene, benzoselenophene, carbazole or furan.

Further,

is an aryl group containing 5 to 60 ring atoms or a heteroaryl group containing 5 to 60 ring atoms.

Further, in the formula (I), $R_2$, $R_3$ and $R_4$ are each independently selected from one of the group consisting of D, a halogen hetero atom (for example, including F, Cl, Br, and I), a nitrile group, a nitro group, a hydroxymethyl group, aldehyde, amino, a C1-C30 alkyl group, a C1-C30 alkoxy group, phenyl, biphenyl, triphenyl, benzo, thiophene, anthracene, naphthalene, benzodithiophene, aromatic amines, triphenylamine, naphthalene amines, carbazole, dibenzothiophene, dithienocyclopentadiene, dithienosilole, dibenzoselenophene, benzofuran, benzothiophene, benzoselenophene and furan.

Further, the side chain unit constructed by

and the furanyl crosslinkable group is one selected from the group consisting of

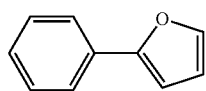
1

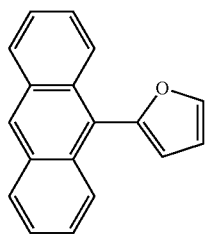
2

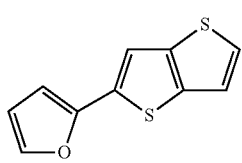
3

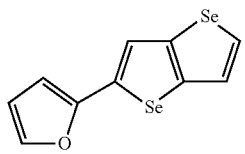
4

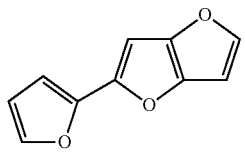
5

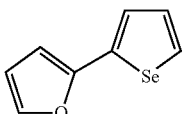
6

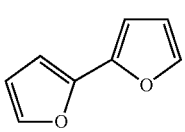
7

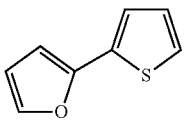
8

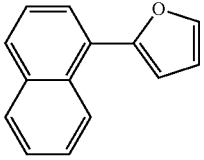
9

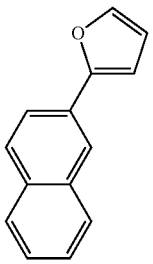
10

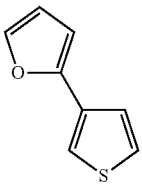
11

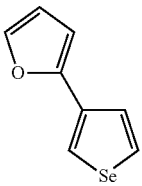
12

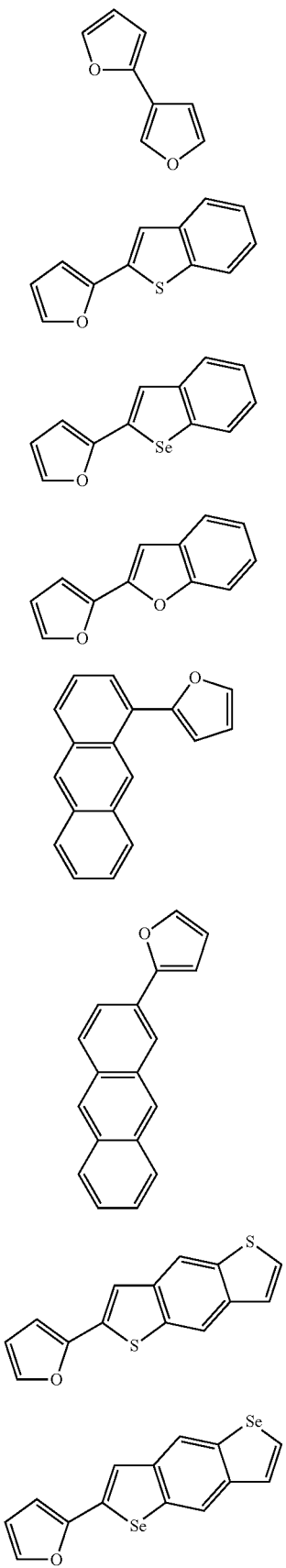
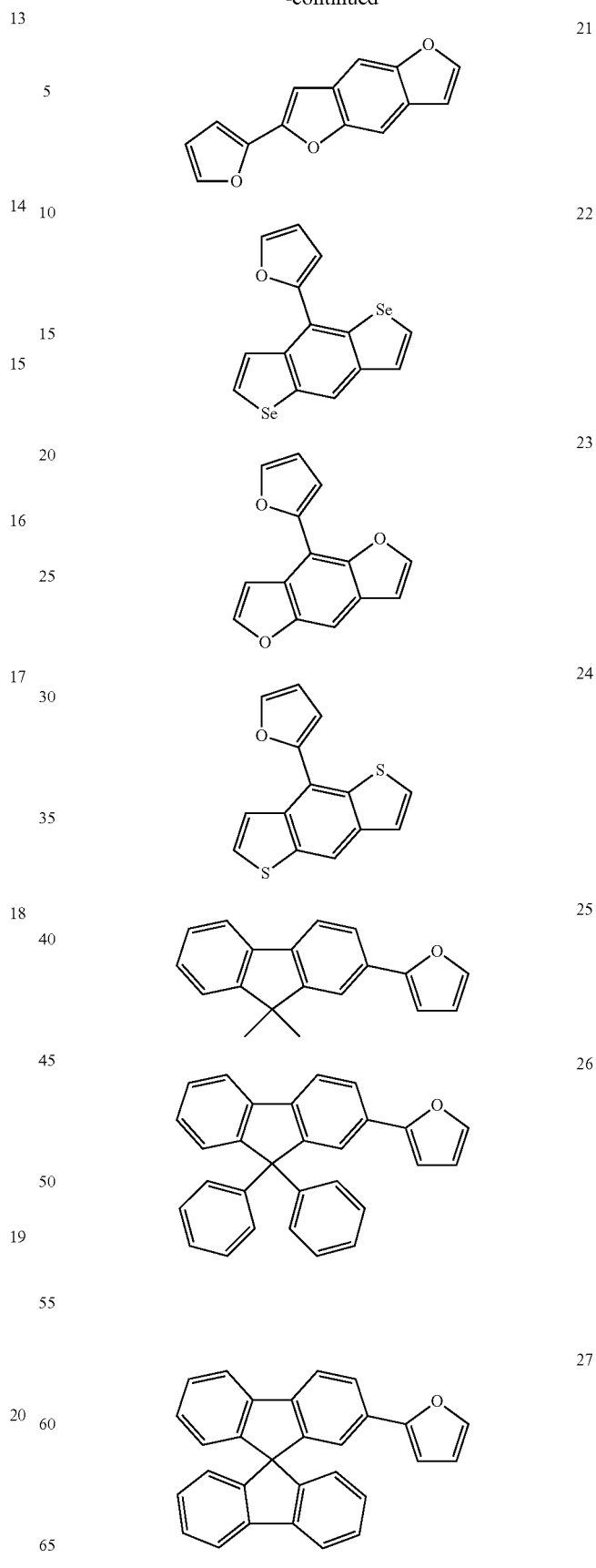

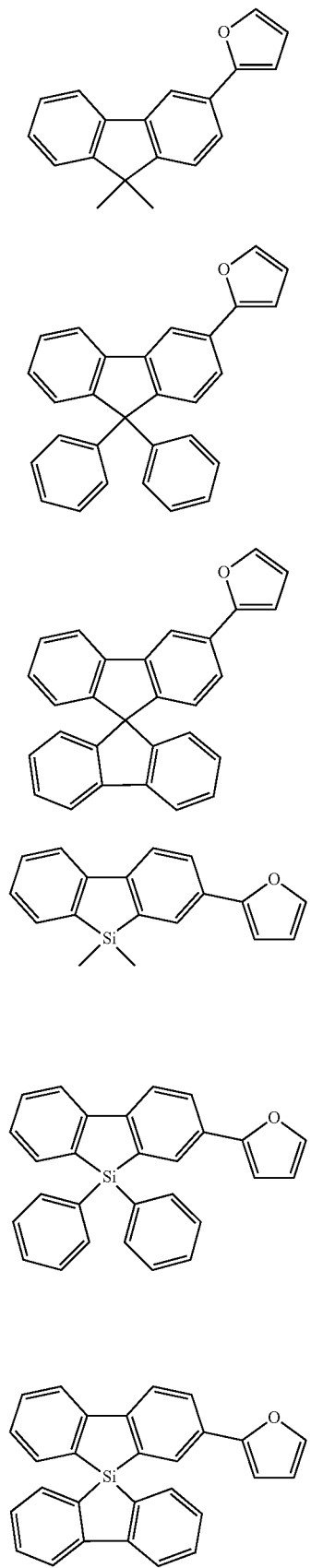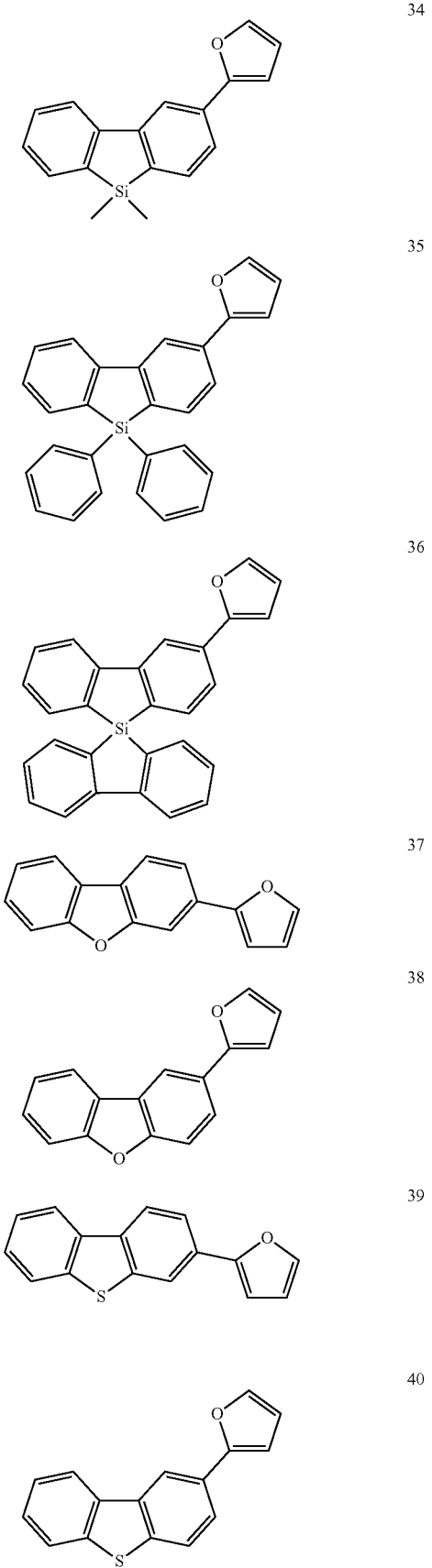

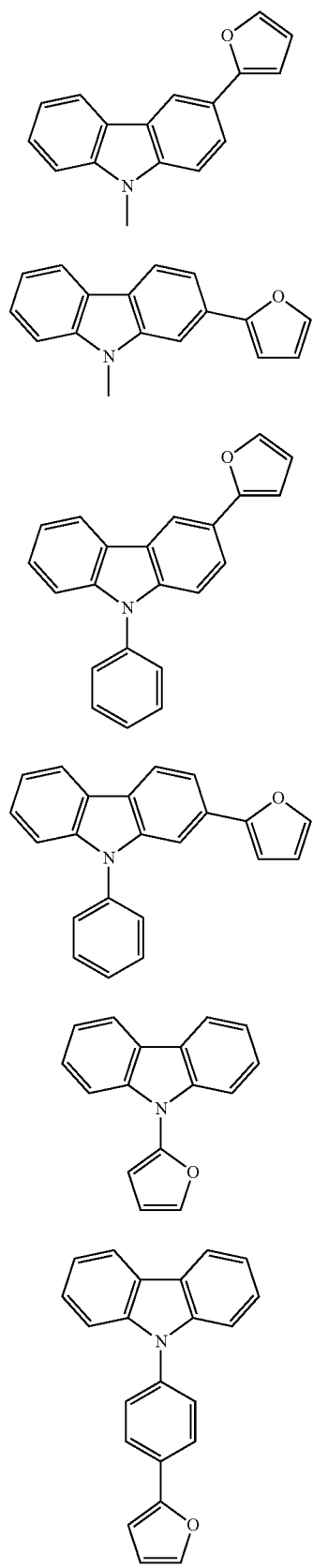
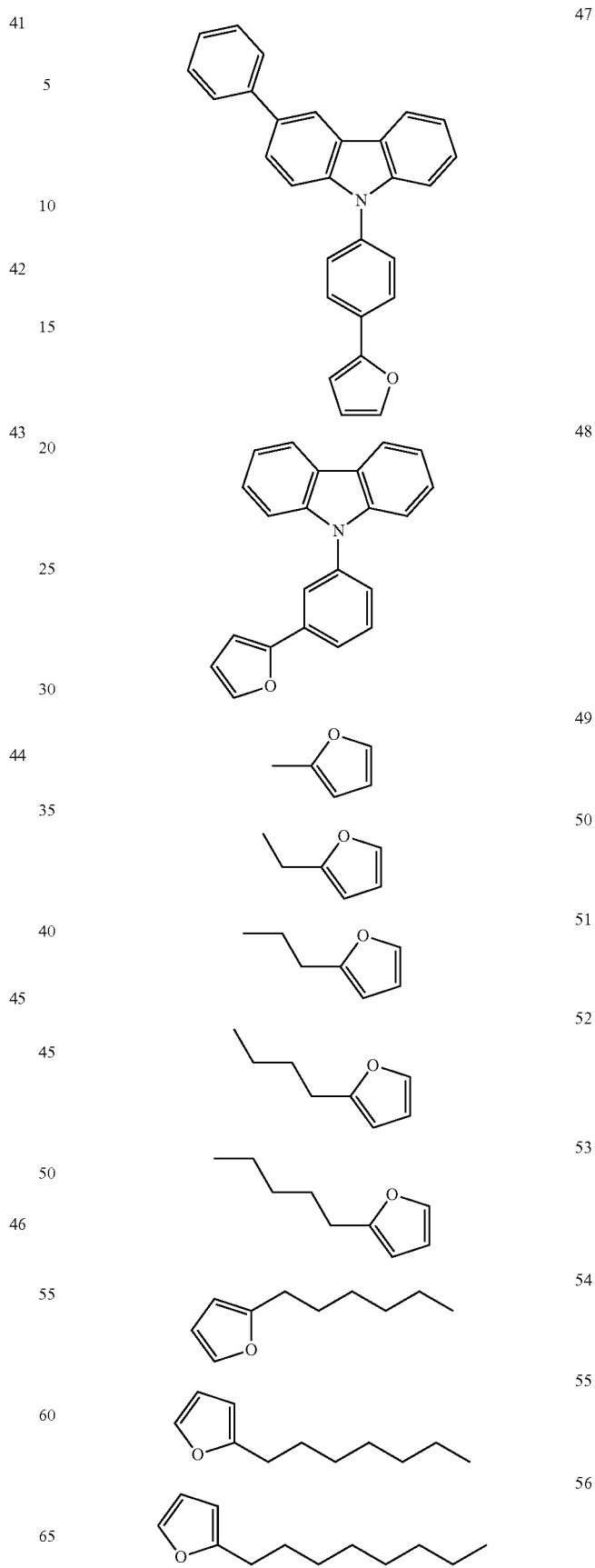

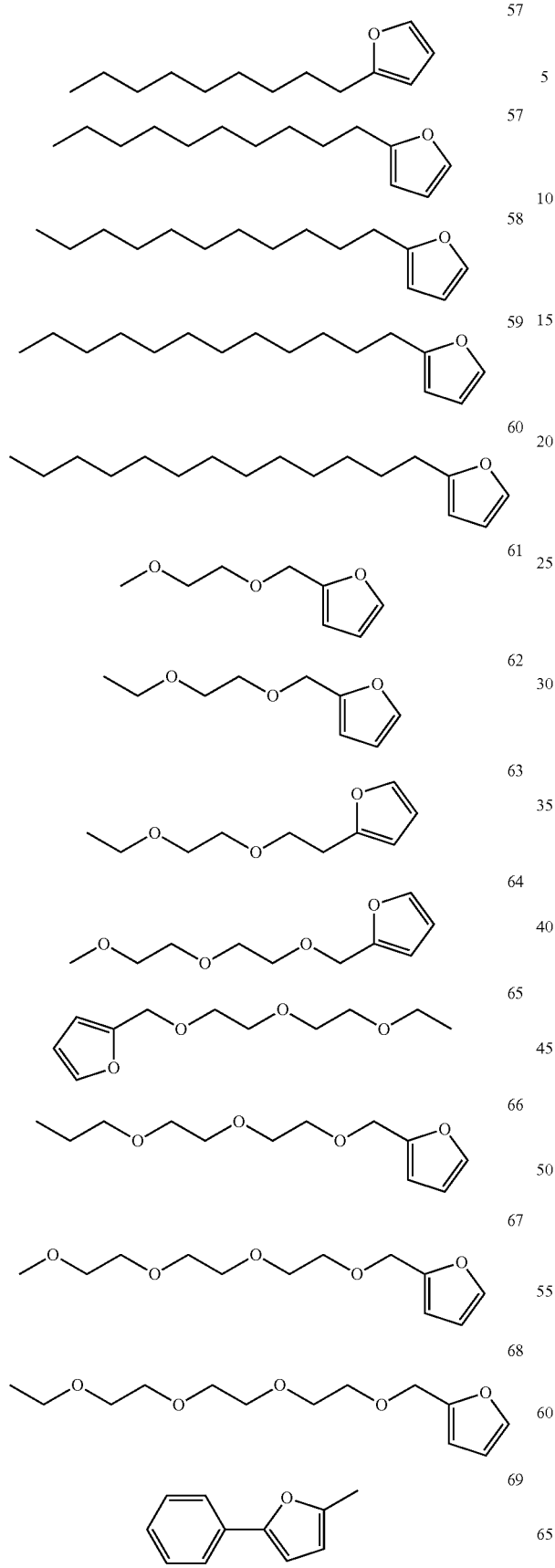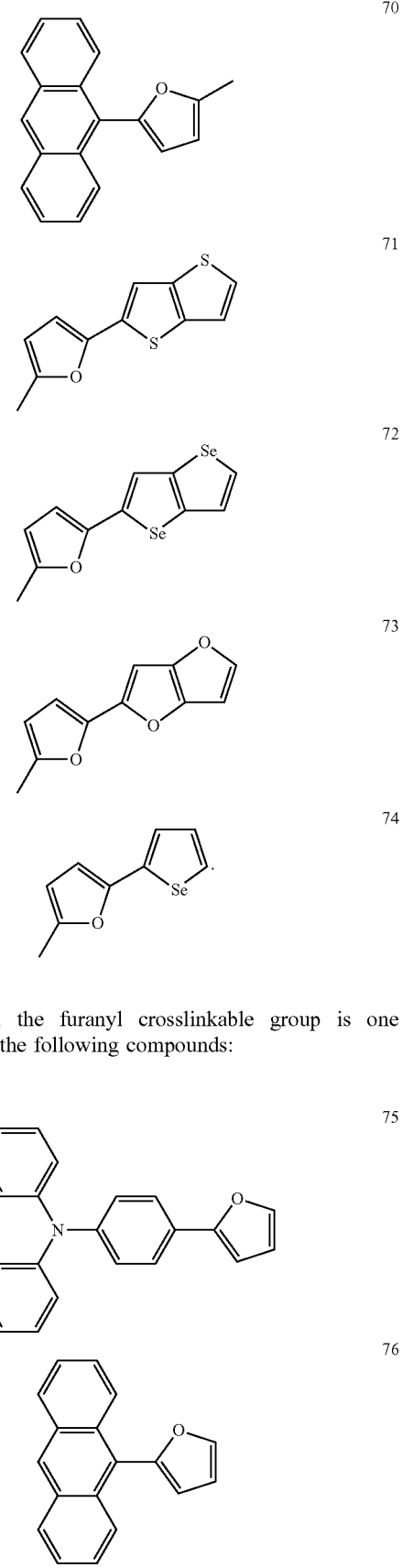
Specifically, the furanyl crosslinkable group is one selected from the following compounds:

77 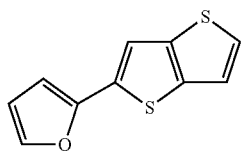
78 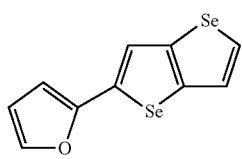
79 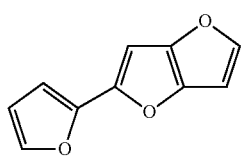
80 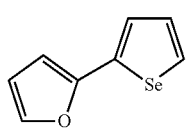
81 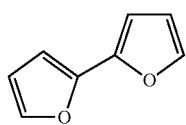
82 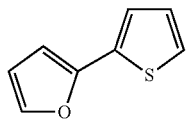
83 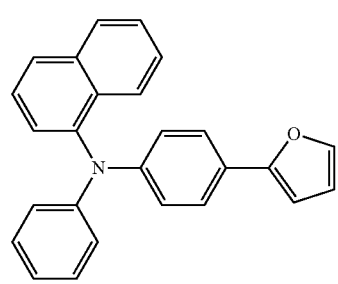
84 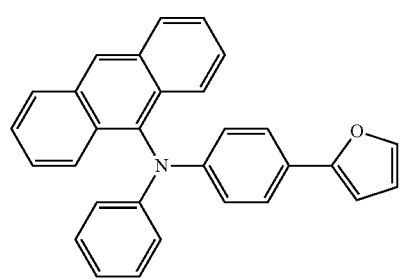
85 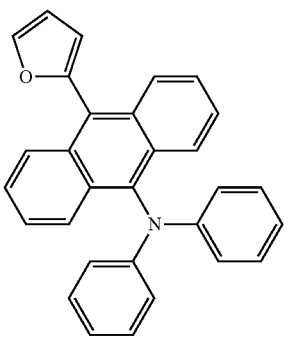
86 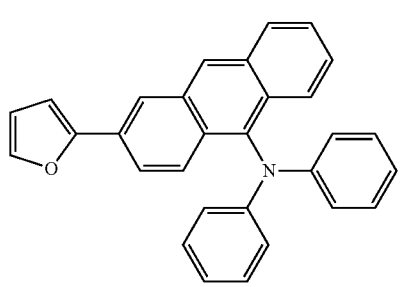
87 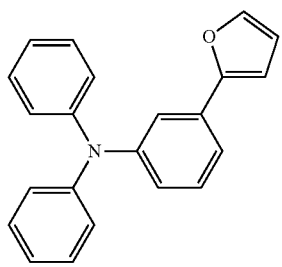
88 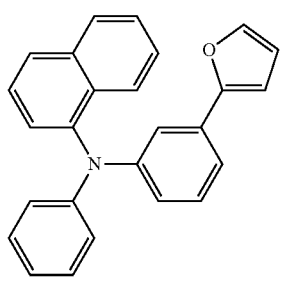
89 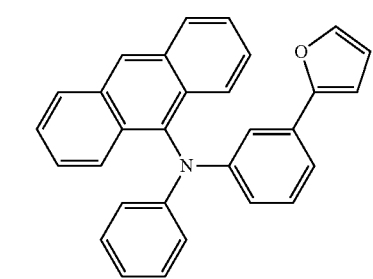

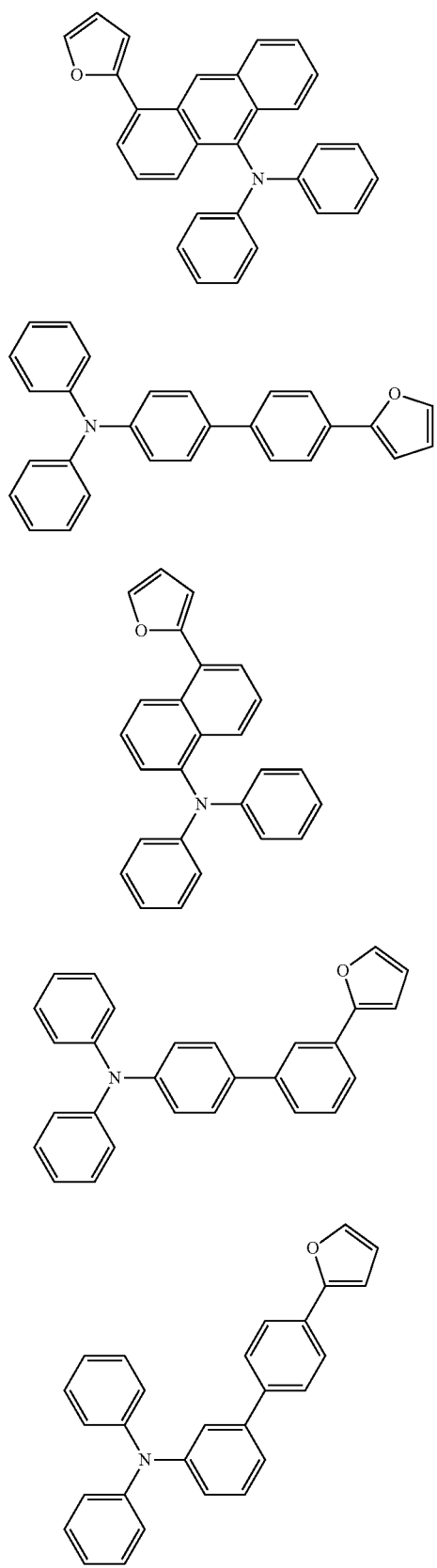
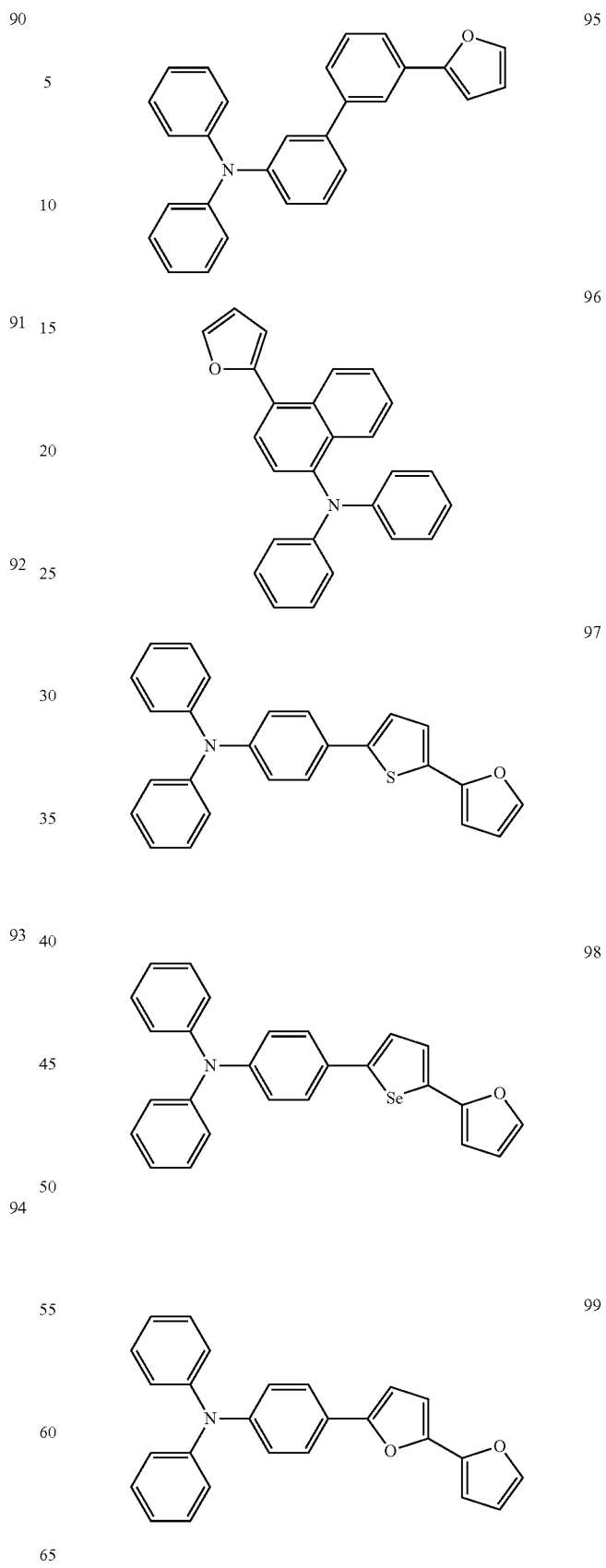

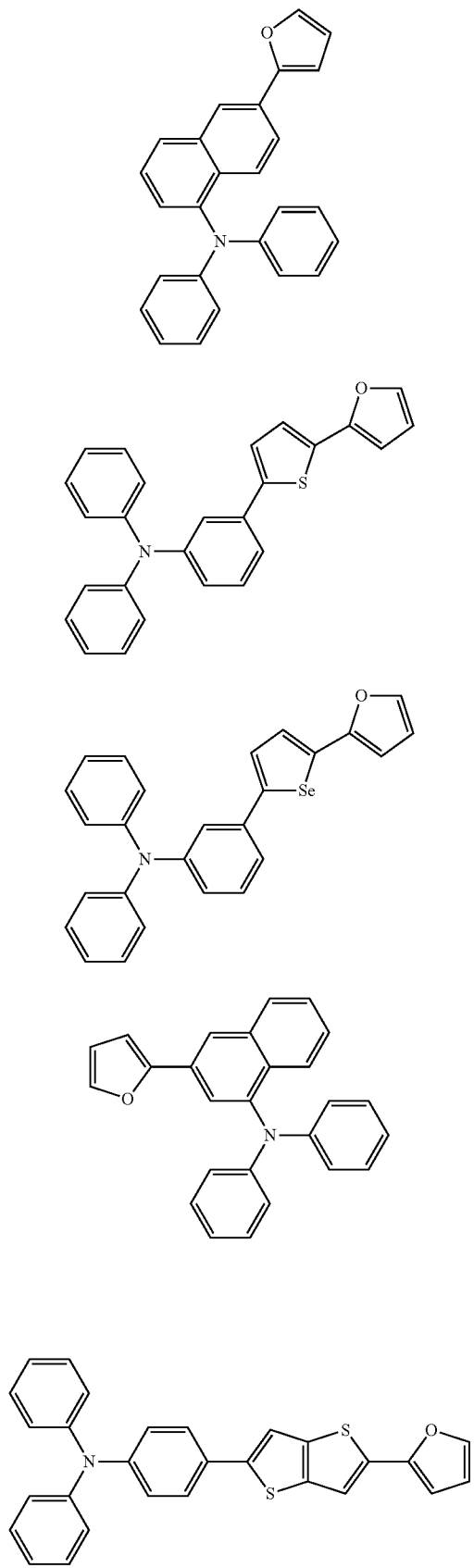
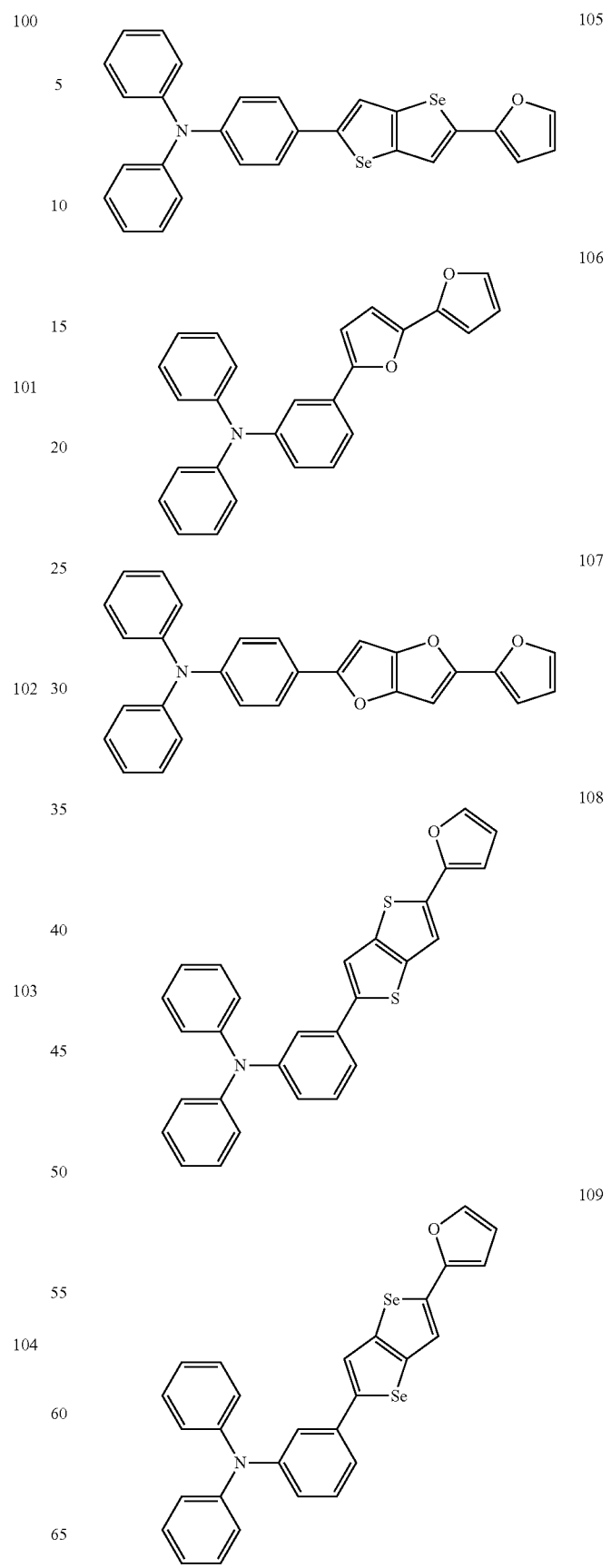

-continued
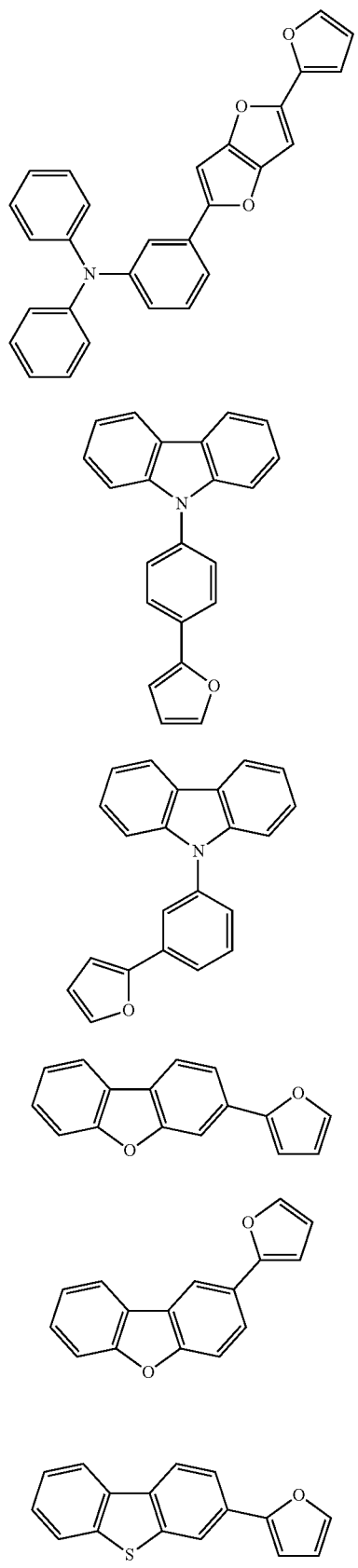
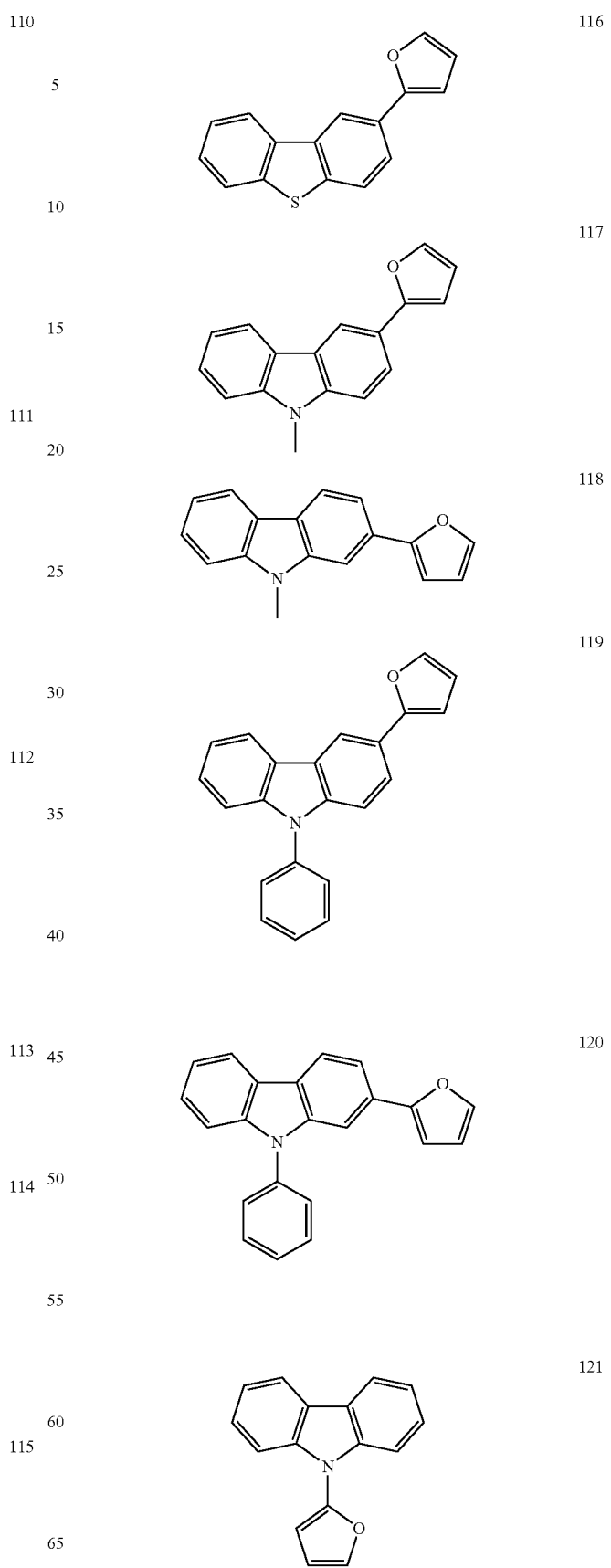

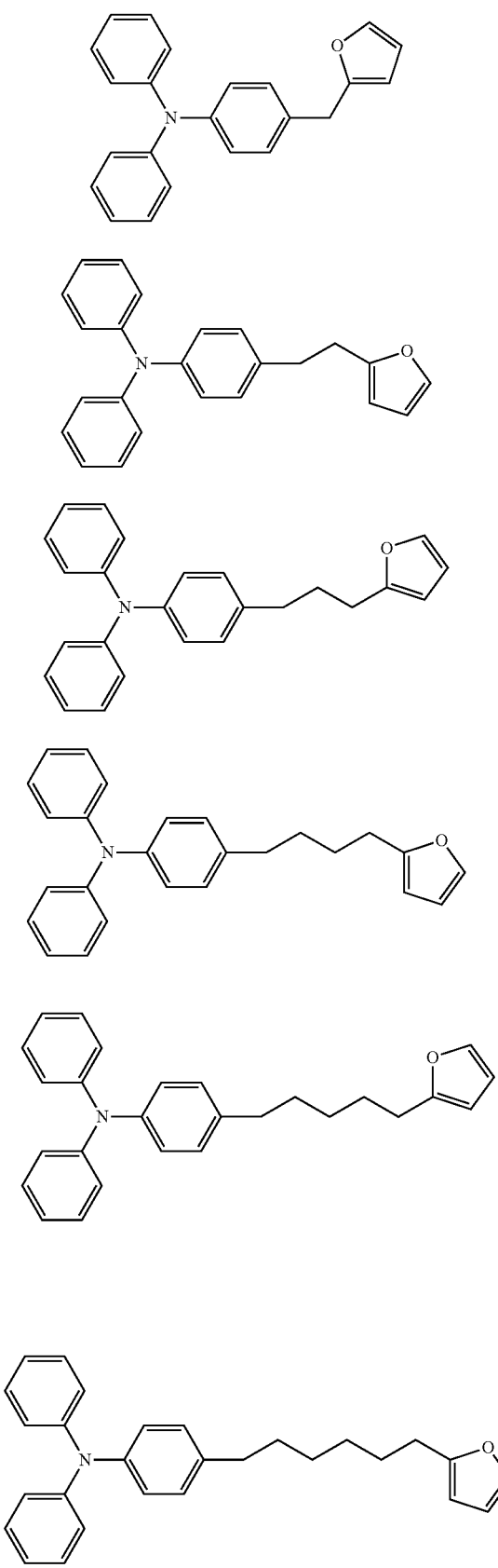

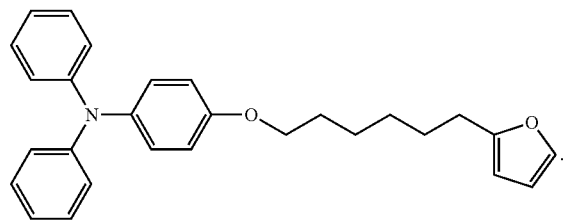

134

Further, the mole percentage of the furanyl crosslinkable group is y≤50%, and further, the mole percentage of the furanyl crosslinkable group is y≤40%, and further, the mole percentage of the furanyl crosslinkable group is y≤30%, and even further, the mole percentage of the furanyl crosslinkable group is y≤20%.

Further, in order to facilitate the understanding of the furanyl crosslinkable group-containing conjugated polymer according to the present embodiment, examples of which are listed below:

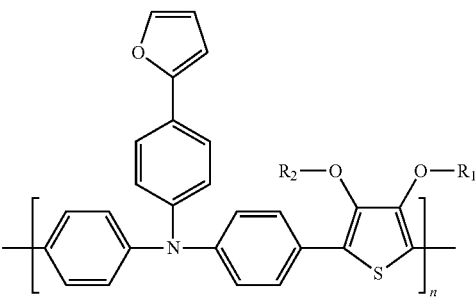

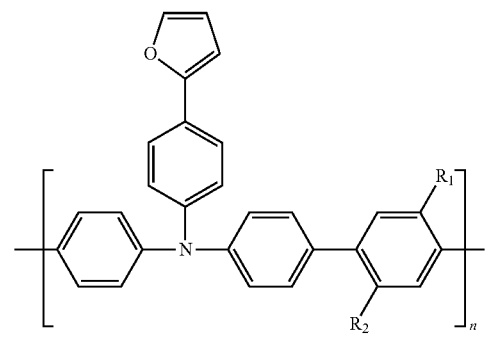

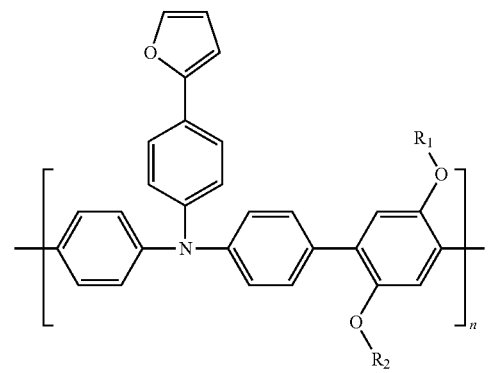

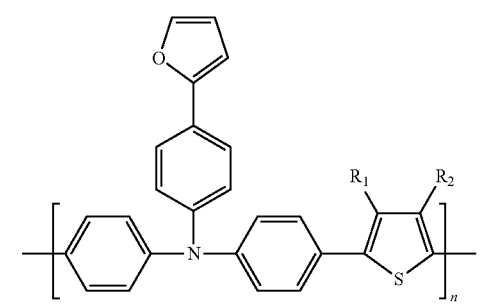

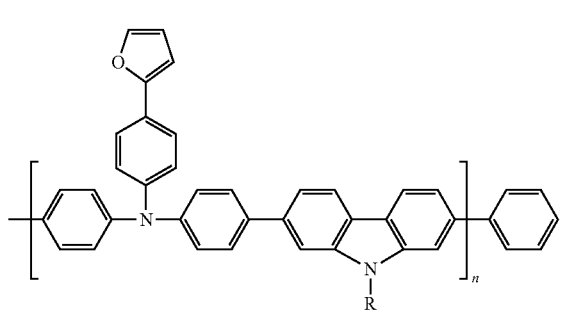

-continued
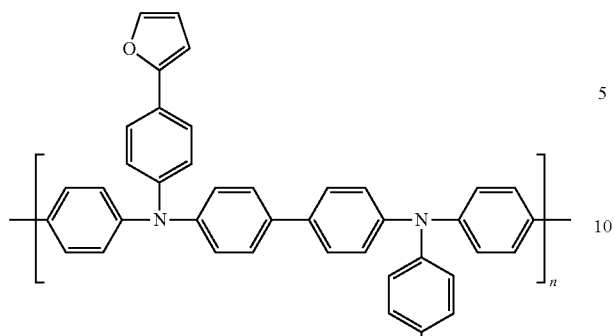
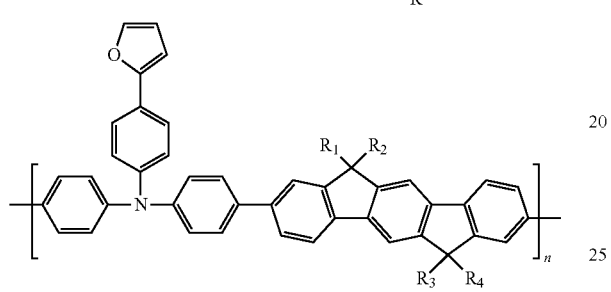
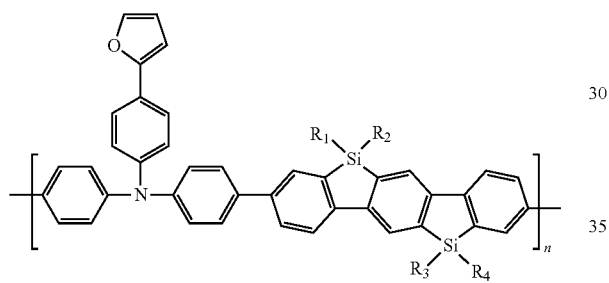
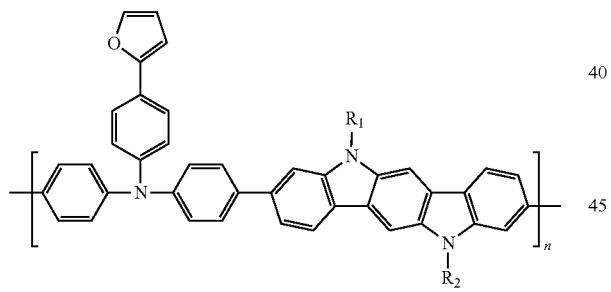
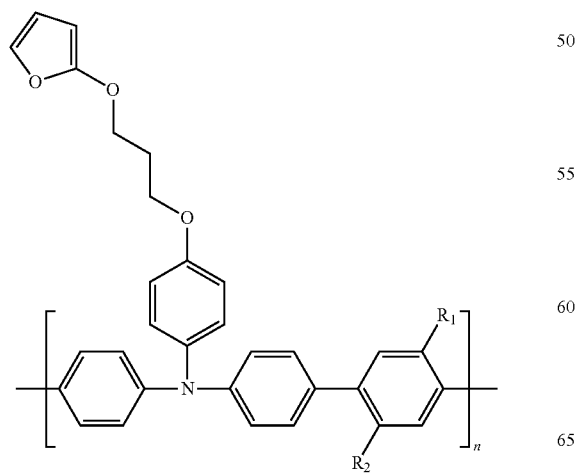
-continued
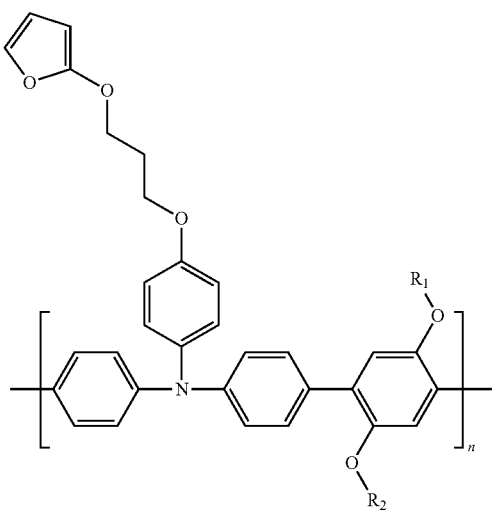
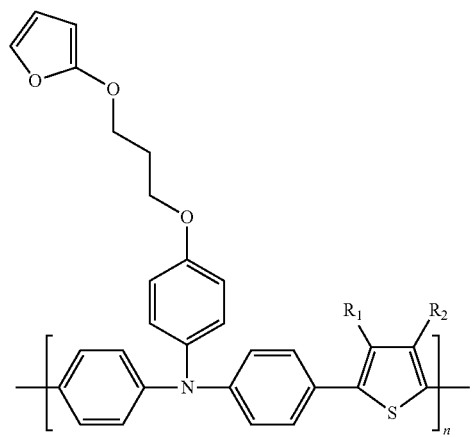
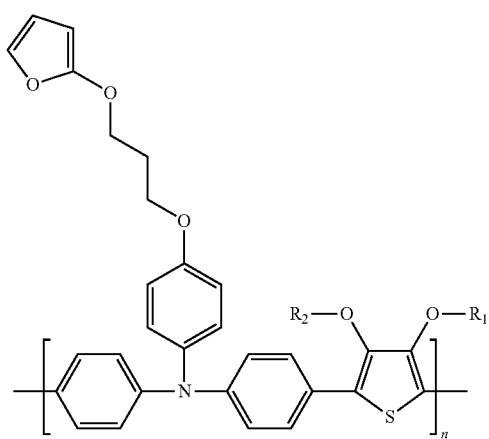

-continued
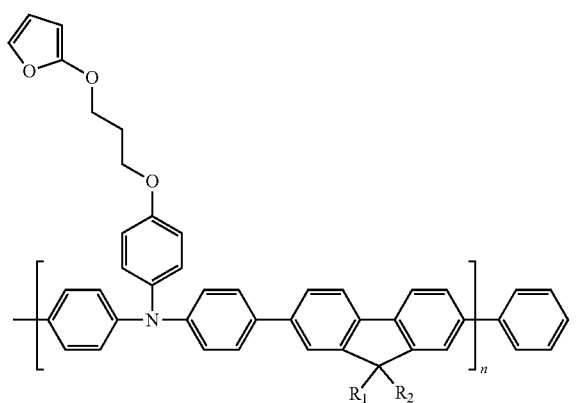
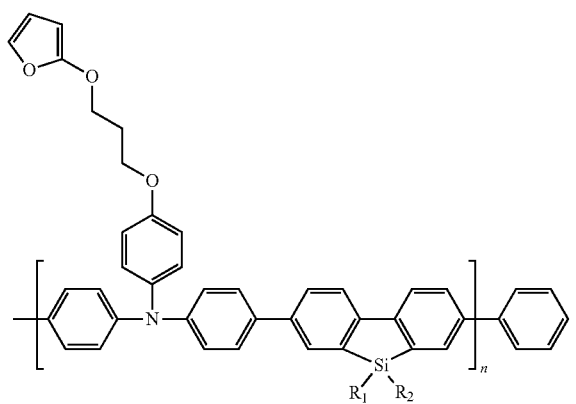
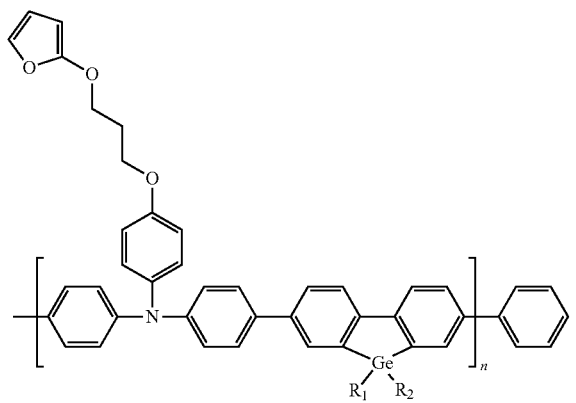
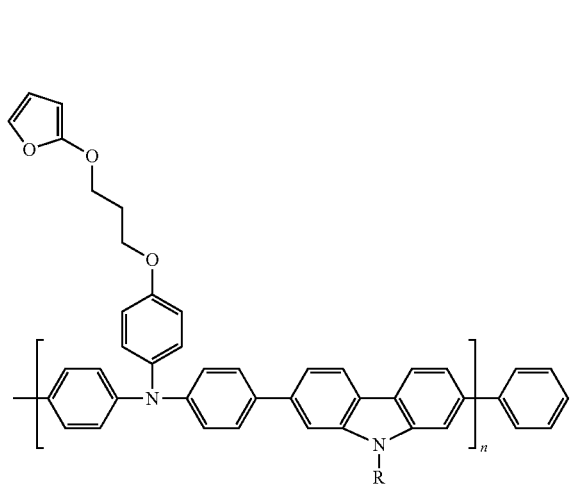
-continued
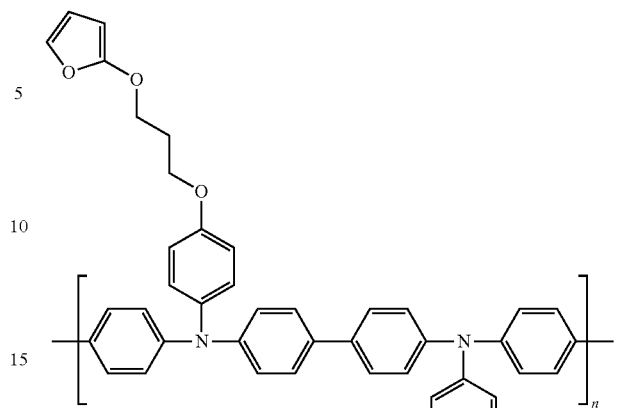
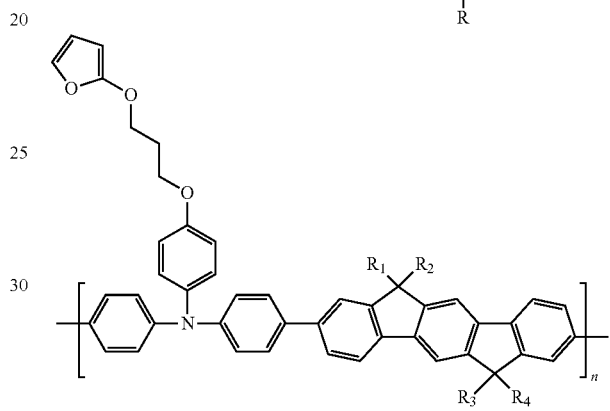
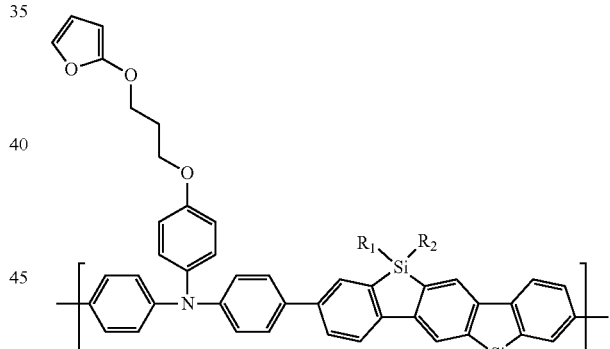
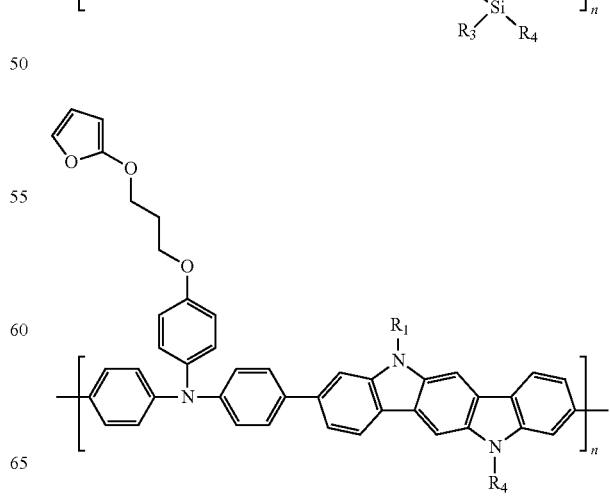

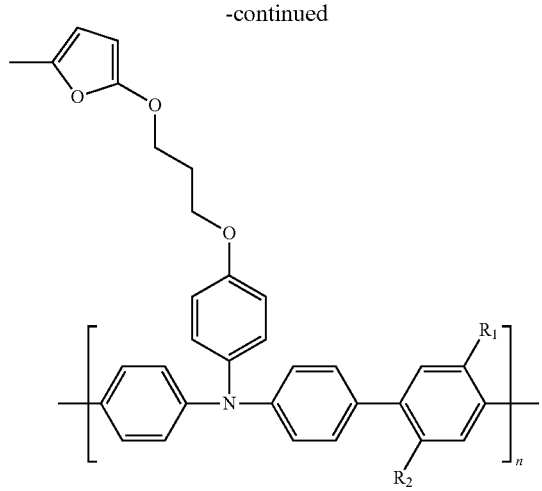
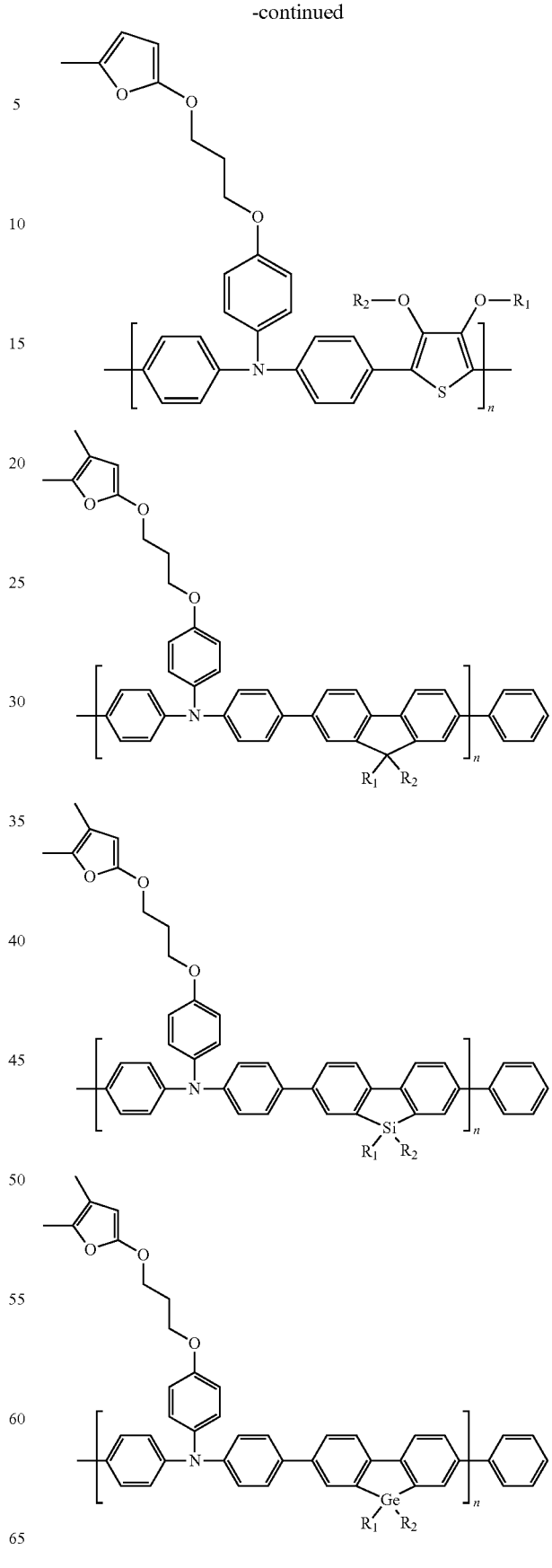

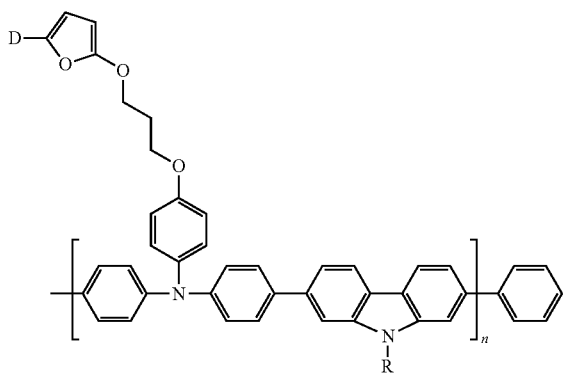

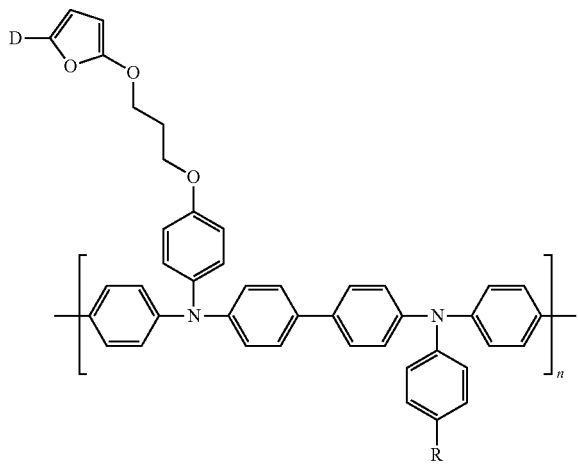

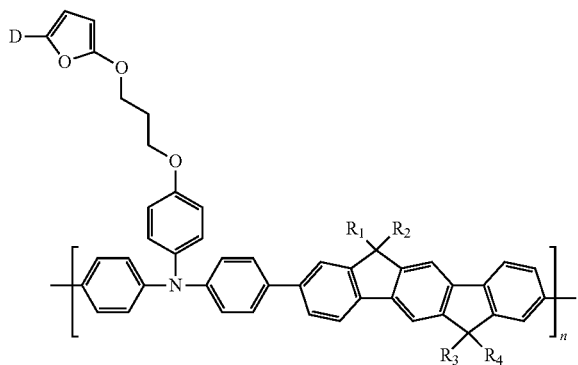

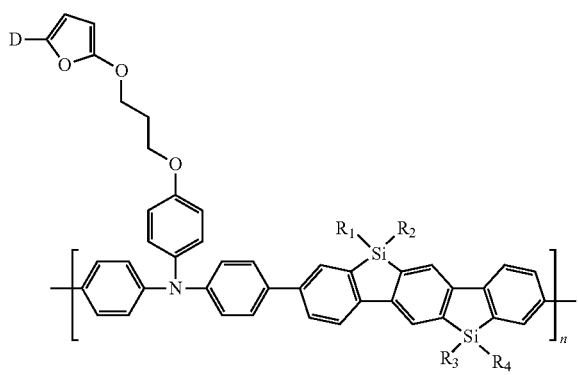

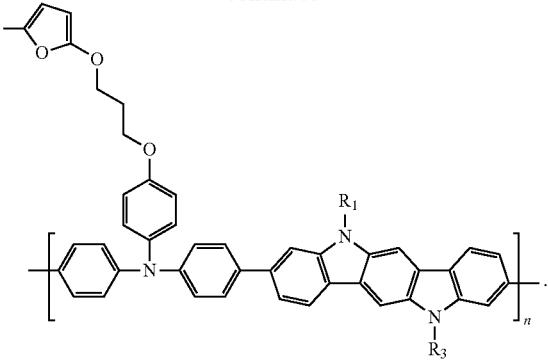

In the synthesis of the above-mentioned polymer containing a furanyl crosslinkable group, first, conjugated organic monomer containing functional group of a furanyl crosslinkable group is synthesized, and then, a polymer containing a furanyl crosslinkable group is synthesized by polymerisation.

The synthesis method differs depending on the structure and substituent of the polymer containing a furanyl crosslinkable group, and the structure of the polymer containing a furanyl crosslinkable group will be further described below.

Further, the polymerization reaction includes transition metal catalytic coupling (Suzuki Polymerization, Heck Polymerization, Sonogashira Polymerization, Still Polymerization), and Witting reaction.

It can be understood that the molecular weight and dispersion coefficient of the polymer can be controlled by controlling parameters such as reaction time, reaction temperature, monomer ratio, reaction pressure, solubility, amount of catalyst, ratio of ligand, phase transfer catalyst and the like.

Specifically, the synthetic route of the polymer containing a furanyl crosslinkable group is as follows:

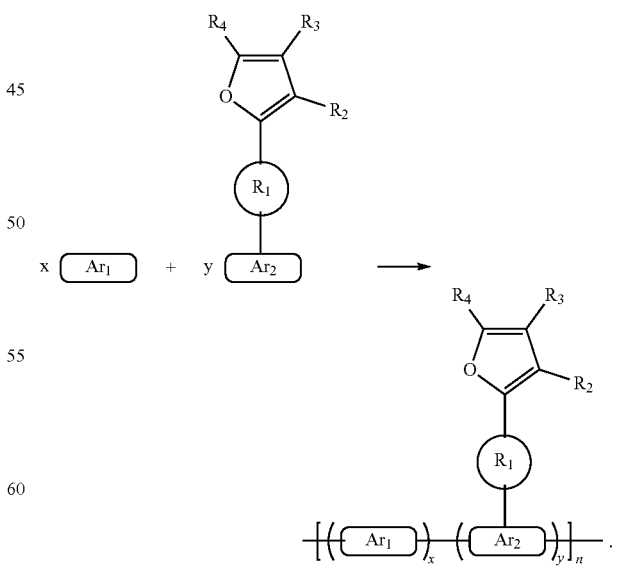

When synthesizing a furan group-containing multiple (ternary or more) functionalized conjugated polymer, the synthesis method is first synthesizing an organic conjugated monomer containing a furanyl crosslinkable group and then polymerizing a variety of (three or more kinds of) organic conjugated monomer containing a furanyl crosslinkable group to obtain the above-mentioned polymer containing a furanyl crosslinkable group. Of course, the molecular weight and dispersion coefficient of the polymer can be controlled by controlling parameters such as reaction time, reaction temperature, monomer ratio, reaction pressure, solubility, amount of catalyst, ratio of ligand, phase transfer catalyst and the like.

Specifically, the synthetic route of conjugated polymer containing multiple (ternary or more) furanyl group is as follows:

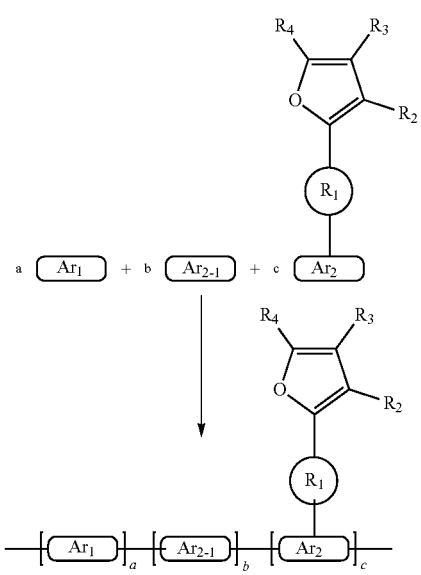

When $R_1$ is an aryl or heteroaryl ring, the synthetic route of the conjugated organic monomer containing furanyl crosslinkable group is as follows:

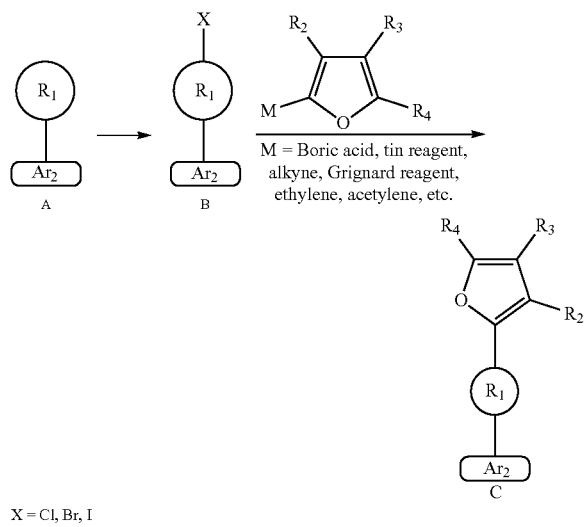

The starting material A (commercial chemical reagent) is subjected to an electrophilic substitution reaction (for example, a halogenation reaction such as chlorination, bromination, iodization, etc.) to obtain a compound B, which produces a cross-coupling reaction over a Pd—Cu co-catalyst to obtain a target compound. X in compound B is Cl, Br or I.

Further, the cross-coupling reaction includes CSuzuki, Stile, Grignard reaction, Heck, Sonogashira. The reagent in the cross-coupling reaction further includes M, M is one selected from the group consisting of furan boronic acid, furan tin reagent, Grignard reagent, furylethenyl group, furan ethylene, and derivatives thereof.

When $R_1$ is an alkyl group or an alkoxy group, the synthetic route of the conjugated organic monomer containing furanyl crosslinkable group is as follows:

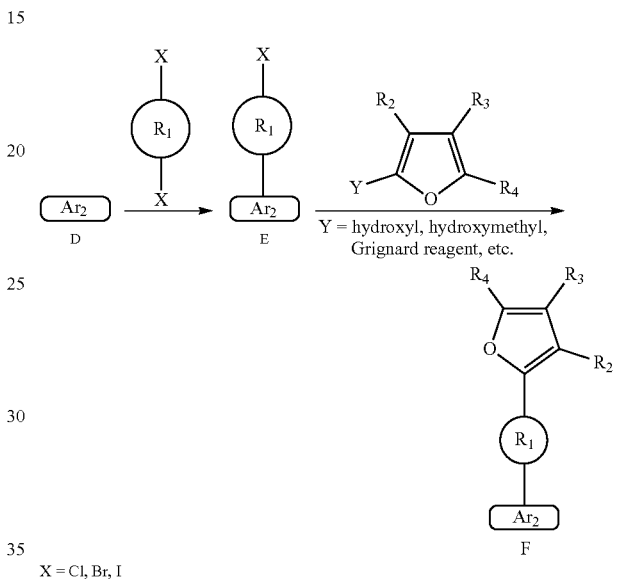

The starting material D (commercial chemical reagent or chemically synthesized) is obtained by a nucleophilic substitution reaction (such as williamson aethrization reaction) to obtain compound E, which is subjected to a williamson ether reaction or a Grignard reaction with the furan derivative to obtain the target compound F. Y in the furan derivative is a hydroxyl group, a methylol group or a group formed by Grignard reagent. X in the compound E is Cl, Br or I.

And, the synthetic route of the conjugated organic monomer containing furanyl crosslinkable group is not limited to the above route.

A mixture comprises the above polymer containing a furanyl crosslinkable group, and at least another organic functional material. The organic functional materials include: a hole (also known as electronic hole) injection or transport material (HIM/HTM), a hole blocking material (HBM), an electron injection or transport material (EIM/ETM), an electron blocking material (EBM), an organic matrix material (Host), a singlet emitter (a fluorescent emitter), and a triplet emitter(a phosphorescent emitters), particularly a light-emitting organometallic complex.

Further, various organic functional materials are described in detail in WO2010135519A1, US20090134784A1 and WO2011110277A1. It can be understood that the organic functional material may be a small molecular material or a polymer material.

The mixture also includes a fluorescent emitter (or singlet emitter). Wherein, the above-mentioned polymer containing a furanyl crosslinkable group is used as a host, and the weight percentage of the fluorescent emitter in the mixture is ≤15 wt/%. Further, the weight percentage of the fluorescent emitter in the mixture is ≤12 wt %, and further, the weight percentage of the fluorescent emitter in the mixture is ≤9 wt %. Further, the weight percentage of the fluorescent emitter in the mixture is ≤8 wt %, and further, the weight percentage of the fluorescent emitter in the mixture is ≤7 wt %.

The singlet emitter has a longer conjugated π-electron system, for example, styrylamine and derivatives thereof disclosed in JP 2913116 B and WO 2001021729 A1, indenofluorene and derivatives thereof disclosed in WO 2008/006449 and WO 2007/140847.

Further, the singlet emitter is one selected from the group consisting of monostyrylamine, -di-styrylamine, tri-styrylamine, tetra-styrylamine, styryl phosphine, styryl ether and arylamine.

The monostyrylamine is a compound comprising one styryl group and at least one amine group. Further, the monostyrylamine is an aromatic amine.

The di-styrylamine is a compound comprising two styryl groups and at least one amine group. Further, the di-styrylamine is an aromatic amine.

The tri-styrylamine is a compound comprising three styryl groups and at least one amine group. Further, the tri-styrylamine is an aromatic amine.

The tetra-styrylamine is a compound comprising four styryl groups and at least one amine group. Further, the tetra-styrylamine is an aromatic amine.

Further, the styrene is stilbene.

An aryl amine or aromatic amine refers to a compound which comprises three aromatic ring or heterocyclic ring systems directly attached to nitrogen. Further, these aromatic ring or a heterocyclic ring systems comprise a fused ring, further, the aromatic amine comprises at least 14 carbon atoms.

Further, the aromatic amine is selected from the group consisting of aromatic anthramine, aromatic anthradiamine, aromatic pyrenamine, aromatic pyrenediamine, aromatic chrysenamine and aromatic chrysenediamine.

The aromatic anthramine is a compound in which a diarylamino group is directly coupled to anthracene.

Further, the diarylamino group is directly coupled to anthracene at position 9.

The aromatic anthradiamine is a compound in which two diarylamino groups is directly coupled to anthracene.

Further, the diarylamino groups are directly coupled to anthracene at positions 9 and 10.

The aromatic pyrenamine, aromatic pyrenediamine, aromatic chrysenamine and aromatic chrysenediamine are similarly defined to the aromatic anthramine.

Further, the diarylamino group is directly coupled to pyrene at position 1, or the diarylamino groups are directly coupled to pyrene at positions 1 and 6.

The singlet emitters based on vinylamine and aromatic amine are identical to singlet emitters in the following patent documents: WO 2006/000388, WO 2006/058737, WO 2006/000389, WO 2007/065549, WO 2007/115610, U.S. Pat. No. 7,250,532 B2, DE 102005058557 A1, CN 1583691 A, JP 08053397 A, U.S. Pat. No. 6,251,531 B1, US 2006/210830 A, EP 1957606 A1 and US 2008/0113101 A1.

A patent for singlet emitters based on stilbene and derivatives thereof is U.S. Pat. No. 5,121,029.

Further, the singlet emitter may be indenofluorene-amine, indenofluorene-diamine, benzoindenofluorene-amine, benzoindenofluorene-diamine, dibenzoindenofluorene-amine or dibenzoindenofluorenone-diamine.

Further, the singlet emitter is a polycyclic aromatic hydrocarbon compound.

Further, the singlet emitter is one selected from derivatives of anthracene, naphthalene, tetracene, xanthene, phenanthrene, pyrene, indenopyrene, phenylene, periflanthene, decacyclene, coronene, fluorene, spirobifluorene, arylpyrene, arylenevinylene, cyclopentadiene, rubrene, coumarine, rhodamine, quinacridone, pyrane, thiapyran, bis(azinyl)imine-boron, bis(azinyl)methene, carbostyryl, oxazone, benzoxazole, benzothiazole, benzimidazole and diketopyrrolopyrrole.

Further, the singlet emitter is one selected from derivatives of anthracene, naphthalene, tetracene, xanthene, phenanthrene, pyrene, indenopyrene, phenylene, periflanthene, decacyclene, coronene, fluorene, spirobifluorene, arlpyrene, arylenevinylene, cyclopentadiene, rubrene, coumarine, rhodamine, quinacridone, pyrane, thiapyran, bis(azinyl)imine-boron compound, bis(azinyl)methane compound, carbostyryl compound, oxazone, benzoxazole, benzothiazole, benzimidazole and diketopyrrolopyrrole.

Still further, singlet emitter is one selected from derivatives of 9,10-di(2-naphthanthracene), 2,5,8,11-tetra-t-butylperylene, 4,4'-bis(9-ethyl-3-carbazovinylene)-1,1'-biphenyl and 4-(dicyanomethylene)-6-(4-dimethylaminostyryl-2-methyl)-4H-pyrane (DCM).

Further, the singlet emitter is selected from at least one of the following patent documents: US20070252517 A1, U.S. Pat. Nos. 4,769,292, 6,020,078, US2007/0252517 A1 and US2007/0252517 A1.

Specifically, the singlet emitter is one of the following structures:

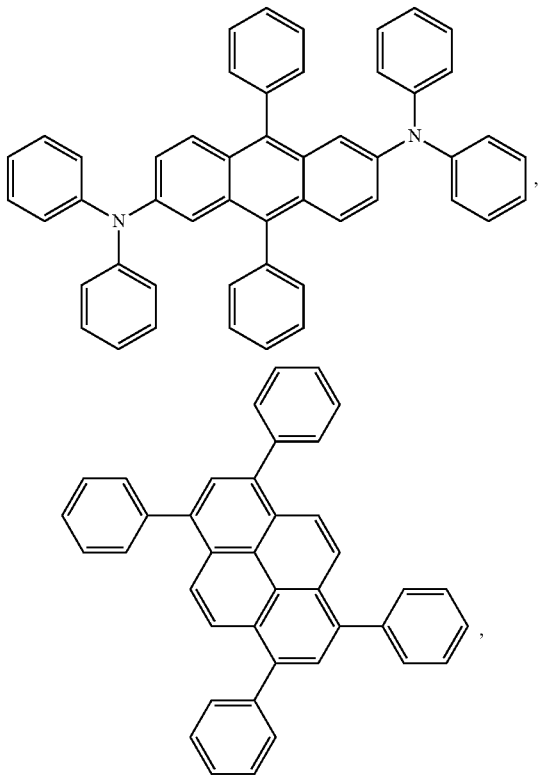

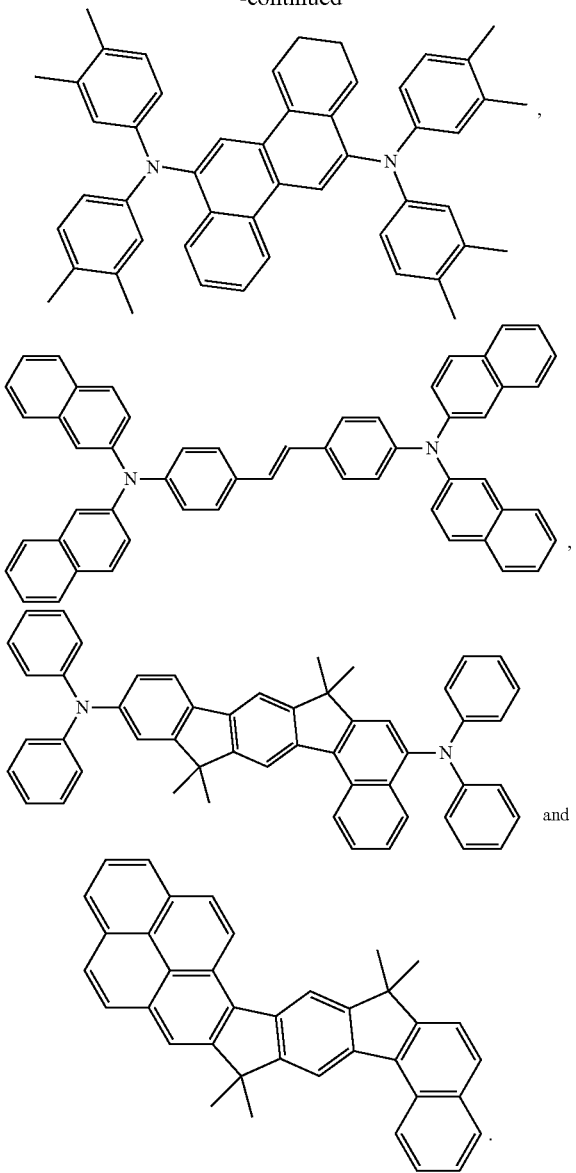
and

Further, the mixture includes the above-described polymer containing a furanyl crosslinkable group and thermally activated delayed fluorescent (TADF) material.

A traditional organic fluorescent material can only emit light using 25% singlet exciton formed by electric excitation, and the device has a low internal quantum efficiency (up to 25%). Since the intersystem crossing is enhanced due to the strong spin-orbit coupling of the heavy atom center, the phosphorescent material can emit light using the singlet exciton and triplet exciton formed by the electric excitation effectively, to achieve 100% internal quantum efficiency of the device. However, the application of phosphorescent material in organic light emitting diodes (OLEDs) is limited by the problems such as high cost, poor material stability and serious roll-off of the device efficiency, etc. Thermally activated delayed fluorescent materials are the third generation of organic luminescent materials developed after organic fluorescent materials and organic phosphorescent materials. This type of material generally has a small singlet-triplet excited state energy level difference (ΔEst), and triplet exciton can emit light through converted to singlet excitons by intersystem crossing. This can fully use singlet exciton and triplet exciton formed under electric excitation. The device can achieve 100% internal quantum efficiency. At the same time, the material is controllable in structure, stable in property, low cost, unnecessary to use precious metals, and have a promising application prospect in the OLED field.

The TADF materials need to have a smaller singlet-triplet excited state energy level difference, further, ΔEst<0.3 eV, still further, ΔEst<0.2 eV, and even further, ΔEst<0.1 eV.

Further, the TADF material is the same as those in the following patent documents: CN103483332(A), TW201309696(A), TW201309778(A), TW201343874(A), TW201350558(A), US20120217869(A1), WO2013133359(A1), WO2013154064(A1), Adachi, et.al. Adv. Mater., 21, 2009, 4802, Adachi, et.al. Appl. Phys. Lett., 98, 2011, 083302, Adachi, et.al. Appl. Phys. Lett., 101, 2012, 093306, Adachi, et.al. Chem. Commun., 48, 2012, 11392, Adachi, et.al. Nature Photonics, 6, 2012, 253, Adachi, et.al. Nature, 492, 2012, 234, Adachi, et.al. J. Am. Chem. Soc, 134, 2012, 14706, Adachi, et.al. Angew. Chem. Int. Ed, 51, 2012, 11311, Adachi, et.al. Chem. Commun., 48, 2012, 9580, Adachi, et.al. Chem. Commun., 48, 2013, 10385, Adachi, et.al. Adv. Mater., 25, 2013, 3319, Adachi, et.al. Adv. Mater., 25, 2013, 3707, Adachi, et.al. Chem. Mater., 25, 2013, 3038, Adachi, et.al. Chem. Mater., 25, 2013, 3766, Adachi, et.al. J. Mater. Chem. C., 1, 2013, 4599 或 Adachi, et.al. J. Phys. Chem. A., 117, 2013, 5607.

Specifically, the TADF material is one of the following compounds:

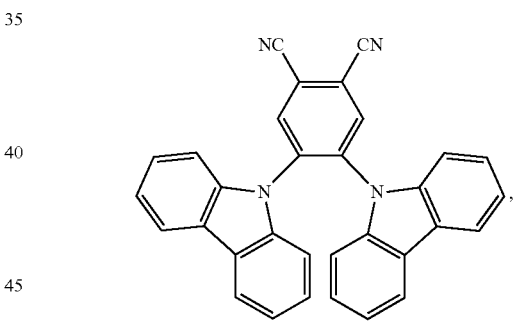

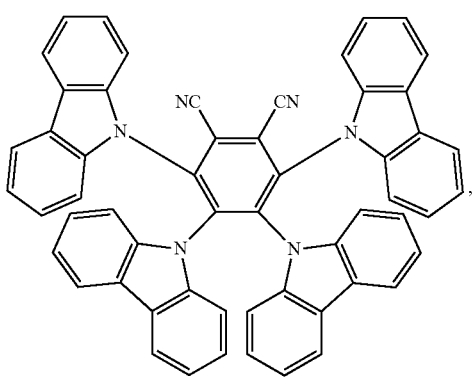

63
-continued
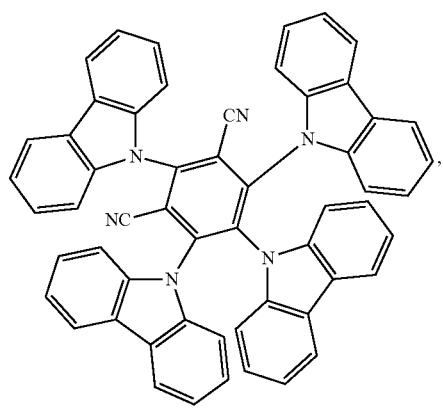
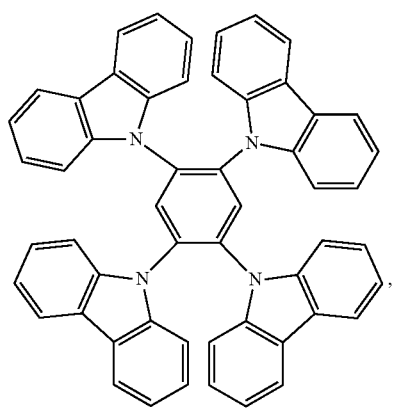
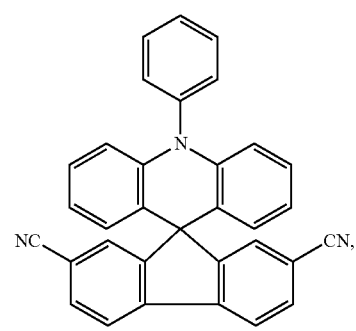
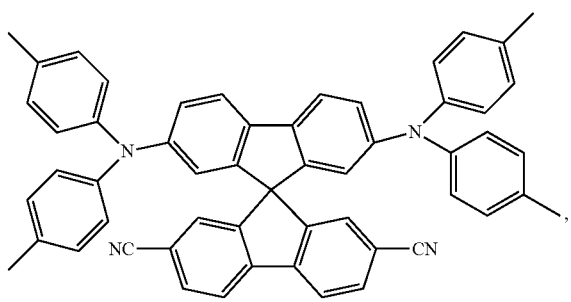
64
-continued
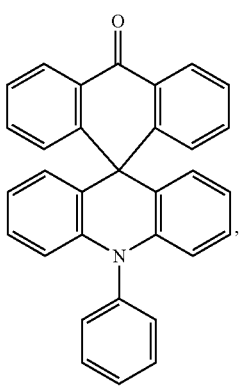
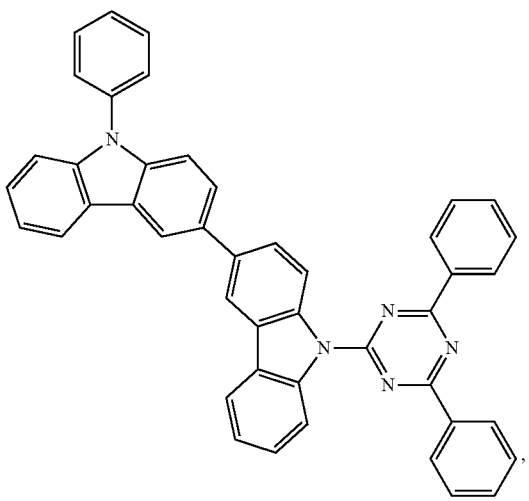
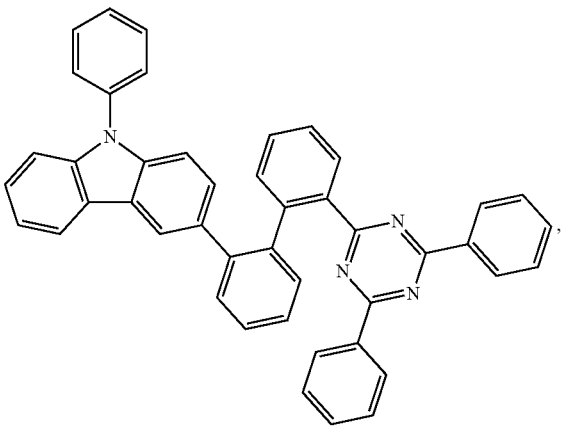

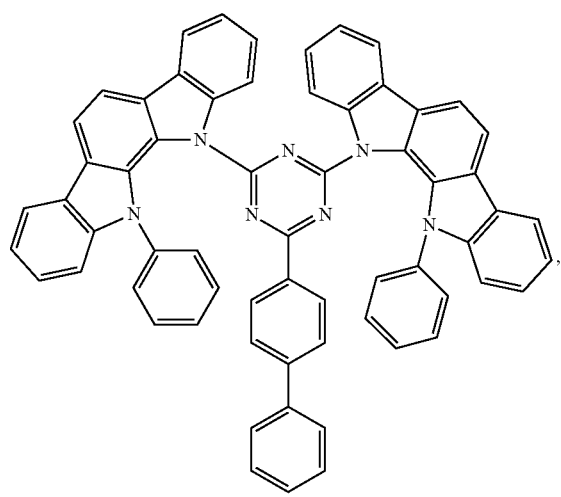,
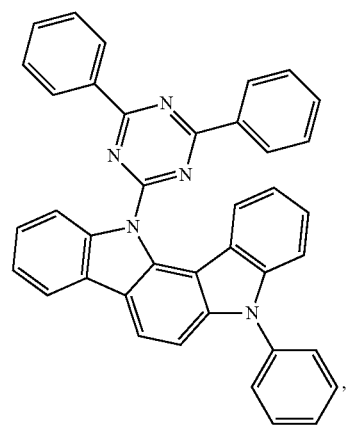,
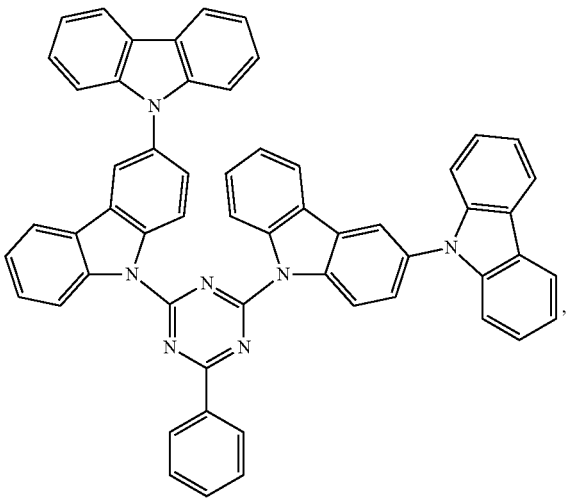,
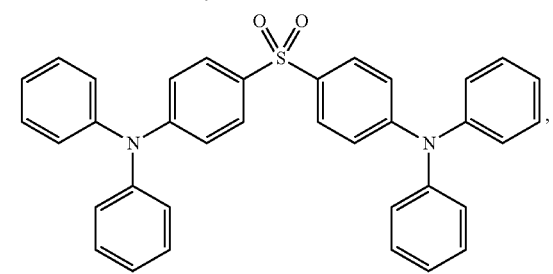,
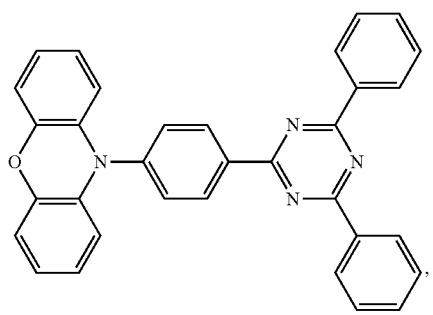,
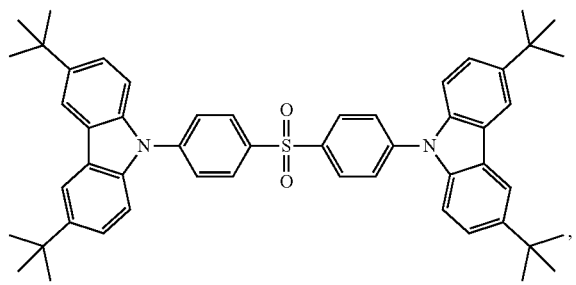,
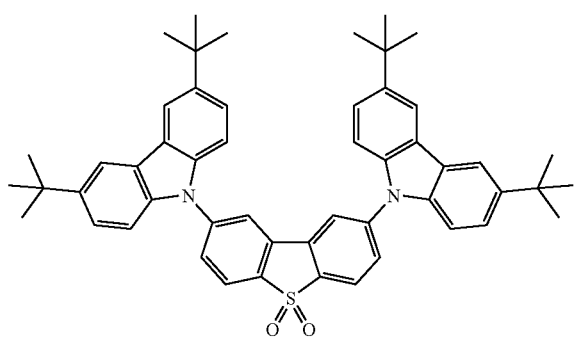,
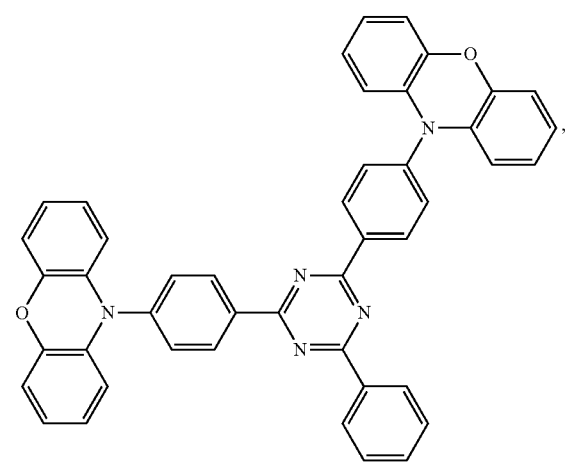,
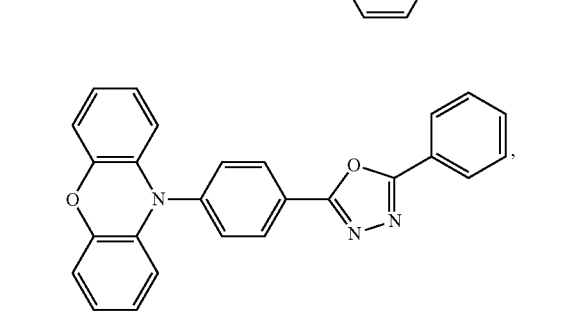,

67
-continued
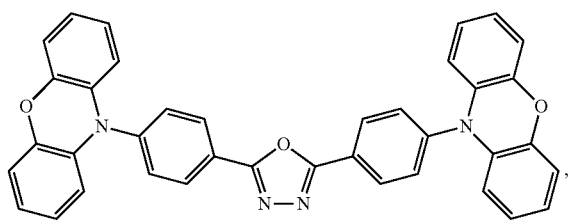
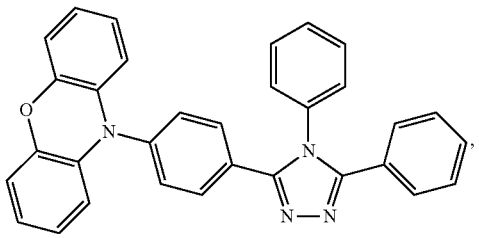
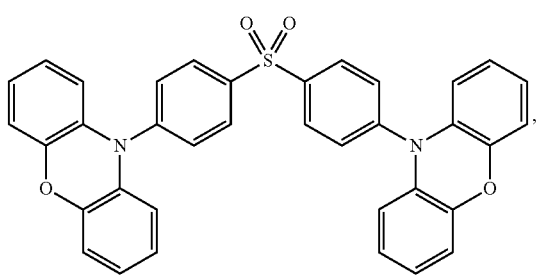
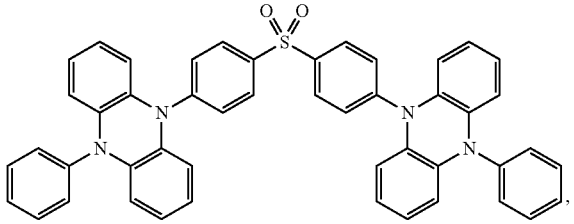
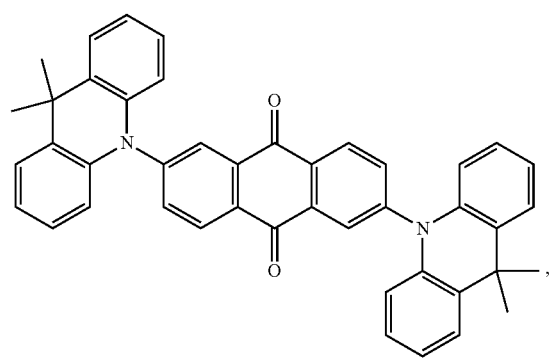
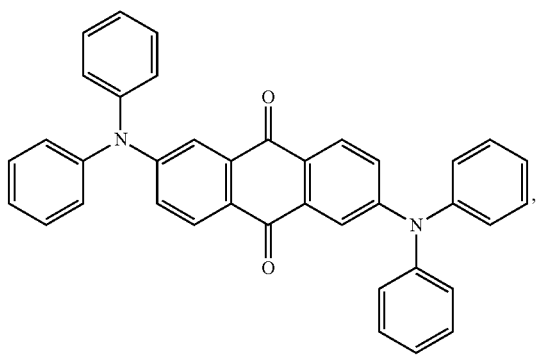
68
-continued
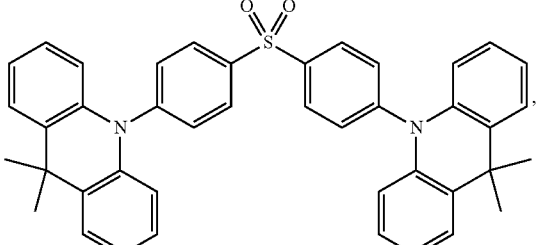
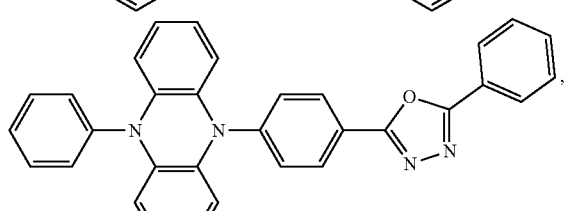
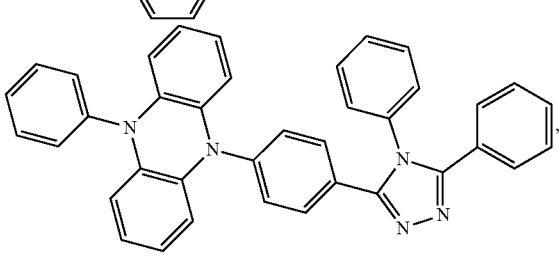
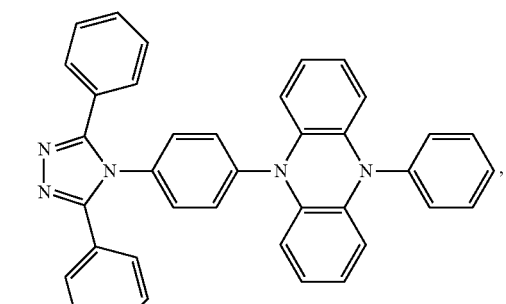
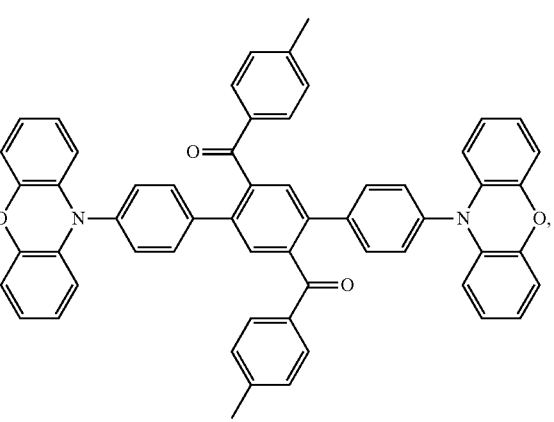

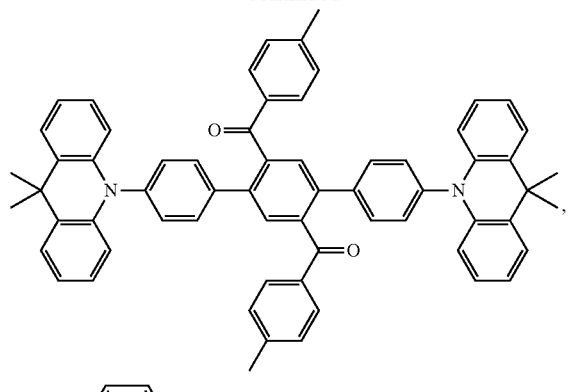
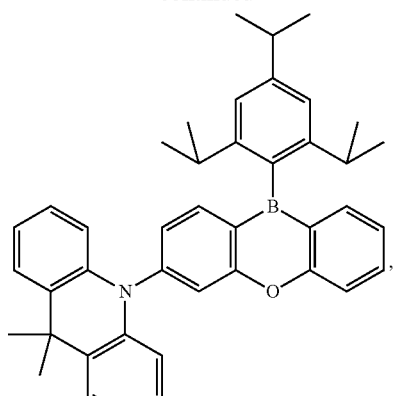
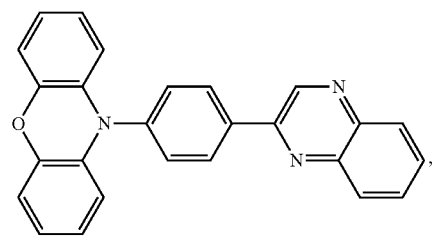
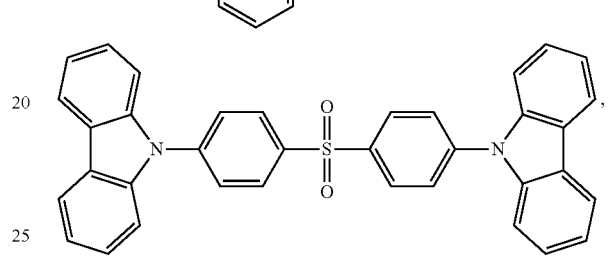
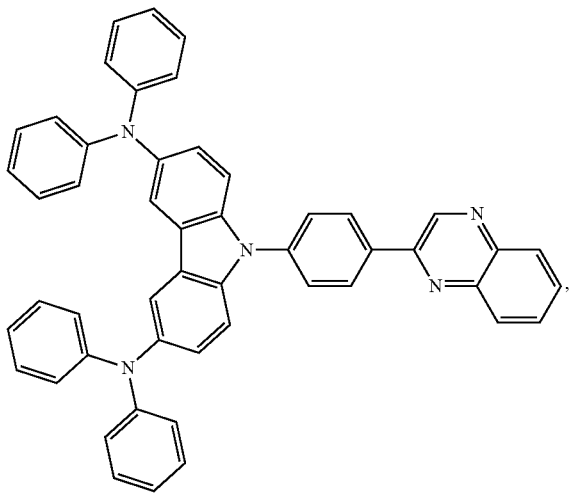
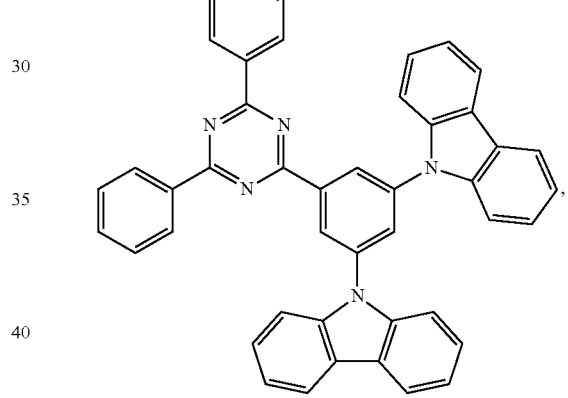
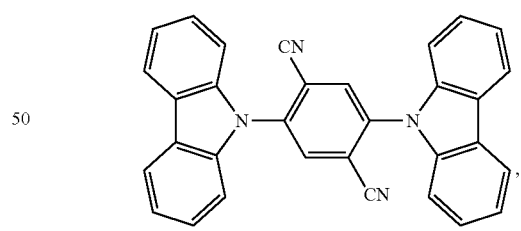
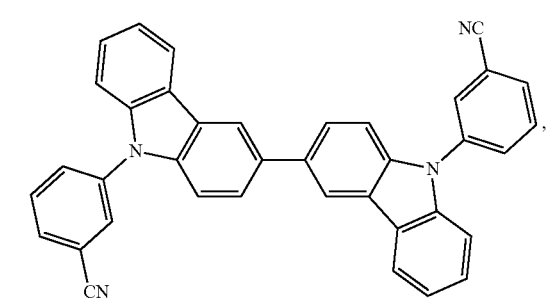
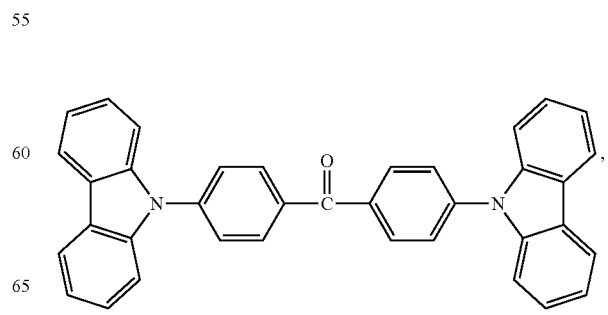

-continued

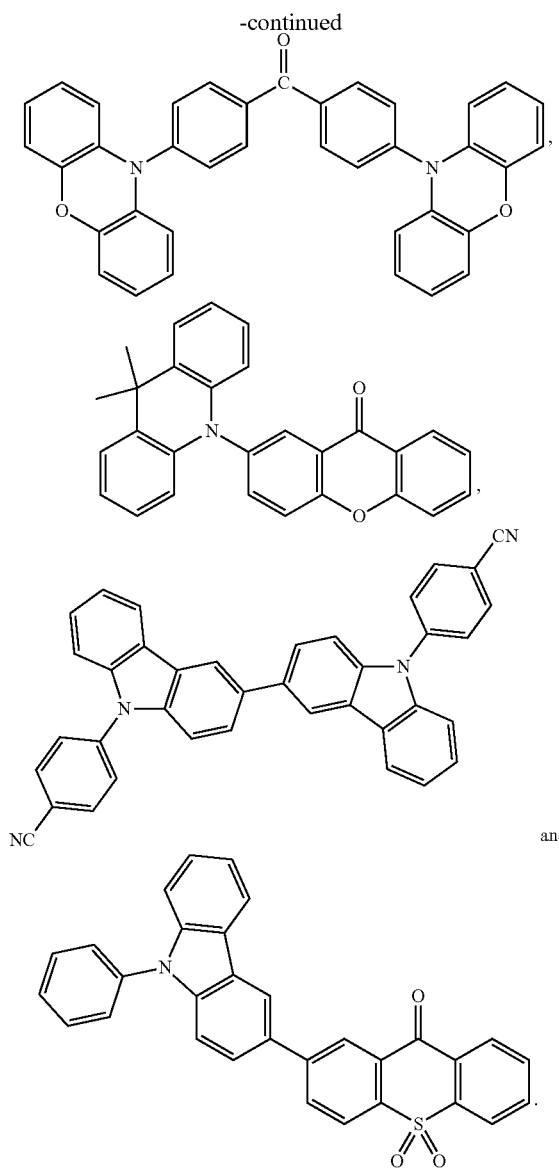

and

Further, the mixture includes the above-described polymer containing a furanyl crosslinkable group and a phosphorescent emitter (or triplet emitter). Wherein, the above-mentioned polymer containing a furanyl crosslinkable group is used as a host, the weight percentage of the phosphorescent emitter in the mixture is ≤30 wt %, further, the weight percentage of the phosphorescent emitter in the mixture is ≤25 wt %, and further, the weight percentage of the phosphorescent emitter in the mixture is ≤20 wt %. Still further, the weight percentage of the phosphorescent emitter in the mixture is ≤18 wt %.

The triplet emitter is also known as phosphorescent emitter.

Further, the triplet emitter has a metal complex of the formula M(L)w, wherein M is a metal atom, L is an organic ligand, and the organic ligand L is bonded to the metal atom M by position or coordination, w is an integer greater than 1, further, w is an integer from 1 to 6. The metal complex M(L)w is bonded to the above-mentioned polymer containing a furanyl crosslinkable group via position, and further, the metal complex M(L)w is bonded to the above-mentioned polymer containing a furanyl crosslinkable group via organic ligand.

Further, the metal atom M is a transition metal element, still further, the metal atom M is a lanthanide element or an actinide element, still further, the metal atom M is Ir, Pt, Pd, Au, Rh, Ru, Os, Sm, Eu, Gd, Tb, Dy, Re, Cu or Ag, and even further, the metal atom M is Os, Ir, Ru, Rh, Re, Pd or Pt.

Further, the triplet emitter comprises a chelating ligand (i.e., a ligand) that coordinates with the metal through at least two binding sites. The chelating ligands are helpful to improve the stability of the metal complexes.

Further, the triplet emitter comprises a bidentate ligand having two ligands, wherein the two ligands may be the same ligand or different ligands.

Further, the triplet emitter comprises a multidentate ligand having three ligands, wherein the three ligands may be the same ligand or different ligands.

Further, the organic ligand L is selected from the group consisting of phenylpyridine derivatives, 7,8-benzoquinoline derivatives, 2-(2-thienyl)pyridine derivatives, 2-(1-naphthyl)pyridine derivatives or 2-phenylquinoline derivatives. Of course, all of these organic ligands may be substituted, for example, substituted by fluoromethyl or trifluoromethyl. The ancillary ligand is acetone acetate or picric acid.

Further, the metal complex of the triplet emitter has the following formula:

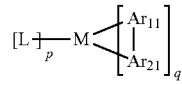

wherein M is a metal atom, M is a transition metal atom, and further is a lanthanide atom or an actinide atom.

$Ar_{11}$ is a cyclic group and comprises at least one donor atom (i.e., an atom having one lone pair of electrons, such as nitrogen or phosphorus). $A_{11}$ is coordinately coupled with metal by its cyclic group. $Ar_{21}$ is a cyclic group and comprises at least one carbon atom. And, $A_{21}$ is coupled with metal by its cyclic group.

$Ar_{11}$ and $Ar_{21}$ are bonded together by a covalent bond. Alternatively, $Ar_{11}$ and $Ar_{21}$ each carry a substituent group, also, $Ar_{11}$ and $Ar_{21}$ may be bonded together by a substituent group.

L is an auxiliary ligand, further, the auxiliary ligand is a bidentate chelate ligand, even further, the auxiliary ligand is a monoanionic bidentate chelate ligand.

Further, q is 1, 2 or 3. Further, q is 2 or 3. Still further, q is 3.

Further, p is 0, 1, or 2. Further, p is 0 or 1. Still further, p is 0.

Further, the triplet emitter and its application are the same as those in the following patents and documents: WO 200070655, WO 200141512, WO 200202714, WO 200215645, EP 1191613. EP 1191612, EP 1191614, WO 2005033244, WO 2005019373. US 2005/0258742, WO 2009146770, WO 2010015307, WO 2010031485, WO 2010054731, WO 2010054728, WO 2010086089, WO 2010099852, WO 2010102709, US 20070087219 A1, US 20090061681 A1, US 20010053462 A1, Baldo, Thompson et al. Nature 403, (2000), 750-753, US 20090061681 A1, US 20090061681 A1, Adachi et al. Appl. Phys. Lett. 78 (2001), 1622-1624, J. Kido et al. Appl. Phys. Lett. 65 (1994), 2124, Kido et al. Chem. Lett. 657, 1990, US 2007/0252517 A1, Johnson et al., JACS 105, 1983, 1795, Wrighton, JACS 96, 1974, 998, Ma et al., Synth. Metals 94, 1998, 245, U.S. Pat. Nos. 6,824,895, 7,029,766, 6,835,469, 6,830,828, US 20010053462 A1, WO 2007095118 A1, US 2012004407A1, WO 2012007088A1, WO2012007087A1, WO 2012007086A1, US 2008027220A1, WO 2011157339A1, CN 102282150A 或 WO 2009118087A1.
Specifically, the triplet emitter is one selected from the following structures:
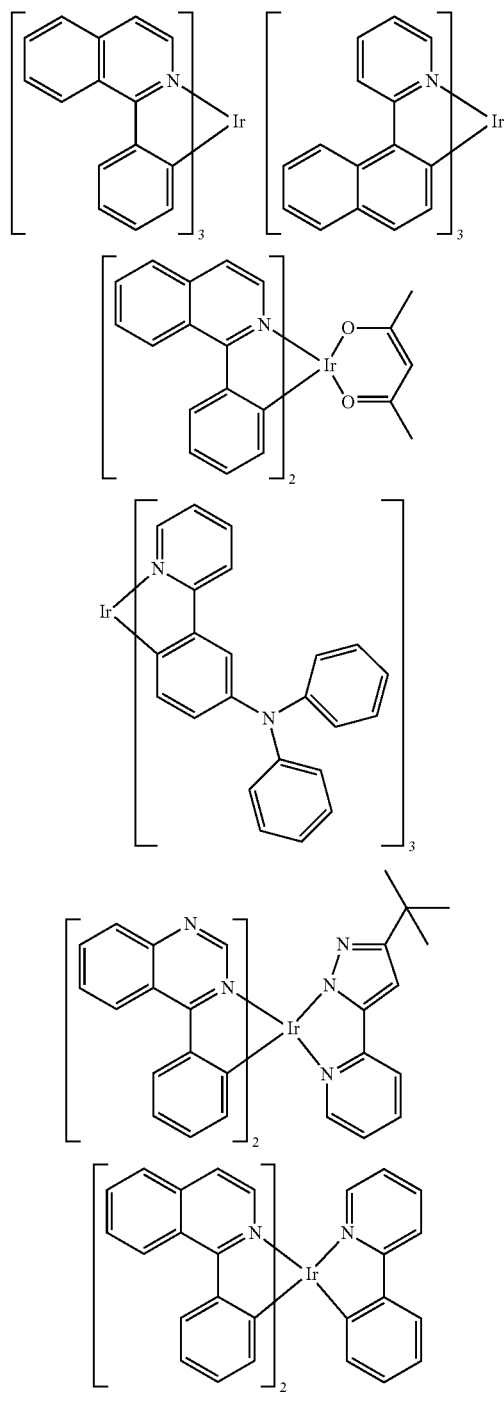
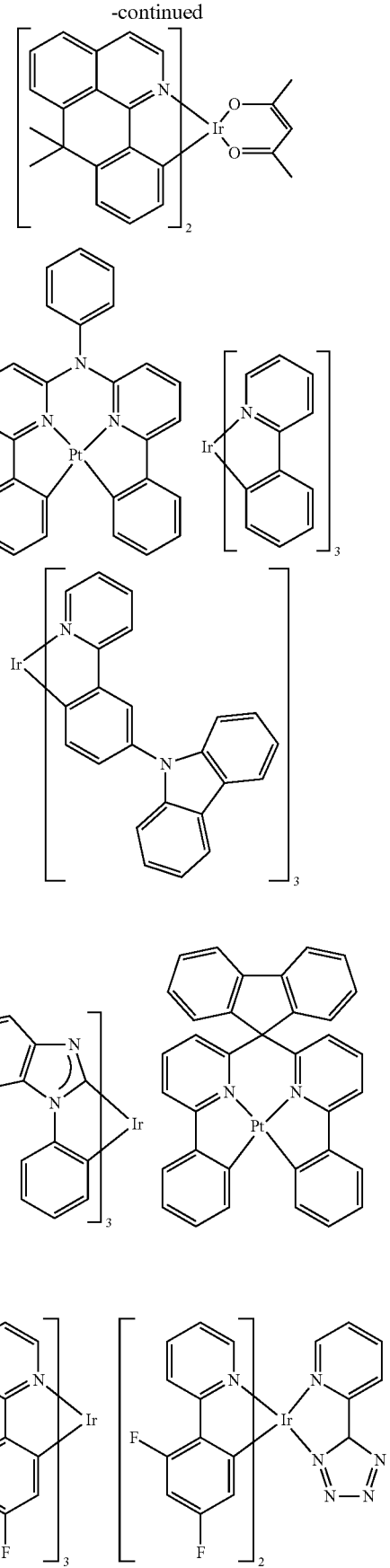

75
-continued
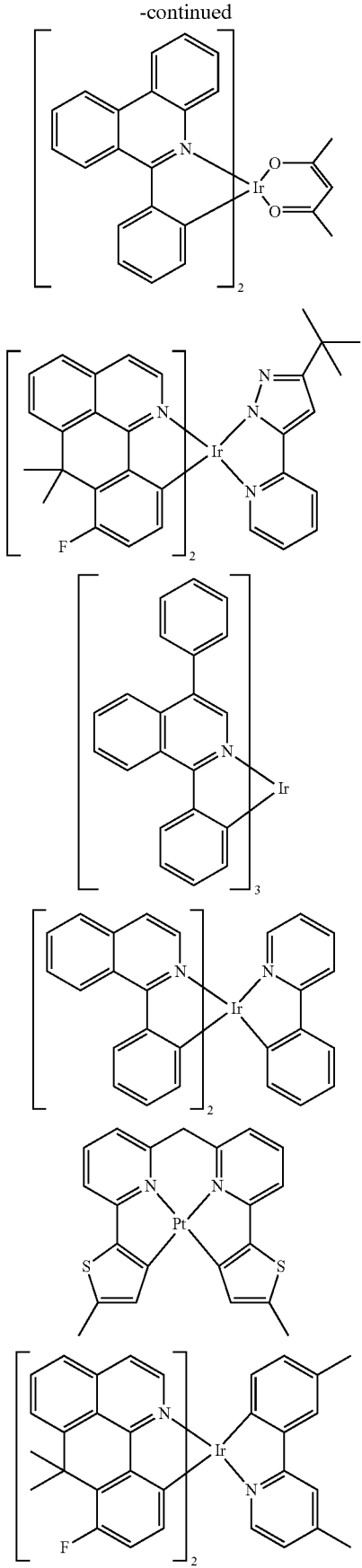
76
-continued
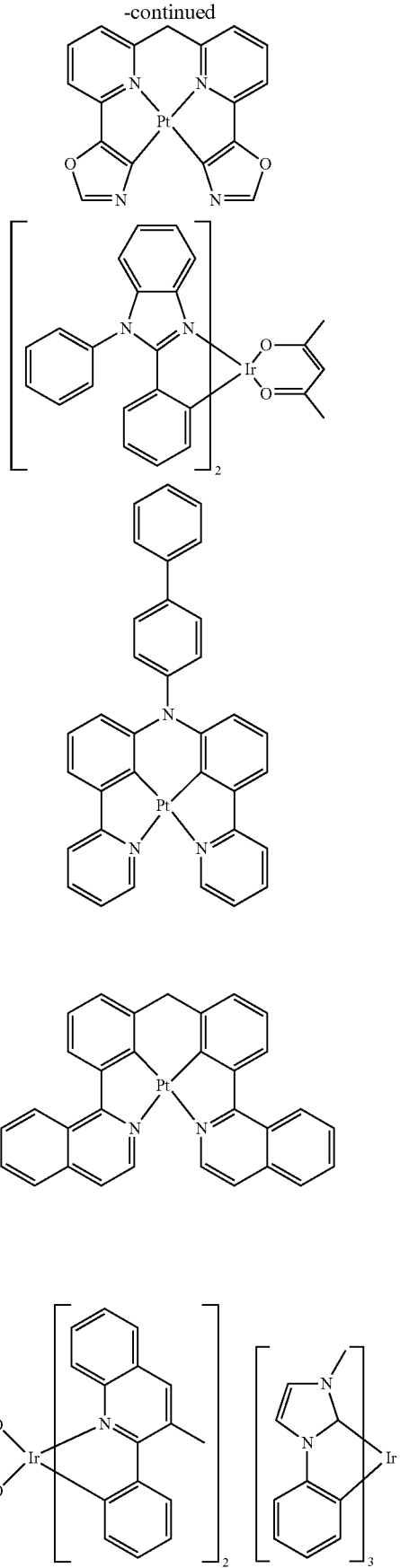

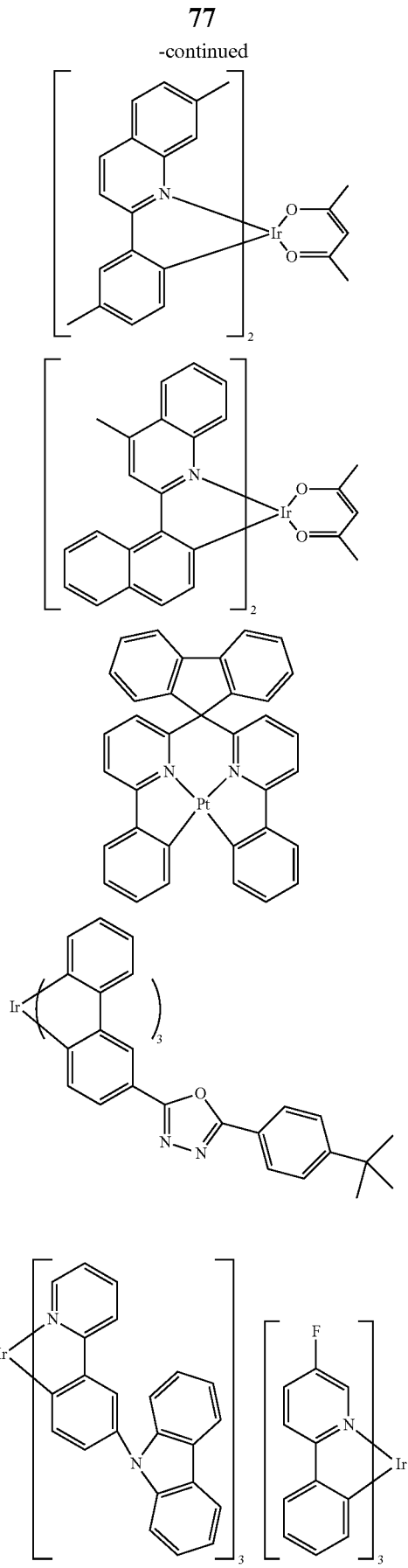
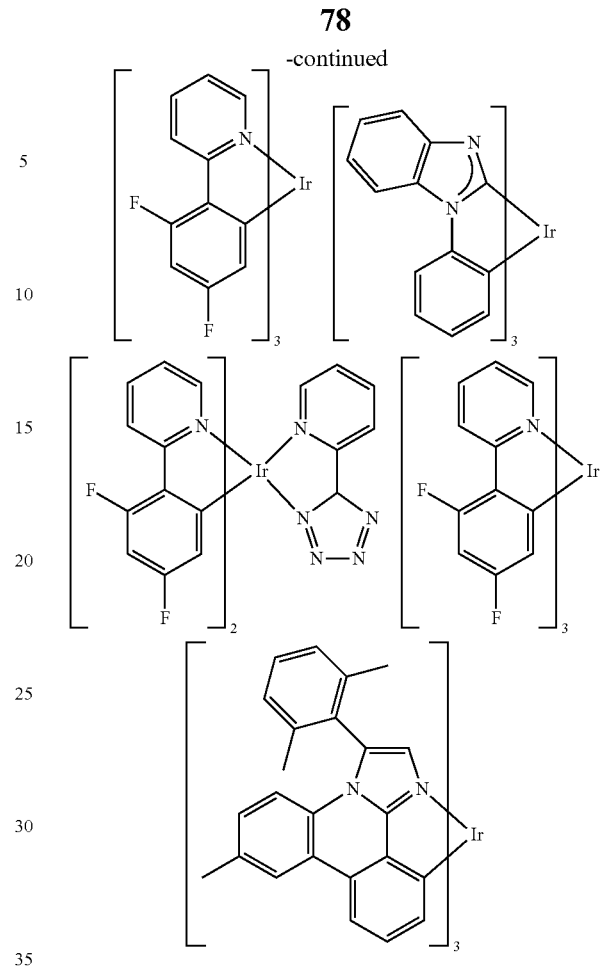

Further, the mixture includes the above polymer containing a furanyl crosslinkable group and HTM.

Further, the relative molecular mass of the above-mentioned polymer containing a furanyl crosslinkable group is ≥100 kg/mol.

Still further, the relative molecular mass of the above-mentioned polymer containing a furanyl crosslinkable group is ≥150 kg/mol.

Still further, the relative molecular mass of the above-mentioned polymer containing a furanyl crosslinkable group is ≥180 kg/mol, and even further, the relative molecular mass of the above-mentioned polymer containing a furanyl crosslinkable group is ≥200 kg/mol.

Further, the solubility of the above-mentioned polymer containing a furanyl crosslinkable group in toluene is ≥5 mg/ml at 25° C., further, the solubility in toluene is ≥7 mg/ml at 25° C., and even further, in toluene solubility ≥10 mg/ml at 25° C.

A formulation used as an ink for printing an OLED, comprises the above-described polymer containing a furanyl crosslinkable group, and at least one organic solvent.

The viscosity and surface tension of ink are important parameters when the ink is used in printing process. The surface tension parameters of suitable ink are suitable for a particular substrate and a particular printing method.

Further, the surface tension of the formulation of the present embodiment at working temperature or at 25° C. is in the range of 19 dyne/cm to 50 dyne/cm, still further, the surface tension of the formulation of the present embodiment at working temperature or at 25° C. is in the range of 22 dyne/cm to 35 dyne/cm, and even further the surface tension of the formulation of the present embodiment at working temperature or at 25° C. is in the range of 25 dyne/cm to 33 dyne/cm.

Further, the viscosity of the formulation of the present embodiment at working temperature or at 25° C. is in the range of 1 cps to 100 cps, still further in the range of 1 cps to 50 cps, even further in the range of 1.5 cps to 20 cps, and still even further in the range of 4.0 cps to 20 cps.

The formulation so formulated will be suitable for inkjet printing.

The viscosity can be adjusted by different methods, such as by selection of the appropriate solvent and the concentration of functional materials in the ink. The ink comprising the polymer can facilitate the adjustment of the printing ink in an appropriate range according to the printing method used. Generally, the weight ratio of the functional material contained in the ink is in the range of 0.3 wt % to 30 wt %, further in the range of 0.5 wt % to 20 wt %, still further in the range of 0.5 wt % to 15 wt %, even further in the range of 0.5 wt % to 10 wt %, still even further in the range of 1 wt % to 5 wt %.

Further, the organic solvent in the formulation is an aromatic solvent or a heteroaromatic solvent.

Still further, the organic solvent is at least one selected from the group consisting of an aliphatic chain aromatic solvent, a ring-substituted aromatic solvent, a ketone solvent, an ester solvent, and an ether solvent.

Specifically, the aromatic solvent or the heteroaromatic solvent is one selected from the group consisting of p-diisopropylbenzene, pentylbenzene, tetrahydronaphthalene, cyclohexyl benzene, chloronaphthalene, 1,4-dimethylnaphthalene, 3-isopropylbiphenyl, p-cymene, dipentylbenzene, tripentylbenzene, pentyltoluene, o-xylene, m-xylene, p-xylene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene, dihexylbenzene, dibutylbenzene, p-diisopropylbenzene, 1-methoxynaphthalene, cyclohexylbenzene, dimethylnaphthalene, 3-isopropylbiphenyl, p-cymene, 1-methylnaphthalene, 1,2,4-trichlorobenzene, 1,3-dipropoxybenzene, 4,4-difluorodiphenylmethane, 1,2-dimethoxy-4-(1-propenyl)benzene, diphenylmethane, 2-phenylpyridine, 3-phenylpyridine, N-methyldiphenylamine 4-isopropylbiphenyl, α,α-dichlorodiphenylmethane, 4-(3-phenylpropyl)pyridine, benzylbenzoate, 1,1-di(3,4-dimethylphenyl)ethane, 2-isopropylnaphthalene and dibenzylether.

Specifically, the ketone solvent is one selected from the group consisting of 1-tetralone, 2-tetralone, 2-(phenylepoxy)tetralone, 6-(methyloxy)tetralone, acetophenone, propiophenone, benzophenone, 4-methylacetophenone, 3-methylacetophenone, 2-methylacetophenone, 4-methylpropiophenone, 3-methylpropiophenone, 2-methylpropiophenone, isophorone, 2,6,8-trimethyl-4-nonanone, fenchone, 2-nonanone, 3-nonanone, 5-nonanone, 2-decanone, 2,5-hexanedione, phorone and 6-undecanone.

Specifically, the ether solvent is selected from the group consisting of 3-phenoxytoluene, butoxybenzene, benzylbutylbenzene, p-anisaldehyde dimethyl acetal, tetrahydro-2-phenoxy-2H-pyran, 1,2-dimethoxy-4-(1-propenyl)benzene, 1,4-benzodioxane, 1,3-dipropylbenzene, 2,5-dimethoxytoluene, 4-ethylphenetole, 1,2,4-trimethoxybenzene, 4-(1-propenyl)-1,2-dimethoxybenzene, 1,3-dimethoxybenzene, glycidyl phenyl ether, dibenzyl ether, 4-tert-butylanisole, trans-p-propenylanisole, 1,2-dimethoxybenzene, 1-methoxynaphthalene, diphenyl ether, 2-phenoxymethyl ether, 2-phenoxytetrahydrofuran, ethyl-2-naphthyl ether, pentyl ether, hexyl ether, dicaprylyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethyl ether butyl methyl ether, tripropylene glycol dimethyl ether, and tetraethylene glycol dimethyl ether.

Ester solvents: at least one of alkyl octoate, alkyl sebacate, alkyl stearate, alkyl benzoate, alkyl phenylacetate, alkyl cinnamate, alkyl oxalate, alkyl maleate, alkyl lactone and alkyl oleate.

Still further, the organic solvent is selected from aliphatic ketones, particularly the aliphatic ketone is at least one selected from the group consisting of 2-nonanone, 3-nonanone, 5-nonanone, 2-decanone, 2,5-hexanedione, 2,6,8-trimethyl-4-nonanone, phorone, 6-undecanone, and the like; or aliphatic ethers, such as pentyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, tetraethylene glycol dimethyl ether.

Further, the formulation further comprises at least one of the following organic solvents: methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 3-phenoxy toluene, 1,1,1-trichloroethane, 1,1,2,2-tetrachloroethane, ethyl acetate, butyl acetate, dimethylformamide, dimethylacetamide, dimethyl sulfoxide, tetrahydronaphthalene, decalin and indene.

Further, the above formulation is a solution.

Further, the above formulation is a suspension.

The solution or suspension may additionally comprise other components, such as surface-active compounds, further as lubricant, wetting agent, dispersant, hydrophobic agent, binder, etc. for adjusting viscosity and film forming property, enhancing adhesion, and the like. For more information about printing technologies and relevant requirements thereof on related solutions, such as solvents and concentration, viscosity, etc., see Handbook of Print Media: Technologies and Production Methods, ISBN 3-540-67326-1, edited by Helmut Kipphan.

The application of the formulation in the preparation of organic electronic devices is provided, and further, a method for preparing an organic electronic device by printing or coating the formulation is provided.

Specifically, the printing or coating techniques include inkjet printing, nozzle printing, letterpress printing, screen printing, dip coating, spin coating, blade coating, roller printing, torsion roll printing, lithography, flexography, rotary printing, spraying, brushing or pad printing, nozzle printing, and slot die coating.

Still further, the printing or coating technique is selected from inkjet printing, slot die coating, nozzle printing and intaglio printing.

A method for preparing a three-dimensional network cross-linked polymer, comprising: the polymer containing furanyl crosslinking group is chemically reacted under acid-initiated and heating conditions (or under additional light conditions) to cause a chemical reaction of the furan group to form a crosslinked three-dimensional network polymer film.

Under the action of acid, the conjugated double bonds in the furan ring open and chemically react with each other to achieve cross-linking. Insoluble and infusible three-dimensional network polymer solidified by acid, which has excellent resistance to heat, water and chemicals and has excellent resistance to acids, alkalis, salts and organic solutions, and is an excellent preservative.

Further, the acid used in the crosslinking process is one selected from the group consisting of sulfuric acid, hydrochloric acid, nitric acid, acetic acid, oxalic acid (ethanedioic acid), maleic acid, sulfurous acid, phosphoric acid, pyruvic acid, malonic acid, chloroacetic acid, phthalic acid, salicylic acid, tartaric acid, nitrous acid, fumaric acid, citric acid, hydrofluoric acid, malic acid, gluconic acid, formic acid, lactic acid, benzoic acid, acrylic acid, methacrylic acid, butenoic acid, propionic acid, oleic acid, stearic acid, benzenesulfonic acid, sulfonic acid derivatives, sulfonic acid polymer, polystyrolsulfon acid, photo-acid generator, tert-butyl pentacene-N-sulfinyl-carbamate, triphenylsulfonium perfluorobutylsulfonate, diphenyliodonium hexafluorophosphate, triphenylsulfur trifluoromethanesulfonate, tris(4-tert-butylphenyl)phosphonium perfluoro-1-butanesulfonic acid, N-hydroxynaphthalimide trifluoromethanesulfonic acid, N-hydroxy-5-norbornene-2,3-diamide nonafluorobutanesulfonic acid, 2,4-bis(trichloromethyl)-6-p-methoxystyryl-S-triazine and 2,4-bis(trichloromethyl)-6-p-methoxystyryl-S-triazine.

The furanyl crosslinkable group is linked to the polymer via a chemical bond to obtain a multifunctional polymer optoelectronic material having carrier transport characteristics, luminescent properties, and crosslinking properties. Not only these materials have adjustable energy level structure, excellent carrier transport properties, but also the furan groups can react with each other under conditions of illumination, acid initiation, heating, etc. to form a three-dimensional interpenetrating network structure with excellent solvent resistance and morphological thermal stability, which makes it possible to prepare a highly efficient multilayer organic electroluminescent device by solution method, which is more conducive to the realization of organic electroluminescent device by printing.

The use of the above polymer containing a furanyl crosslinkable group in an organic electronic device is provided.

Further, the organic electronic device may be an organic light-emitting diode (OLED), an organic photovoltaic cell (OPV), an organic light-emitting electrochemical cell (OLEEC), an organic field effect transistor (OFET), an organic light-emitting field effect transistor, an organic laser, an organic spintronic device, an quantum dot light emitting diode, an perovskite battery, an organic sensor, or an organic plasmon emitting diode. Further, the organic electronic device is an OLED.

Further, an organic electronic device comprises the above-mentioned polymer containing a furanyl crosslinkable group.

Further, the organic electronic device further comprises at least one functional layer.

Further, the above-mentioned polymer containing a furanyl crosslinkable group is used for a hole transport layer, a hole injection layer or a light-emitting layer of an organic electronic device.

An organic electronic device comprises a cathode, an anode, and a functional layer between the cathode and the anode, wherein the functional layer comprises the above-mentioned polymer containing a furanyl crosslinkable group.

Further, the organic electronic device is an electroluminescent device comprising a substrate, an anode, a light-emitting layer, and a cathode.

The substrate may be opaque or transparent. A transparent substrate can be used to fabricate a transparent light-emitting device. See, for example, Bulovic et al., Nature 1996, 380, p 29, and Gu et al., Appl. Phys. Lett. 1996, 68, p 2606. The substrate can be rigid or elastic.

The substrate is a plastic, metal, semiconductor wafer or glass.

Further, the substrate has a smooth surface.

Further, the substrate is flexible, and further is made of a polymer film or plastic. Still further, the substrate is made of poly(ethylene terephthalate) (PET) and polyethylene glycol (2,6-naphthalene) (PEN).

The substrate has a glass transition temperature Tg greater than or equal to 150° C. further greater than 200° C., still further greater than 250° C., and even further greater than 300° C.

The anode material is one of a conductive metal, a metallic oxide and a conductive polymer. The anode can inject holes easily into the hole injection layer (HIL), or the hole transport layer (HTL), or the light-emitting layer.

Further, the absolute value of the difference between the work function of the anode and the HOMO energy level or the valence band energy level of the emitter in the light-emitting layer or of the p-type semiconductor material as the HIL or HTL or the electron blocking layer (EBL) is less than 0.5 eV, further less than 0.3 eV, still further less than 0.2 eV.

Specifically, the material of anode is at least one selected from the group consisting of Al, Cu, Au, Ag, Mg, Fe, Co, Ni, Mn, Pd, Pt, ITO and aluminum-doped zinc oxide (AZO). And, other suitable anode materials are known and materials that can be readily selected for use by those of ordinary skill in the art are also suitable for use in this embodiment.

The material of anode may be deposited by any suitable technologies, such as a physical vapor deposition method including radio frequency magnetron sputtering, vacuum thermal evaporation, e-beam, and the like.

Further, the anode is patterned. Patterned ITO conductive substrates are commercially available and can be used to prepare the organic electronic device.

The material of the cathode is a conductive metal or metal oxide. The cathode can inject electrons easily into the EIL or ETL, or directly injected into the light-emitting layer.

Further, the absolute value of the difference between the work function of the cathode and the LUMO energy level or the valence band energy level of the emitter in the light-emitting layer or of the n type semiconductor material as the electron injection layer (EIL) or the electron transport layer (ETL) or the hole blocking layer (HBL) is smaller than 0.5 eV, still further smaller than 0.3 eV, even further smaller than 0.2 eV. In principle, all materials that can be used as a cathode for OLED are possibly used as a cathode material for the device of the present embodiment.

Specially, the cathode material is at least one selected from the group consisting of Al, Au, Ag, Ca, Ba, Mg, LiF/Al, MgAg alloy, BaF2/Al, Cu, Fe, Co, Ni, Mn, Pd, Pt and ITO.

The cathode material may be deposited by any suitable technologies, such as physical vapor deposition method including radio frequency magnetron sputtering, vacuum thermal evaporation, electron beam, and the like.

Specially, the electroluminescent device further comprises at least one of a hole injection layer (HIL), a hole transport layer (HTL), an electron blocking layer (EBL), an electron injection layer (EIL), an electron transport layer (ETL), and a hole blocking layer (HBL). Materials which are suitable for use in these functional layers are described in detail in WO2010135519A1, US20090134784A1 and WO2011110277A1.

Further, a hole injection layer (HIL) or a hole transport layer (HTL) is prepared by printing the above formulation.

Further, the hole transport layer (HTL) comprises the above-mentioned polymer containing a furanyl crosslinkable group, and its light emitting layer (104) comprises a small molecule host material and a small molecule light emitting material. The small molecule light emitting material is a fluorescent light emitting material or a phosphorescent light emitting material.

Still further, the light emitting layer comprises a polymer light emitting material. Even further, the light emitting layer is prepared by printing the above formulation.

The above electroluminescent device has an emission wavelength of 300 nm to 1000 nm, further 350 nm to 900 nm, and still further 400 nm to 800 nm.

The application of above-mentioned organic electronic devices in various electronic equipment, such as display equipment, lighting equipment, light sources, and sensors.

An electronic equipment including the above organic electronic device, such as display equipment, lighting equipment, light source, and sensor and the like are provided.

The present disclosure will be described below with reference to the embodiments, but the present disclosure is not limited to the following embodiments. It should be understood that the appended claims summarized the scope of the present disclosure. Those skilled in the art should realize that certain changes to the embodiments of the present disclosure that are made under the guidance of the concept of the present disclosure will be covered by the spirit and scope of the claims of the present disclosure.

SPECIFIC EMBODIMENTS

Example 1: Synthesis of Polymer P1

Synthetic Route:

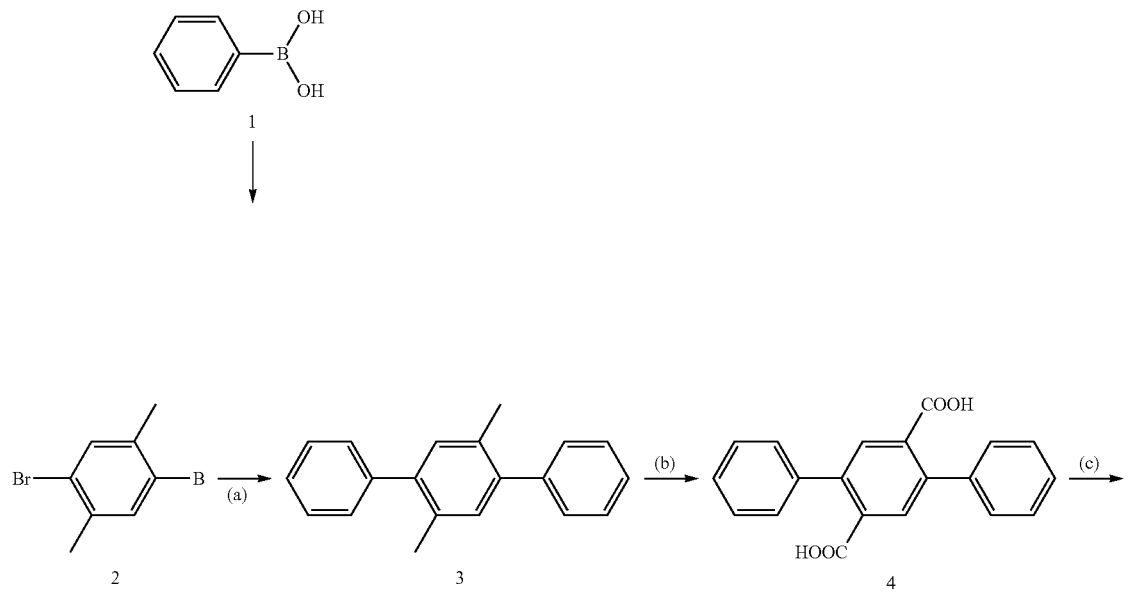

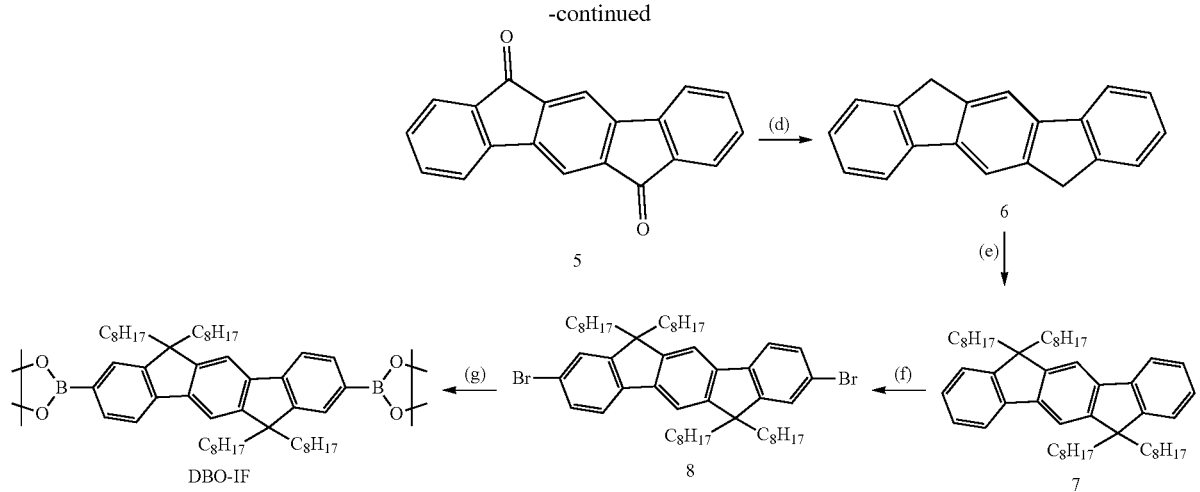
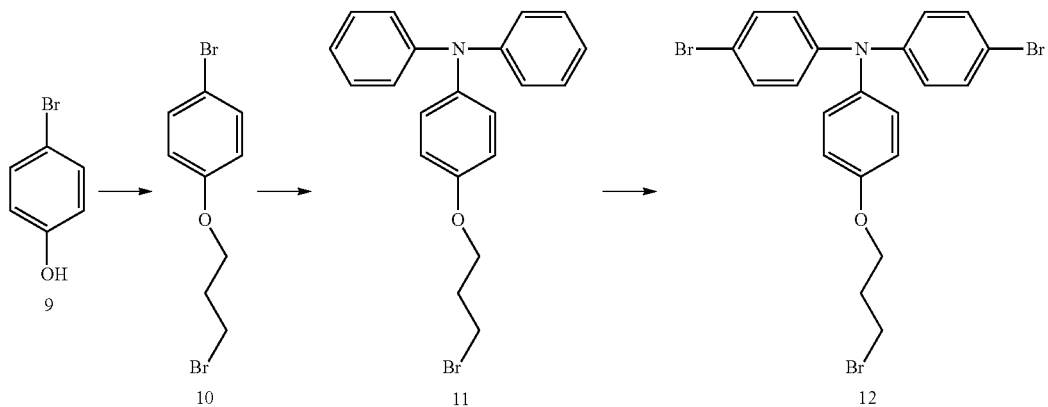
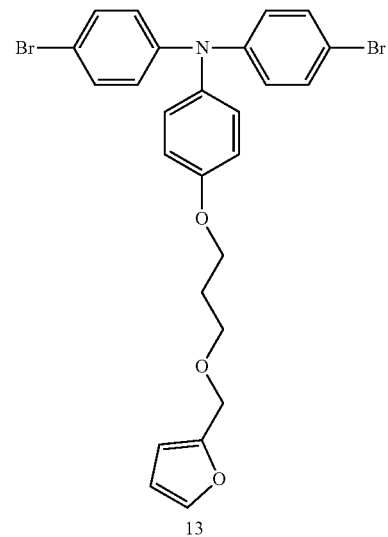

-continued

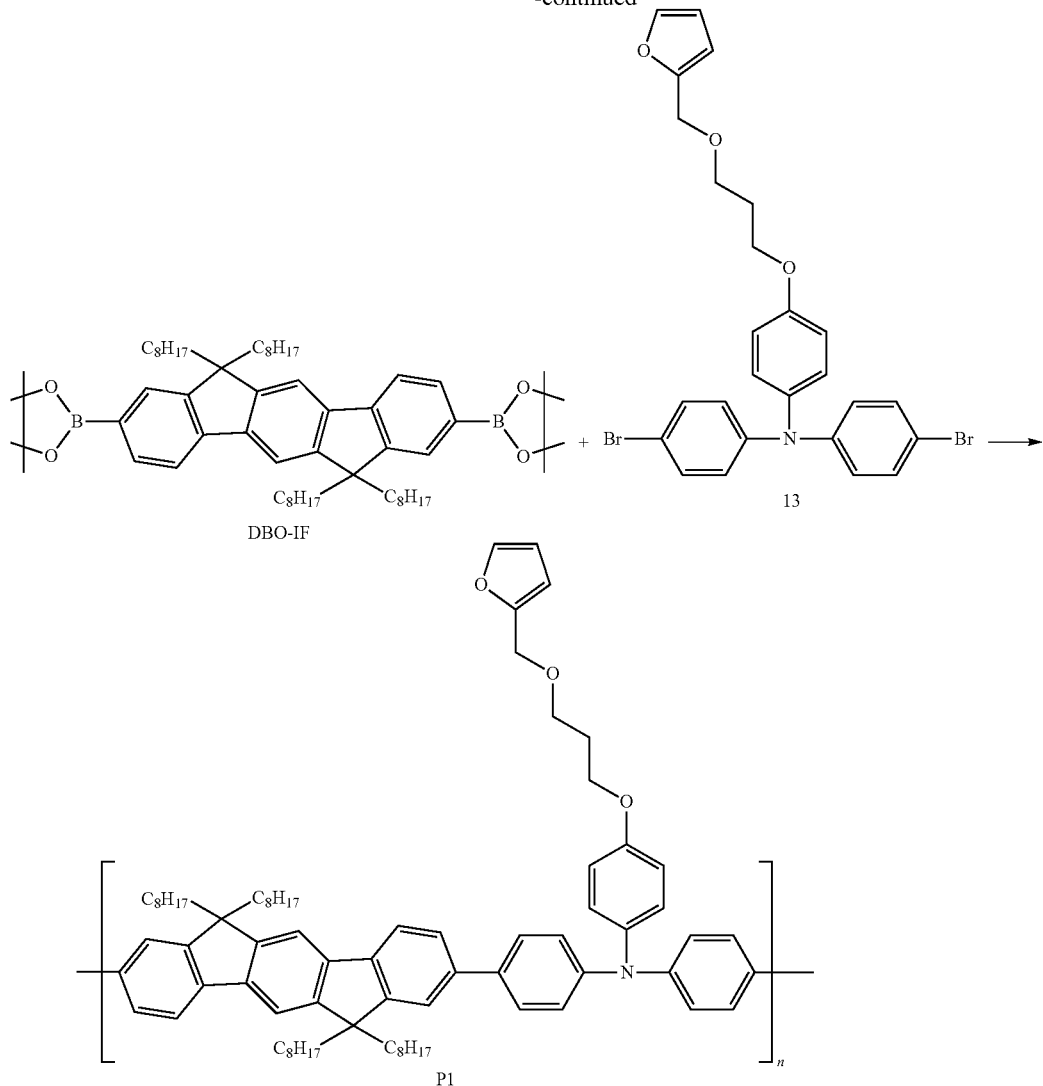

DBO-IF

P1

Synthesis of 2,5-diphenyl-p-xylene (Compound 3)

To a 250 ml three-neck round bottom flask, 2,5-dibromo-p-xylene (26.40 g, 0.1 mol) and phenylboronic acid (24.39 g, 0.2 mmol) were added. Then 250 ml of toluene was added and dissolved under stirring. Then, 50 ml of water and 21.2 g (0.2 mol) of $Na_2CO_3$ were added in sequence and stirred until the solids were all dissolved, followed by addition of 0.5 ml of Aliquat 336 and 75 mg of triphenylphosphine tetrapalladium catalyst (o) $(PPh_3)_4Pd$. The reaction was purged with nitrogen for 10 min. then heated to reflux (92-100° C.). After reflux for 20 min, the nitrogen gas was closed, the system was sealed, and the reaction was refluxed overnight to obtain a reaction solution. After cooling, the reaction solution was extracted with toluene (50 ml×4), and the organic phase was combined, washed successively with a saturated NaCl solution and water, evaporated to remove the solvent, and dried to obtain 22.48 g of 2,5-diphenyl-p-xylene as white crystals (yield: 87%, based on theoretical value of 25.84 g). M. P. 180-181° C. (lit. 180° C.), $^1H$ NMR ($CDCl_3$, 400 MHz, ppm): δ 7.44-7.30 (m, 10H), 7.14 (s, 2H), 2.26 (s, 6H).

Synthesis of 2,5-diphenyl-p-dicarboxylic acid (Compound 4)

To a 250 ml three-neck round bottom flask equipped with mechanical stirring, 2,5-diphenyl-p-xylene (12.92 g, 0.05 mol) and 250 ml of pyridine were added and dissolved under stirring. Then, 30 ml of water and potassium permanganate ($KMnO_4$) (39.51 g, 0.25 mol) were added in sequence, and heated to reflux (92-100° C.) for 2 hours. After each reflux for 30 min and cooling, 60 ml of water and 15.59 of potassium permanganate ($KMnO_4$) (0.1 mol) were added and these were repeated four times. Additionally, after each reflux for 6 h and cooling, 60 ml of water was added, and these were repeated four times. After the reaction, the mixture was filtered while hot, with the filter cake rinsed with boiling water (1000 ml×4), and the filtrate was combined and evaporated to remove the solvent to a volume of 100 ml, to which 50 ml of concentrated hydrochloric acid was added. The result was filtered with cooling, washed with cold water, and dried in vacuo to obtain 9.21 g of 2,5-diphenyl-di-dicarboxylic acid as a white solid (yield: 57.9%, based on theoretical value of 15.92 g). M. P 281-282° C. (lit. 282° C.), $^1$H NMR (DMSO-d$_6$, 400 MHz, ppm): δ 7.67 (s, 2H), 7.46-7.38 (m, 10H).

Synthesis of 6,12-indenofluorene dione (Compound 5)

To a 500 ml three-neck round bottom flask, 100 ml of concentrated sulfuric acid was added, followed by slow addition of 3.18 g (0.01 mol) of 2,5-diphenyl-p-dicarboxylic acid under stirring for reaction for 0.5 h at room temperature. Then, 5 to 10 drops of fuming sulfuric acid were added, and after reacting for 6 hours, the reaction solution was poured into an ice-water mixture, and stirred with a glass rod to obtain a mixed solution. The mixed solution was suction filtered, washed with a large amount of water and dried to obtain 1.95 g of 6,12-nonanedione as a dark red solid (yield: 69%, based on theoretical value of 2.82 g). M. P. >300° C. (lit.>300° C.), $^1$H NMR (CDCl$_3$, 400 MHz, ppm): δ 7.79 (s, 2H), 7.68 (d, J=7.36 Hz, 2H), 7.57-7.51 (m, 4H), 7.37-7.29 (m, 2H).

Synthesis of Indenofluorene (Compound 6)

Figure 2:
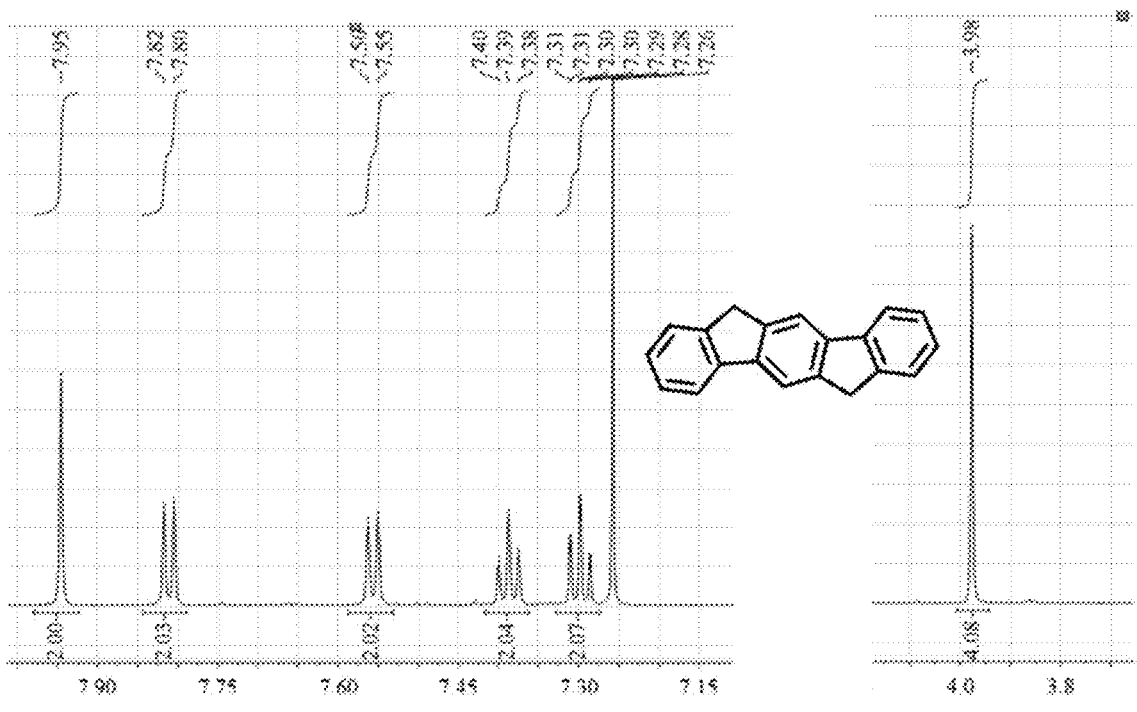
FIG. 2 is $^1$H NMR of indenofluorene in an embodiment.
Figure 3:
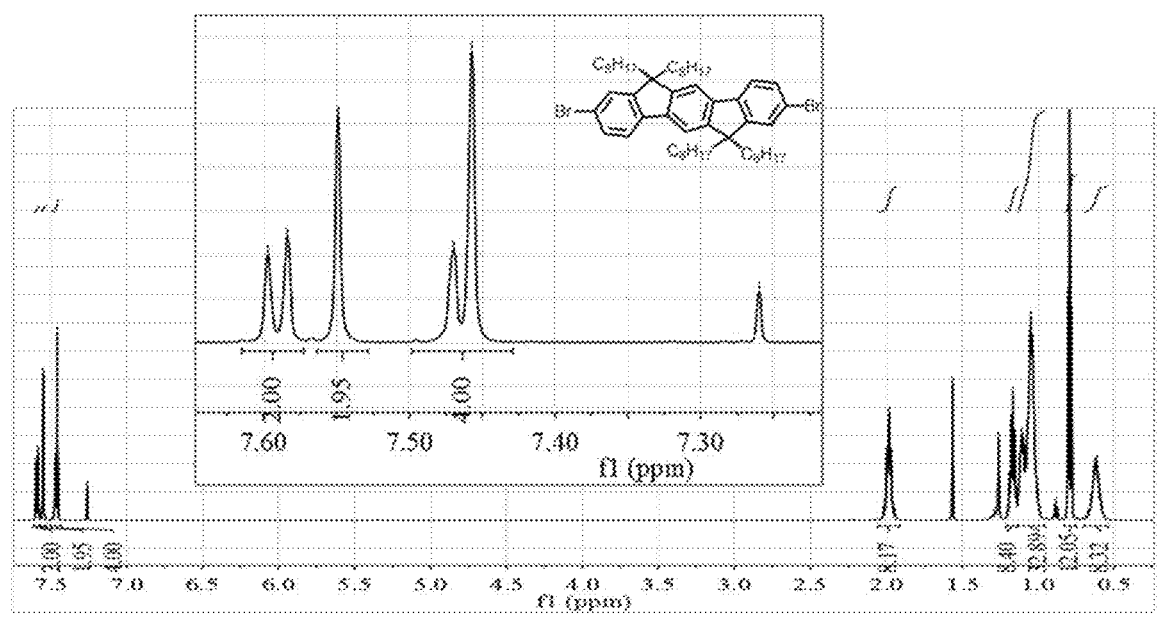
FIG. 3 is $^1$HNMR of 2,7-dibromo-6,6,6,12,12-tetraoctylfluorene in an embodiment.

To a 500 ml three-neck round bottom flask, 5.64 g (0.02 mol) of 6,22-indenofluorene was added, followed by slow addition of 300 ml of diethylene glycol and 4 ml of hydrated hydrazine (85%) in sequence before adding 28.10 g (0.5 mol) KOH that had been ground to a fine powder. The reaction was purged with nitrogen for 10 min, then heated to reflux (195° C.). After reaction for 48 h. the reaction was cooled and poured into a mixture of crushed ice/concentrated hydrochloric acid (v:v=8:1), and stirred with a glass rod to obtain a mixed solution. The mixed solution was suction filtered, washed with water and dried to obtain 2.29 g of indenofluorene as a yellowish brown gray solid (yield: 45%, based on theoretical value of 5.09 g). M. P. 300-301° C. (lit. 300-302° C.), $^1$H NMR (DMSO-d$_6$, 400 MHz, ppm): δ 8.09 (s, 2H), 7.93 (d, J=7.4 Hz, 2H), 7.59 (d, J=7.4 Hz, 2H), 7.39 (t, J=7.4 Hz, 2H), 7.31 (t, J=7.4 Hz, 2H), 3.99 (s, 4H). The $^1$H NMR chart of ruthenium is shown in FIG. 2.

Synthesis of 6,6,12,12-tetraoctylindenofluorene (Compound 7)

To a 250 ml long neck three-neck round bottom flask equipped with a rotor, 1.27 g of indenofluorene is added. The middle neck of the long neck three-neck round bottom flask was plugged with a high vacuum plug (paraffin seal), and another two side necks were plugged with an aboral plugs, and the flask was heated with a fan while vacuuming the flask with an oil pump. 100 ml of dry THF was added to the flask with a syringe. 6 ml of 2.87 M n-butyllithium (17.22 mmol) was added dropwise to the flask with stirring at −78° C., and reacted under nitrogen for 1 h. The system heated to room temperature and reacted for 30 min and then dropped to −78° C. 3.82 g of 1-bromooctane (n-C$_8$H$_{17}$Br, 20 mmol) was added with a syringe, and after reacting at −78° C. for 1 h, the reaction was proceeded overnight with the temperature naturally raised to room temperature. 30 ml of water was added to the flask to quench the reaction to obtain a reaction solution, which was then extracted with petroleum ether (50 ml×4), and the organic phase was combined and dried over anhydrous Na$_2$SO$_4$, and then evaporated to remove the solvent and purified by column chromatography (100-200 mesh silica gel/petroleum ether). The result was recrystallized in methanol to obtain 1.68 g of 6,6,12,12-tetraoctylindenofluorene as beige crystals (yield: 47.7%, based on theoretical value of 3.52 g). $^1$H NMR (CDCl$_3$, 400 MHz, ppm): δ 7.72 (d, J=6.8 Hz, 2H), 7.58 (s, 2H), 7.33-7.24 (m, 6H), 1.99 (t, J=8.0 Hz, 8H), 1.12-0.98 (m, 24H), 0.76-0.59 (m, 20H): $^{13}$C NMR (CDCl$_3$, 100 MHz, ppm): δ 151.08, 149.92, 141.48, 140.50, 126.59, 122.81, 119.30, 113.81, 54.66, 40.67, 31.50, 29.69, 23.67, 22.51, 13.96.

Synthesis of 2,7-dibromo-6,6,12,12-tetraoctylindenofluorene (Compound 8)

To a 250 ml three-neck round bottom flask equipped with a rotor, 7.03 g (10 mmol) of 6,6,12,12-tetraoctylindenofluorene and 100 ml of CCl$_4$ were added with stirring to make the 7.03 g of 6,6,12,12-tetraoctylindenofluorene dissolved. Then, 40 g (0.25 mol) of Al$_2$O/CuBr was added and refluxed for 18 h to obtain a reaction solution. The reaction solution was filtered, and the filtrate was washed with water and dried over anhydrous Na$_2$SO$_4$. The solvent was evaporated, and the obtained solid was recrystallized from methanol to give 3.73 g of 2,7-dibromo-6,6,12,12-tetraoctyl indenofluorene as white crystals (yield: 43.3%, based on theoretical value of 8.61 g). $^1$H NMR (CDCl$_3$, 400 MHz, ppm): δ 7.57 (d, J=8.4 Hz, 2H), 7.52 (s, 2H), 7.45 (s, 2H), 7.44 (d, J=8.4 Hz, 2H), 1.97 (t, J=8.2 Hz, 8H), 1.11-0.96 (m, 24H), 0.75-0.58 (m, 20H); $^{13}$C NMR (CDCl$_3$, 100 MHz, ppm): δ 153.12, 149.68, 140.12, 139.72, 129.69, 125.97, 120.73, 120.63, 113.84, 55.13, 40.60, 31.58, 29.71, 23.76, 22.62, 14.11.

Synthesis of 2,8-bis(4,4,5-tetramethyl-1,3,2-dioxaborolan-diyl)-6,6,12,12 fourteen octyl-indenofluorene (DBO-IF)

A 250 ml long neck three-neck round bottom flask is equipped with a rotor. The middle neck of the long neck three-neck round bottom flask was plugged with a high vacuum plug, and another two side necks were plugged with an aboral plugs, and the flask was heated with a fan while vacuuming the flask with an oil pump. 2,8-dibromo-6,6,12,12-tetraoctylindenofluorene (4.31 g, 5 mmol) was dissolved in THF (120 ml) which was added to the flask through a syringe and stirred at −78° C. for 20 min. N-butyllithium (2.87 M, 6 ml, 17.22 mmol) was added dropwise to the flask. The reaction was kept under nitrogen protection for 2 h, then 2-isopropyl-4,4,5,5-tetramethyl-1,3,2-dioxaborane (5 ml) was added through a syringe. The reaction was kept at −78° C. for 2 h, then naturally warmed to room temperature and kept overnight. Water (30 ml) was added to the flask to quench the reaction. The reaction solution was extracted with petroleum ether (50 ml×4). The organic phase was combined and dried over anhydrous Na$_2$SO$_4$. The solvent was evaporated and the reaction solution was purified by column chromatography (100-200 mesh silica gel/petroleum ether:ethyl acetate v:v=9:1) to obtain 1.18 g of white crystals (yield: 24.7%, based on theoretical value of 4.78 g). $^1$H NMR (CDCl$_3$, 400 MHz, ppm): δ 7.75 (d, J=7.7 Hz, 2H), 7.71 (d, J=7.3 Hz, 2H), 7.70 (s, 2H), 7.59 (s, 2H) 4.19 (t, J=5.3 Hz, 8H), 2.08 (t, J=5.3 Hz, 4H), 2.01 (q, J=6.4 Hz, 8H), 1.07-0.96 (m, 24H), 0.68 (t, J=7.0 Hz, 12H), 0.58 (t. J=6.7 Hz, 8H); $^{13}$C NMR (CDCl$_3$, 100 MHz, ppm): δ 150.49, 150.15, 143.94, 140.83, 132.35, 127.75, 118.59, 114.17, 61.99, 54.58, 40.64, 31.51, 29.71, 27.42, 23.65, 22.52, 13.96.

Synthesis of 1-bromo-4(3-bromoproropoxy)benzene (Compound 10)

To a round bottom flask, 1,3-dibromopropane (316.4 g, 1.5 mol) and potassium carbonate (41.4 g, 0.3 mol) were added with ethanol as solvent, and p-bromophenol (51.9 g, 0.3 mol) was dissolved in ethanol and slowly dropped into the reaction system under reflux temperature. The reaction was kept overnight. After reaction, water was added to quench the reaction which was then extracted with dichloromethane, washed with saline water, and subjected to rotary evaporation to remove dichloromethane. 1,3-dibromopropane was distilled under reduced pressure and recovered. After that, dichloromethane and silica gel powder were added to the reaction solution which was subjected to a silica gel column with petroleum ether as a rinse. 60 g of Compound 10 (1-bromo-4 (3-bromopropoxy)benzene) was obtained. Mp 58-59° C.; IR (KBr disk) v: 2958 and 2930 (—CH2), 1489 (—CH2-), 1241 (C—O); 1H NMR (500 MHz, CDCl3): δ 2.36-2.40 (2H, m, J2'-3'=J2'-1' 6, H-2'), 3.66-3.69 (2H, t, J3'-2' 6, H-3'), 4.13-4.16 (2H, t, J1'-2' 6, H-1'), 6.87 (2H, d, J3-2 9, H-3), 7.46 (2H, d, J2-3 9, H-2); 13C NMR (125 MHz, CDCl3): δ 28.3 (C-3'), 30.7 (C-2'), 64.1 (C-1'), 111.6 (C-1), 114.8 (2C, C-3), 130.8 (2C, C-2), 156.3 (C-4); m/z (EI): 296 (M+, 45%), 294 (80), 174 (97), 172 (100), 143 (20), 121 (17), 93 (21), 76 (19), 63 (43). HRMS (EI) found: 291.9095 (79Br, C9H10Br2O requires: 291.9098)

Synthesis of
4-(3-bromopropoxy)-N,N-diphenylaniline
(Compound 11)

To a two-necked flask. Compound 10 (13 g, 0.044 mol), diphenylamine (7.45 g, 0.044 mol), sodium tert-butoxide (8.45 g, 0.088 mol), catalyst bis(dibenzylideneacetone)palladium (1.27 g, 0.0022 mol) were added with anhydrous toluene as a reaction solvent. Nitrogen was purged for 30 min to remove oxygen, and then tri-tert-butylphosphine (13 ml) was added. The progress of the reaction was followed. After reaction, water was added to quench the reaction. The reaction solution was extracted with ethyl acetate. The organic phase was subjected to rotary evaporation to remove solvent. Silica gel powder was added to the reaction solution which was subjected to a silica gel column to obtain 13.66 g of Compound 11 (i.e. 4-(3-bromopropoxy)-N,N-diphenylaniline).

Synthesis of 4-bromo-N-(4-bromophenyl)-N-(4-(3-bromopropoxy)phenyl) aniline (Compound 12)

Compound 11 (13.66 g, 0.036 mol) was dissolved in DMF to which NBS (12.73 g, 0.072 mol) was added in an ice bath. The reaction was kept overnight at room temperature. Water was added to quench the reaction which was extracted with dichloromethane and then washed with water. Silica gel powder was added to the reaction solution which was subjected to a silica gel column to obtain 11.7 g of Compound 12 (i.e. 4-bromo-N-(4-bromophenyl)-N-(4-(3-bromopropoxy)phenyl) aniline)

Synthesis of 4-bromo-N-(4-bromophenyl)-N-(4-(3-(furan-2-yloxy)propoxy) yloxy)propoxy)phenyl) aniline (Compound 13)

To a two-necked flask, furfuralcohol (4.6 g, 0.0468 mol), as well as anhydrous DMF as a reaction solvent were added. Air was replaced with nitrogen for three times. Sodium hydride (1.87 g, 0.0468 mol) was added under nitrogen atmosphere, and reacted for one hour. Compound 12 (5.06 g, 0.0094 mol) was added and reacted for 30 min, then heated to 50° C. and reacted overnight. Water was added to terminate the reaction. The reaction solution was extracted with dichloromethane, wash with saline water. The organic solvent was removed by rotary evaporation. Silica gel powder was added to the reaction solution which was subjected to a silica gel column to obtain 1 g of Compound 13 (i.e. 4-bromo-N-(4-bromophenyl)-N-(4-(3-(furan-2-yloxy) propoxy) yloxy)propoxy)phenyl)aniline).

Synthesis of Polymer P1

To a 25 mL two-necked round bottom flask, monomer of 4-bromo-N-(4-bromophenyl)-N-(4-(3-(furan-2-yloxy) propoxy)phenyl)aniline (13) (195 mg, 0.5 mmol), monomer of 2,8-bis(4,4,5,5-tetramethyl-1,3,2-dioxaborane-diyl)-6,6,12,12-tetraoctylindenofluorene (418 mg, 0.5 mmol), Pd(PPh3)4 (10 mg), and degassed toluene (10 mL), degassed tetrahydrofuran (4 mL), and aqueous solution of tetraethylammonium hydroxide (2 mL, mass fraction of 20%) were added and uniformly stirred. Argon was passed for 15 minutes. The reaction was performed under argon protection at 110° C. for 24 hours, and then bromobenzene (50 μL) and kept in reflux for 2 hours, and phenylboronic acid (20 mg) were added and kept in reflux for 2 hours. After cooled to room temperature, the reaction solution was added dropwise to methanol to precipitate. The obtained flocculent precipitate was filtered, vacuum dried, and redissolved in tetrahydrofuran (about 30 mL). The obtained tetrahydrofuran solution was filtered through a polytetrafluoroethylene (PTFE) filter head having a pore size of 0.45 μm, concentrated under reduced pressure, and then added dropwise to methanol to precipate. After drying in vacuo, pale yellow solid (polymer P1) was obtained (392 mg) with a yield of 74%. GPC (tetrahydrofuran, polystyrene standard sample) Mn=21000 g mol-1, PDI=1.8.

Example 2: Synthesis of Polymer P2

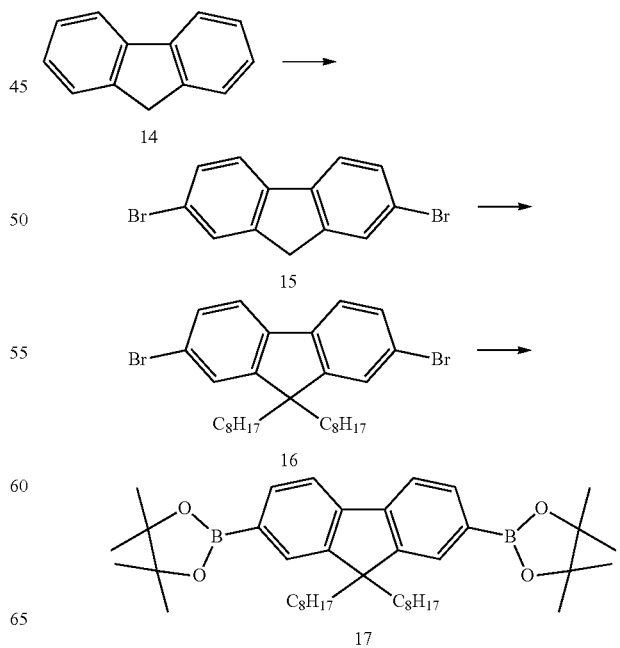

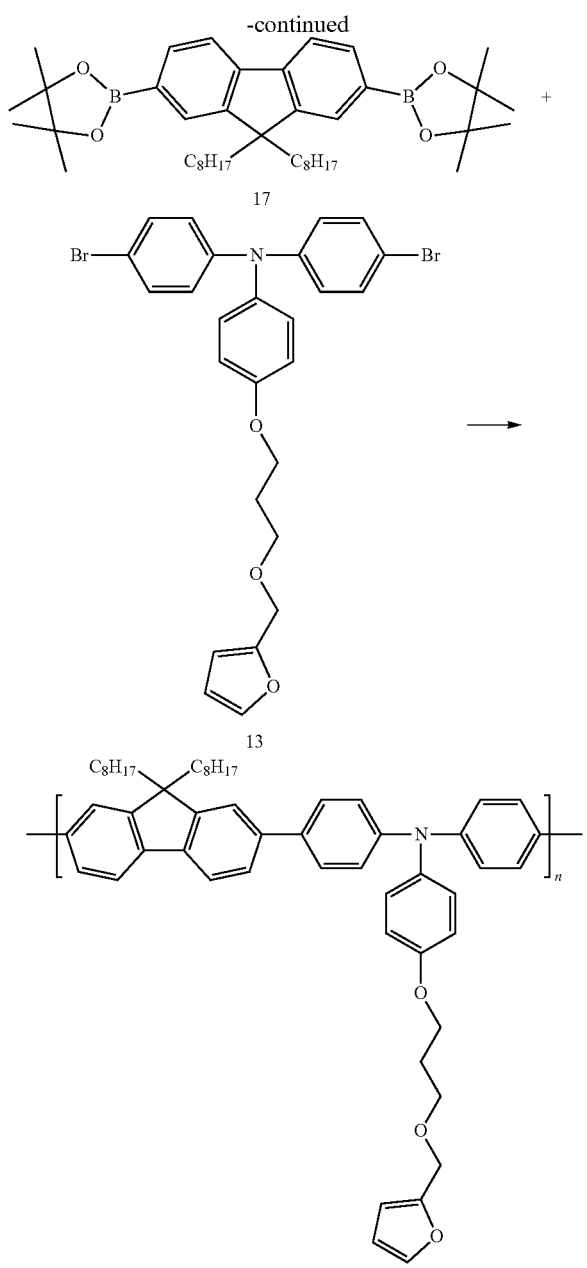

Synthesis of 2,7-dibromo-fluorene (Compound 15)

To a 1 L three-necked round bottom flask, fluorene (Compound 14) (100 g, 602 mmol) and iron powder (0.8 g, 1.4 mmol) were added. Chloroform was added (500 mL) to dissolve them completely and cooled to 0 to 5° C. in an ice-water bath. A mixture of liquid bromine (69 mL, 1337 mmol) and chloroform (100 mL) was slowly added dropwise and was shielded from light. After 1-hour dropping, the reaction solution was reacted at room temperature for 10 hours, and a large amount of white solid was precipitated. The reaction was monitored by thin layer chromatography. After the reaction, a saturated aqueous solution of sodium hydrogen sulfite was added to remove excess unreacted liquid bromine. A large amount of white solid was precipitated in the reaction mixture and filtered. The filtrate was washed three times with water. The oil layer was separated, concentrated. The directly filtered solid and the concentrated solid were combined to give a crude product. The crude product was washed for three times with a saturated aqueous solution of sodium hydrogen sulfate, dried, purified by recrystallization from chloroform to obtain 178 g of 2,7-dibromo-fluorene as white crystals (yield: 90%).

$^1$H NMR (300 MHz, CDCl$_3$, TMS) δ (ppm): 7.54 (d, 2H), 7.46 (d, 2H), 7.29 (d, 2H), 3.88 (m, 2H); 13C NMR (75 MHz, CDCl$_3$, TMS) δ (ppm): 152.92, 144.50, 134.90, 128.91, 121.30, 119.54, 76.55. Elemental analysis: C$_{13}$H$_8$Br$_2$, theoretical calculated: C, 48.15%, H, 2.47%; Experimental test value: C, 48.21%; H, 2.65%.

Synthesis of 2,7-dibromo-9,9-dioctylfluorene (Compound 16)

To a 500 mL three-necked round bottom flask, 2,7-dibromofluorene (15) (13.0 g, 40 mmol) as raw material, and dimethyl sulfoxide (150 mL) were added and stirred at room temperature. Aqueous solution of sodium hydroxide (20 mL, 50%) and tetrabutylammonium bromide (0.5 g, 0.15 mmol) were added and reacted at room temperature under argon protection for 1 hour. 1-bromooctane (17.9 g, 100 mmol) was then added and the reaction was continued for 12 hours. The reaction solution was poured into ice water, extracted with dichloromethane, and the oil layer was washed with water and a saturated aqueous solution of sodium chloride, and concentrated. The concentrate was separated by a silica gel column (200-300 mesh) and the eluent was petroleum ether. The result was recrystallized from ethanol and dried in vacuo to obtain 17.5 g of 2,7-dibromo-9,9-dioctylfluorene as a white solid (yield: 80%).

Synthesis of 2,7-bis(4,4,5,5-tetramethyl-1,3,2-dioxaborolan-2-yl)-9,9'-dioctylfluorene (Compound 17)

To a 250 mL three-neck flask, 2,7-dibromo-9,9'-dioctylfluorene (16) (14.4 g, 20 mmol) and tetrahydrofuran (130 mL) were added. A solution of n-butyllithium/n-hexane (2.4 M, 18.4 mL, 44 mmol) was added dropwise at −78° C. under argon protection, and was reacted at −78° C. for 2 hours. Thereafter, 2-isopropoxy-4,4,5,5-tetramethyl-1,3,2-dioxaborolane (11.16 g, 60 mmol) was added once to the reaction solution at −78° C. The reaction was performed at a constant temperature for 1.5 hours, and then the reaction solution was gradually warmed to room temperature and reacted overnight. After the reaction, the reaction solution was poured into ice water and extracted with dichloromethane. The oil layer was washed with water and a saturated aqueous solution of sodium chloride and was concentrated to obtain a crude product. The crude product was recrystallized from n-hexane and dried in vacuo to obtain 10.4 g of compound 17 as a white solid (yield: 64%).

Synthesis of Polymer P2

To a 25 mL two-necked round bottom flask, monomer of 4-bromo-N-(4-bromophenyl)-N-(4-(3-(furan-2-yloxy)propoxy)phenyl)aniline (13) (195 mg, 0.5 mmol), monomer of 2,8-bis(4,4,5,5-tetramethyl-1,3,2-dioxaborane-diyl)-9,9-dioctylfluorene (418 mg, 0.5 mmol), Pd(PPh$_3$)$_4$ (10 mg), and degassed toluene (10 mL), degassed tetrahydrofuran (4 mL), and aqueous solution of tetraethylammonium hydroxide (2 mL, mass fraction of 20%) were added and uniformly stirred. Argon was passed for 15 minutes. The reaction was performed under argon protection at 110° C. for 24 hours, and then bromobenzene (50 μL) and kept in reflux for 2 hours. Phenylboronic acid (20 mg) were added and kept in reflux for 2 hours. After cooled to room temperature, the reaction solution was added dropwise to methanol to precipitate. The obtained flocculent precipitate was filtered, vacuum dried, and redissolved in tetrahydrofuran (about 30 mL). The obtained tetrahydrofuran solution was filtered through a polytetrafluoroethylene (PTFE) filter head having a pore size of 0.45 μm, concentrated under reduced pressure, and then added dropwise to methanol to precipitate. The precipitate was dried in vacuo to obtain 292 mg of polymer P2 as a pale yellow solid (yield: 74%). GPC (tetrahydrofuran, polystyrene standard sample) Mn=18000 g mol-1. PDI=2.1.

Preparation and Characterization of OLEDs Devices

Other materials are as follows:

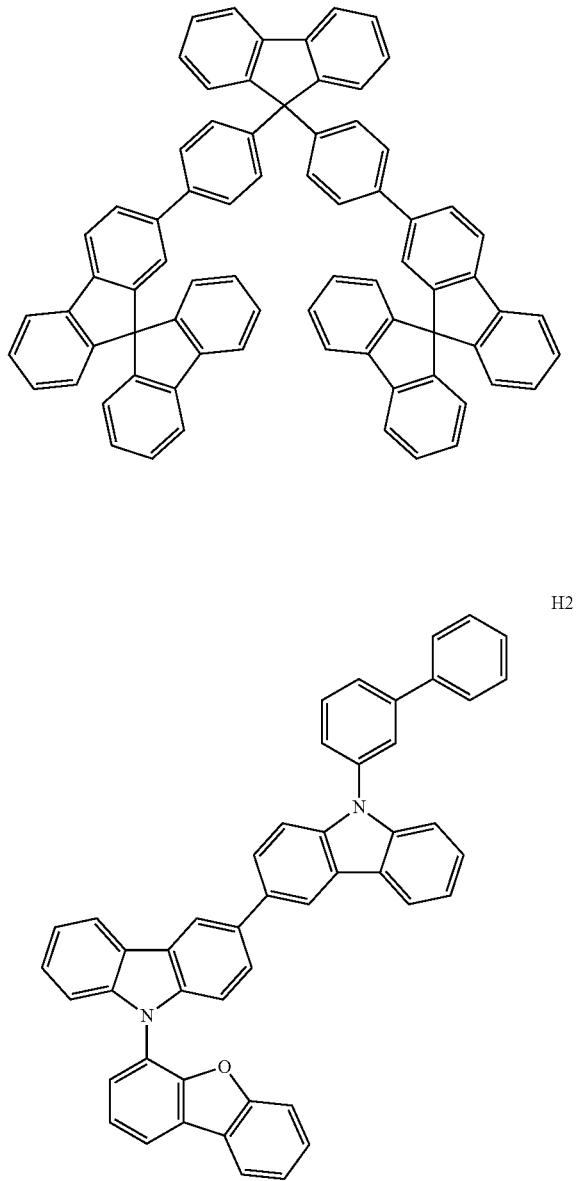

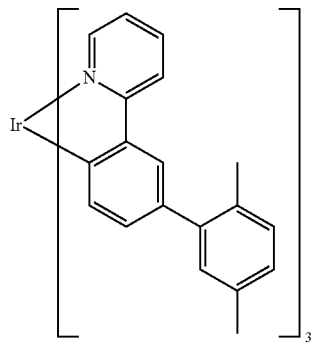

Wherein, H1 is a co-host material, and its synthesis is referred to the Chinese patent of CN201510889328.8; H2 is a co-host material, and its synthesis is referred to the patent WO201034125A1; E1 is a phosphorescent guest, and its synthesis is referred to the patent CN102668152;

The OLED device preparation steps are as follows:

1) Cleaning of ITO transparent electrode (anode) glass substrate: ultrasonic treatment was conducted for 30 minutes using aqueous solution of 5% Decon90 cleaning solution, followed by ultrasonic cleaning with deionized water, then ultrasonic cleaning with isopropanol and blowing dry with nitrogen; the treatment under oxygen plasma was for 5 minutes to clean the ITO surface and improve the work function of the ITO electrode:

2) Preparation of HIL and HTL: PEDOT:PSS (Clevios™ PEDOT:PSS A14083) was spin-coated on the oxygen plasma-treated glass substrate to obtain an 80-nm thin film which was annealed in air at 150° C. for 20 minutes; the polymers P1 and P2 synthesized in Example 1 and 2 was dissolved in a tolune respectively, and the concentration of solution is 5 mg/ml, the polymers P1 or P2 was spin-coated on the PEDOT:PSS film with a thickness of 20 nm, respectively. The film was heated on a hot plate at 100° C. for reaction for 0 min to 40 min to allow the polymers P1 and P2 to produce a crosslinking reaction. The polymer P1 and P2 films were then rinsed with toluene and measured to be between 18 nm and 19 nm in length, indicating that the crosslinking reaction was effective and the polymer P1 and P2 films were relatively completely cured.

3) Preparation of a light-emitting layer: H1, H2, E1 were dissolved in toluene at a weight ratio of 40:40:20, and the concentration of the solution is 20 mg/mL. This solution was spin-coated in a nitrogen glove box to obtain a 60-nm thin film and was then annealed at 120° C. for 10 minutes.

4) Preparation of a cathode: the spin-coated device was placed in a vacuum evaporation chamber, and 2-nm barium and 100-nm aluminum were sequentially deposited to yield a light-emitting device.

5) The device was encapsulated in a nitrogen glove box using an ultraviolet curing resin and a glass cover.

Current-voltage (I-V) property, luminous intensity and external quantum efficiency of the OLED devices were measured by a Keithley 236 current and voltage-measurement system and a calibrated silicon photodiode. The test results are shown in Table 1.

TABLE 1

| Device name | Efficiency (cd/A) @1000 nits | colour |
|---|---|---|
| OLED-1 | 41.5 | green |
| OLED-2 | 46.7 | green |

The polymers P1 and P2 prepared in Examples 1 and 2 were respectively applied to OLED-1 and OLED-2.

It should be understood that, the application of the present disclosure is not limited to the above-described examples, and those skilled in the art can make modifications and changes in accordance with the above description, all of which are within the scope of the appended claims.

Crosslinking and Solvent Resistance Test after the Polymer P1 and P2 Prepared in Examples 1 to 2 were Respectively Used to Form Films on PEDOT:PSS, the furan groups of the side chains of the polymer P1 and P2 were chemically reacted with each other under initiation by the acid and heating condition, thereby forming an insoluble and infusible interpenetrating network polymer film.

The specific operations are as follows: PEDOT:PSS aqueous dispersion (about 1%) Clevios™ PEDOT:PSS A14083 was high speed spin-coated on a quartz plate as a buffer layer with a homogenizer (KW-4A). The thickness is determined by the solution concentration and speed, and is monitored by a surface profilometer (Tritek Alpha-Tencor-500). After film formation, the residual solvent was driven off in a constant temperature vacuum oven. The film thickness of PEDOT:PSS on the quartz substrate was 80 nm. The polymers P1 and P2 synthesized in Examples 1 and 2 were each dissolved in toluene to obtain a polymer P1 solution and a polymer P2 solution at a concentration of 5 mg/ml. The polymer P1 solution and the polymer P2 solution were spin-coated on the PEDOT:PSS film to a thickness of 20 nm, and heated on a hot plate to 100° C. for 30 min to crosslink the polymer P1 or P2 to obtain a polymer P1 film or a polymer P2 film. The polymer P1 film and the polymer P2 film were then rinsed with toluene. The degree of change in absorbance before and after elution of the toluene solvent was tested, which was used to determine the anti-solvent property of the crosslinking of the polymer film. The more the absorbance decreases, the poorer the solvent resistance of the polymer. On the contrary, the decrease of the absorbance of the polymer is relatively small after elution with toluene, indicating that the solvent resistance of the polymer is relatively good.

It was found that, as shown in FIG. 1, when the polymer P2 was not subjected to heat treatment and the polymer film was eluted with toluene, the absorbance was only maintained at about 20%, and most of the polymer P2 was washed away by the toluene solution, so that it did not have solvent resistance. After heating for 1 minute, the absorbance of the polymer P2 after elution with the toluene solution slowly decreased, and the absorbance substantially maintained 80% of the original, so that the anti-solvent property gradually increased. When the polymer P2 was heated for more than 10 minutes and eluted with toluene, the absorbance remained substantially unchanged, indicating that the polymer P2 had excellent solvent resistance after crosslinking.

The invention claimed is:

1. A polymer represented by the following formula (I):

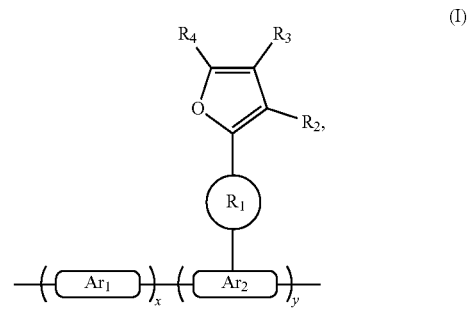

(I)

wherein x and y each represent the number of corresponding repeating units, and x and y are both positive integers;

$Ar_1$ is selected from the group consisting of an aryl group containing 5 to 40 ring atoms and a heteroaryl group containing 5 to 40 ring atoms;

$Ar_2$ has a structural formula as follows:

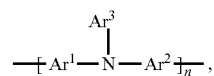

wherein —$Ar^1$— is a single bond, a mononuclear aryl group, a polynuclear aryl group, a mononuclear heteroaryl group, or a polynuclear heteroaryl group;

$Ar^2$ and $Ar^3$ are each independently selected from the group consisting of a mononuclear aryl group, a polynuclear aryl group, a mononuclear heteroaryl group, and a polynuclear heteroaryl group;

$R_1$ is a linking group, and $R_1$ is selected from the group consisting of an alkyl group, an alkoxy group, an amino group, an alkenyl group, an alkynyl group, an aralkyl group, and a heteroalkyl group;

$R_2$, $R_3$ and $R_4$ are each independently selected from the group consisting of H, D, F, CN, an alkyl group, a fluoroalkyl group, an aryl group, a heteroaryl group, amino, Si, germyl, an alkoxy group, an aryloxy group, a fluoroalkoxy group, a siloxane group, a siloxy group, a deuterated alkyl group, a deuterated fluoroalkyl group, a deuterated aryl group, a deuterated heteroaryl group, deuterated amino group, deuterated silicon group, deuterated germyl, a deuterated alkoxy group, a deuterated aryloxy group, a deuterated fluoroalkoxy group, deuterated siloxane group and a deuterated siloxy group.

2. The polymer according to claim 1, wherein

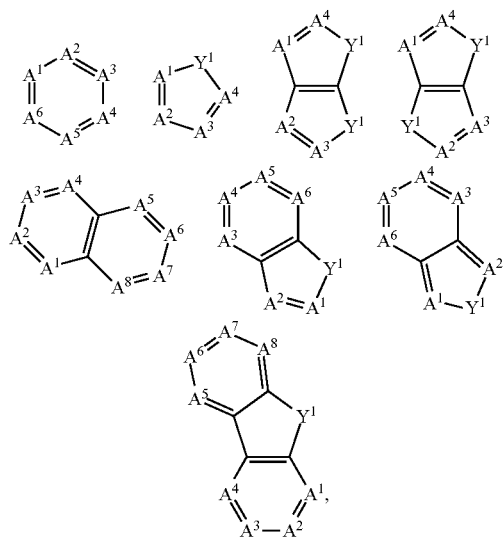

is selected from one of the following structural groups:

wherein, $A^1$, $A^2$, $A^3$, $A^4$, $A^5$, $A^6$, $A^7$ and $A^8$ are each independently selected from the group consisting of $CR^5$ and N;

$Y^1$ is selected from the group consisting of $CR^6R^7$, $SiR^8R^9$, $NR^{10}$, C(=O), S and O;

$R^5$ to $R^{10}$ are each independently selected from the group consisting of H, D, a linear alkyl group containing 1 to 20 carbon atoms, an alkoxy group containing 1 to 20 carbon atoms, a thioalkoxy group containing 1 to 20 carbon atoms, a branched alkyl group containing 3 to 20 carbon atoms, a cyclic alkyl group containing 3 to 20 carbon atoms, a silyl group containing 3 to 20 carbon atoms, a keto group containing 1 to 20 carbon atoms, an alkoxycarbonyl group containing 2 to 20 carbon atoms, an aryloxycarbonyl group containing 7 to 20 carbon atoms, cyano, carbamoyl, halocarbonyl, formyl, isocyano, isocyanate, thiocyanate, isothiocyanate, hydroxyl, nitryl, $CF_3$, Cl, Br, F, a crosslinkable group, an aryl group containing 5 to 40 ring atoms, a heteroaryl group containing 5 to 40 ring atoms, an aryloxy group containing 5 to 40 ring atoms, and a heteroaryloxy group containing 5 to 40 ring atoms.

3. The polymer according to claim 1, wherein

Ar₁ is selected from the group consisting of phenyl, biphenyl, triphenyl, fluorenyl, indenofluorenyl and derivatives thereof.

4. The polymer according to claim 1, wherein

Ar₁ has one of the following structural groups:

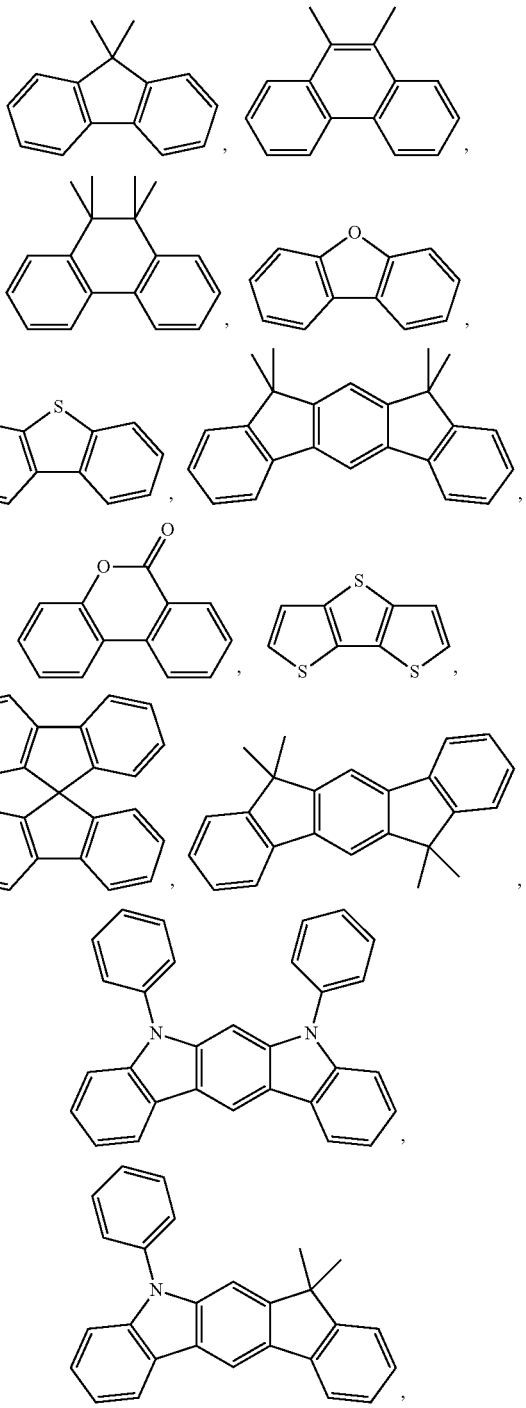

-continued

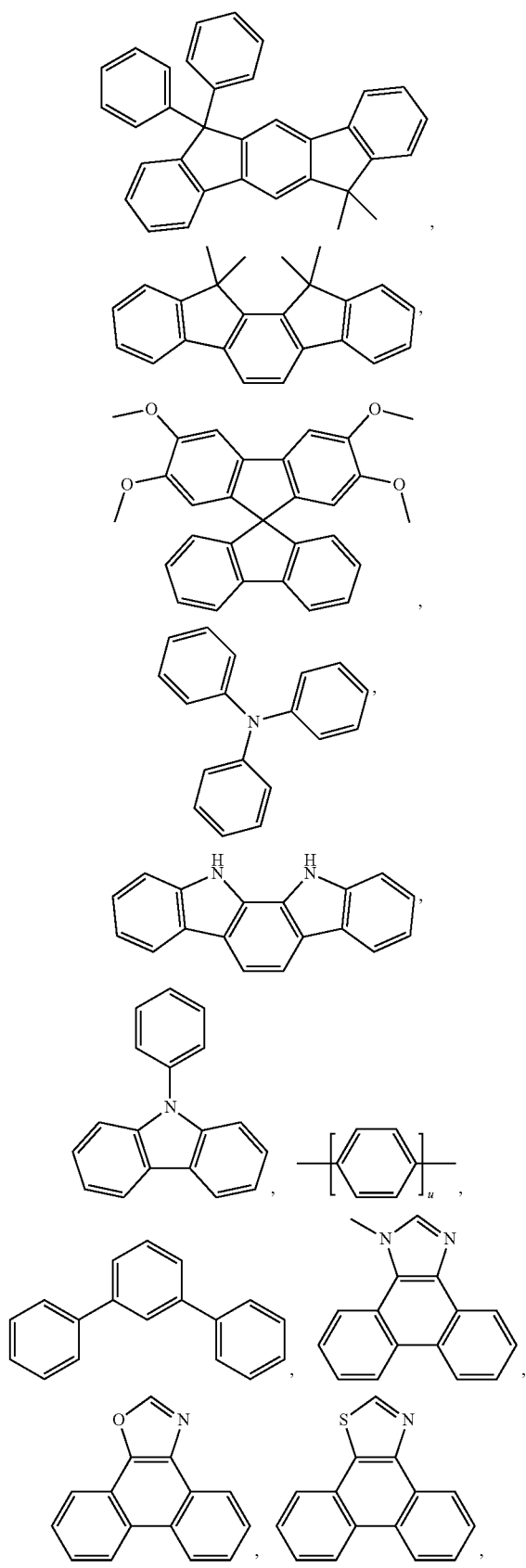

-continued

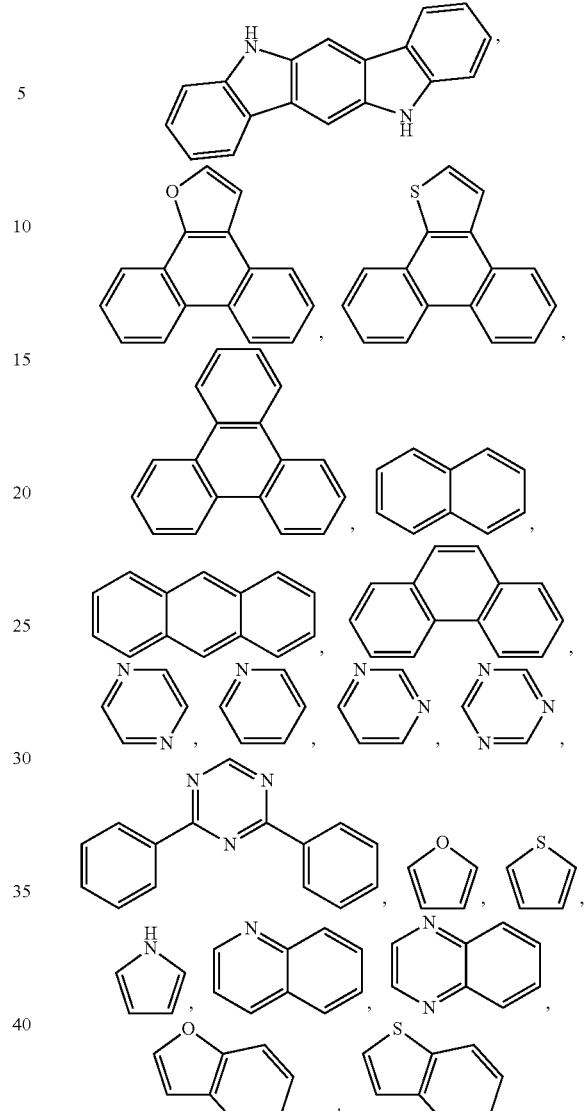

wherein u is an integer from 1 to 4.

5. The polymer according to claim 1, wherein $Ar_1$ is selected from the group consisting of benzene, biphenyl, phenanthrene, benzophenanthrene, fluorene, indenofluorene, carbazole, indolecarbazole, dibenzosilole, dithienocyclopentadiene, dithienosilole, thiophene, anthracene, naphthalene, benzodithiophene, benzofuran, benzothiophene, benzoselenophene, and derivatives thereof.

6. The polymer according to claim 1, wherein $R_1$ is selected from the group consisting of an alkyl containing 1 to 30 carbon atoms, an alkoxy group containing 1 to 30 carbon atoms, benzene, biphenyl, phenanthrene, benzophenanthrene, thiophene, anthracene, naphthalene, benzodithiophene, aromatic amine, carbazole, dithienocyclopentadiene, dithienosilole, dibenzoselenophene, benzofuran, benzothiophene, benzoselenophene and furan.

7. A mixture comprising the polymer of claim 1, and at least one organic solvent or an organic functional material that is at least one selected from the group consisting of a hole injection material, a hole transport material, an electron transport material, an electron injection material, an electron blocking material, a hole blocking material, a light emitting material, and a host material.

8. An organic electronic device comprising the functional layer, wherein the functional layer comprises the polymer of claim 1.

9. The organic electronic device according to claim 8, wherein the organic electronic device is selected from the group consisting of an organic light-emitting diode, an organic photovoltaic cell, an organic light-emitting electrochemical cell, an organic field effect transistor, an organic light-emitting field effect transistor, an organic laser, an organic spintronic device, an quantum dot light emitting diode, an perovskite solar battery, and an organic plasmon emitting diode.

10. The organic electronic device according to claim 8, wherein—the function layer is a hole transport layer.

11. The organic electronic device according to claim 8, wherein the function layer is an electron transport layer.

12. The polymer according to claim 1, wherein $Ar^1$, $Ar^2$ and $Ar^3$ are benzene.

13. The polymer according to claim 1, wherein

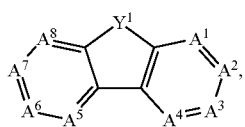

is selected from indenofluorene and fluorene.

14. The polymer according to claim 1, wherein $R^1$ is selected from an alkoxy group containing 1 to 30 carbon atoms.

15. The polymer according to claim 12, wherein

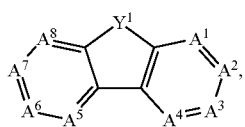

is selected from

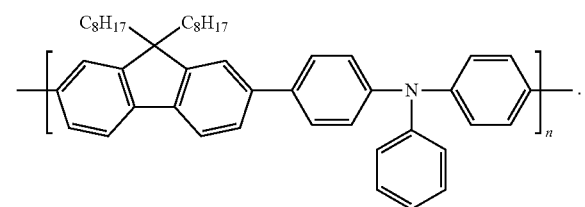

wherein, $A^1$, $A^2$, $A^3$, $A^4$, $A^5$, $A^6$, $A^7$ and $A^8$ are each independently selected from the group consisting of $CR^5$;

$Y^1$ is selected from the group consisting of $CR^6R^7$;

$R^5$ is selected from H or D, $R^6$ and $R^7$ are independently selected from a linear alkyl group containing 1 to 20 carbon atoms, or a branched alkyl group containing 3 to 20 carbon atoms.

16. The polymer according to claim 1, wherein the polymer is selected from the following structures:

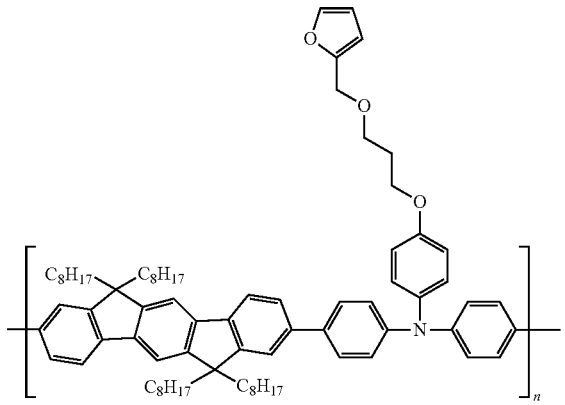

* * * * *